US012809479B2

(12) United States Patent
Han et al.

(10) Patent No.: US 12,809,479 B2
(45) Date of Patent: Nov. 24, 2026

(54) TOUCH DISPLAY DEVICE AND TOUCH DISPLAY PANEL

(71) Applicant: LG Display Co., Ltd., Seoul (KR)

(72) Inventors: Sungsu Han, Gyeonggi-do (KR); SangHyuck Bae, Seoul (KR); HwiDeuk Lee, Gumi-si (KR); Hyunsuk Cho, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/244,878

(22) Filed: Jun. 20, 2025

(65) Prior Publication Data

US 2025/0321658 A1 Oct. 16, 2025

Related U.S. Application Data

(63) Continuation of application No. 18/500,788, filed on Nov. 2, 2023, now Pat. No. 12,353,659.

(30) Foreign Application Priority Data

Nov. 11, 2022 (KR) ........................ 10-2022-0150036

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0412* (2013.01); *G06F 3/041662* (2019.05);
(Continued)

(58) Field of Classification Search
CPC ............... G06F 3/04164; G06F 3/0412; G06F 3/041662; G06F 3/0448;
(Continued)

(56) References Cited

U.S. PATENT DOCUMENTS 10,338,712 B2 * 7/2019 Bok ...................... G06F 3/0412
10,340,317 B2 * 7/2019 Oh ........................ G06F 3/0412
(Continued)

FOREIGN PATENT DOCUMENTS

KR 10-2010-0130156 A 12/2010
KR 10-2017-0051789 A 5/2017
(Continued)

*Primary Examiner* — Benyam Ketema
(74) *Attorney, Agent, or Firm* — Seed Intellectual Property Law Group LLP

(57) ABSTRACT

The present disclosure provides a touch sensor embedded light emitting diode display device and a touch display panel. The device includes a substrate, a light emitting diode (LED) disposed over the substrate. The LED includes a first electrode and a second electrode. The device includes a pixel electrode electrically connected to the first electrode and a common electrode electrically connected to the second electrode. The device includes a driving transistor disposed over the substrate. The transistor includes an active layer, a source electrode, a drain electrode, and a gate electrode. The device includes a relay electrode electrically connecting the source electrode or drain electrode to the pixel electrode. The device includes a first touch sensor electrode disposed spaced apart from the light emitting diode and including the same conductive material as the pixel electrode.

19 Claims, 27 Drawing Sheets

(51) Int. Cl.
*G09G 3/32* (2016.01)
*H10H 20/832* (2025.01)
*H10W 90/00* (2026.01)

(52) U.S. Cl.
CPC ............. *G06F 3/0448* (2019.05); *G09G 3/32* (2013.01); *H10H 20/835* (2025.01); *H10W 90/00* (2026.01); *G06F 2203/04104* (2013.01); *G09G 2310/0267* (2013.01); *G09G 2310/08* (2013.01)

(58) Field of Classification Search
CPC ........... G06F 2203/04104; G06F 3/041; G06F 2203/04112; G06F 3/0443; G06F 3/0446; G06F 3/0416; G06F 3/046; G09G 3/32; G09G 2310/0267; G09G 2310/08; H10H 20/835; H10H 20/857; H10H 20/83; H10W 90/00; H10K 50/805; H10K 59/12; H10K 59/40; H10K 59/805
See application file for complete search history.

(56) References Cited

U.S. PATENT DOCUMENTS 10,845,902 B2* 11/2020 Clark .................. G06F 3/04164
10,957,745 B2* 3/2021 Hong .................... G06F 3/0412
11,387,394 B2* 7/2022 Chen .................... H10H 20/853
11,592,933 B1* 2/2023 Ozbas .................... H10K 59/40
11,899,862 B2* 2/2024 Bok ......................... G09G 3/32
11,903,291 B2* 2/2024 Gwon ................... G06F 3/0412
11,916,097 B2* 2/2024 Ikeda ................... H10H 29/142
11,960,676 B2* 4/2024 Park ...................... G06F 3/0412
12,056,300 B2* 8/2024 Hu ........................ G06F 3/0412
12,361,889 B2* 7/2025 Tian ..................... G09G 3/3266
2007/0273560 A1* 11/2007 Hua ...................... G06F 3/0446 341/33
2008/0150905 A1* 6/2008 Grivna .................. G06F 3/0446 345/173
2008/0264699 A1* 10/2008 Chang ................... G06F 3/0446 178/18.01
2008/0297487 A1* 12/2008 Hotelling ............ G06F 3/04883 345/173
2010/0302201 A1* 12/2010 Ritter .................... G06F 3/0446 345/174
2015/0029116 A1* 1/2015 Kim ...................... G06F 3/0443 345/173
2015/0378486 A1* 12/2015 Yu ....................... G06F 3/04164 427/79
2016/0149154 A1* 5/2016 Park ..................... H10K 59/124 438/23
2016/0204126 A1* 7/2016 Amano .................. H10D 64/62 438/151
2016/0306470 A1* 10/2016 Park ...................... G06F 3/0443
2017/0061918 A1* 3/2017 Lim ...................... G06F 3/0445
2017/0186740 A1* 6/2017 Cok ......................... H10D 1/00
2017/0213499 A1* 7/2017 Kong ...................... G11C 19/28
2017/0269749 A1* 9/2017 Bok .................... G02F 1/13338
2017/0371464 A1* 12/2017 Nakanishi .............. H10K 59/40
2018/0348937 A1* 12/2018 Pak ....................... G06F 3/0412
2019/0042026 A1* 2/2019 Ge ........................ G06F 3/0443
2019/0179466 A1* 6/2019 Kim ...................... G06F 3/0412
2019/0286270 A1* 9/2019 Bok ...................... G06F 3/0412
2019/0302935 A1* 10/2019 Clark ................... H10K 59/353
2019/0302936 A1* 10/2019 Clark .................... G06F 3/0412
2020/0051482 A1* 2/2020 Cok ...................... G09G 3/006
2020/0103992 A1* 4/2020 Sauer .................. G06F 3/04184
2020/0210025 A1* 7/2020 Kim ...................... G06F 3/0443
2021/0026477 A1* 1/2021 Lee ..................... G06F 3/04164
2021/0041977 A1* 2/2021 Yarosh .................. G06F 3/0416
2021/0055805 A1* 2/2021 Seger, Jr. .............. G06F 3/0446
2021/0126171 A1* 4/2021 Chen ...................... H10H 20/84
2021/0359063 A1* 11/2021 Lu .......................... H10D 86/60
2022/0157919 A1* 5/2022 Tian ..................... G09G 3/3266
2022/0164066 A1* 5/2022 Chu ....................... H10K 59/60
2022/0285590 A1* 9/2022 Mun ........................ G02B 5/20
2022/0328599 A1* 10/2022 Zhang .................. H10K 59/131
2023/0004258 A1* 1/2023 An ........................ G06F 3/0448
2023/0176698 A1* 6/2023 Jo ........................ H10K 59/873 345/174
2023/0200181 A1* 6/2023 Park ...................... G06F 3/0446 345/173
2023/0205358 A1* 6/2023 Lee ...................... H10K 59/131 345/174
2023/0205377 A1* 6/2023 Wang .................... G06F 3/0443 345/173
2023/0214050 A1* 7/2023 Shin .................... G06F 3/04164 345/174
2023/0217776 A1* 7/2023 Lee ..................... G06F 3/04164 257/88
2023/0217779 A1* 7/2023 Kim ...................... G06F 3/0443 257/72
2023/0317904 A1* 10/2023 Wu ...................... H10H 20/857
2023/0413630 A1* 12/2023 Yamazaki .......... H10D 30/6734
2024/0021623 A1* 1/2024 Yang .................... H10D 86/471
2024/0021657 A1* 1/2024 Jung .................... H10H 29/142
2024/0081140 A1* 3/2024 Wu ........................ H10K 59/12
2024/0120326 A1* 4/2024 Wu ........................ H10K 39/34
2024/0152228 A1* 5/2024 Lee ..................... G06F 3/04164
2024/0160312 A1* 5/2024 Lee ..................... G06F 3/04164
2024/0160313 A1* 5/2024 Han ........................ G06F 3/041
2024/0256065 A1* 8/2024 Lee ....................... G06F 3/0443
2024/0264707 A1* 8/2024 Wu ................... G06F 3/041662
2024/0290275 A1* 8/2024 Lu ........................ G09G 3/3233
2025/0216962 A1* 7/2025 Park ...................... G06F 3/0445
2026/0040998 A1* 2/2026 Lin ....................... H10W 70/68

FOREIGN PATENT DOCUMENTS

KR 10-2017-0109718 A 10/2017
KR 10-2022-0090070 A 6/2022

* cited by examiner

TOUCH DISPLAY DEVICE AND TOUCH DISPLAY PANEL

BACKGROUND

Technical Field

The present disclosure relates to electronics with displays, and more specifically, to a touch sensor embedded light emitting diode display device and a touch display panel.

Description of the Related Art

Recently, research and development has been progressing on a light emitting diode display device using a light emitting diode as a light emitting element of a subpixel.

Since the light emitting diode has high light conversion efficiency, the light emitting diode has much less energy consumption and semi-permanent lifetime. When a light emitting diode is used as a light emitting element of a subpixel, there is provided an advantage of enabling a large area display panel to be manufactured at low cost.

BRIEF SUMMARY

Various embodiments of the present disclosure provide a touch sensor embedded display panel. This provides the technical benefits of a thinner and lighter display device. This also eases or simplifies the manufacturing of display panels. Various embodiments described herein provide a technical solution for embedding a touch sensor in a display panel of a light emitting diode display device and further addresses other various technical problems of the related art.

One or more embodiments of the present disclosure may provide a touch sensor embedded light emitting diode display device and a touch display panel.

One or more embodiments of the present disclosure may provide a touch sensor embedded light emitting diode display device and a touch display panel that allow improved manufacturability and have a simple vertical structure.

One or more embodiments of the present disclosure may provide a touch sensor embedded light emitting diode display device and a touch display panel that have a touch routing line arrangement structure capable of reducing a bezel area.

One or more embodiments of the present disclosure may provide a touch sensor embedded light emitting diode display device and a touch display panel that have a noise reduction structure.

One or more embodiments of the present disclosure may provide a touch sensor embedded light emitting diode display device and a touch display panel that are configured in a type of tiling display.

According to aspects of the present disclosure, a touch sensor embedded light emitting diode display device can be provided that includes: a display substrate; a light emitting diode disposed over the display substrate and including a first electrode and a second electrode; a pixel electrode electrically connected to the first electrode; a common electrode electrically connected to the second electrode; a driving transistor disposed over the display substrate and including an active layer, a source electrode, a drain electrode, and a gate electrode; a relay electrode electrically connecting the source electrode or drain electrode to the pixel electrode; and a first touch sensor electrode disposed spaced apart from the light emitting diode and including the same conductive material as the pixel electrode.

The relay electrode may be located under the light emitting diode, overlap the light emitting diode, and include a reflective electrode material.

The touch sensor embedded light emitting diode display device may further include a second touch sensor electrode disposed adjacent to the first touch sensor electrode in a column direction and including the same conductive material as the relay electrode, and a vertical connection line electrically interconnecting the first touch sensor electrode and the second touch sensor electrode.

The vertical connection line may include at least one of the same conductive material as the relay electrode, the same conductive material as the source electrode or the drain electrode, the same conductive material as an electrode between the source electrode or drain electrode and the active layer, and the same conductive material as an electrode under the active layer.

The touch sensor embedded light emitting diode display device may further include a third touch sensor electrode disposed adjacent to the first touch sensor electrode in a row direction and including the same conductive material as the pixel electrode, and a horizontal connection line electrically interconnecting the first touch sensor electrode and the third touch sensor electrode.

The horizontal connection line may include the same conductive material as the pixel electrode.

The touch sensor embedded light emitting diode display device may include a first touch sensor to which a plurality of touch sensor electrodes including the first touch sensor electrode are electrically connected, a first touch pad located on the display substrate, and a first touch routing line electrically connecting the first touch sensor to the first touch pad.

The first touch pad may include the same conductive material as the source electrode or the drain electrode.

The first touch routing line may include the same conductive material as the relay electrode, the same conductive material as the source electrode or the drain electrode, the same conductive material as an electrode between the source electrode or drain electrode and the active layer, or the same conductive material as an electrode under the active layer.

The touch sensor embedded light emitting diode display device may include an active area in which an image is displayed. The active area may include a display circuit area, a core pixel area located in the display circuit area and allowing the light emitting diode to be disposed, a first power supply area located outside of the display circuit area and allowing a first power line to be disposed, a second power supply area located outside of the display circuit area and allowing a second power line to be disposed, and a gate driving circuit area located outside of the display circuit area and allowing a gate driving circuit to be disposed.

The light emitting diode may be disposed in the core pixel area, and the first touch sensor electrode may overlap at least one of the first power supply area, the second power supply area, and the gate driving circuit area.

The touch sensor embedded light emitting diode display device may further include a column line electrically connected to the first touch sensor electrode and disposed in the column direction, and a second touch sensor electrode adjacent to the first touch sensor electrode in the column direction. The column line may be disposed between the first power line and the second power line.

The column line may be a vertical connection line electrically interconnecting the first touch sensor electrode and the second touch sensor electrode, or a touch routing line electrically connecting the first touch sensor electrode to a touch driving circuit.

The touch sensor embedded light emitting diode display device may further include a shield disposed under the first touch sensor electrode, and an organic layer disposed between the first touch sensor electrode and the shield.

The shield may include the same conductive material as the relay electrode. When a signal whose voltage level is varied is applied to the first touch sensor electrode, an electric potential difference between the first touch sensor electrode and the shield may be maintained constant.

The display substrate of the touch sensor embedded light emitting diode display device may include an active area in which images can be displayed, and one or more signal lines may be disposed only in one of outer areas, or areas outside, of the active area.

The touch sensor embedded light emitting diode display device may further include a guard pattern disposed along an outer edge of the display substrate.

Respective ends of extended portions of a plurality of touch routing lines electrically connected to a plurality of touch sensors disposed in the active area of the display substrate may be disposed between opposing ends of the guard pattern.

The touch sensor embedded light emitting diode display device may include a first transmission touch sensor, a first reception touch sensor intersecting the first transmission touch sensor, a first transmission touch routing line connected to the first transmission touch sensor, and a first reception touch routing line connected to the first reception touch sensor.

The first transmission touch routing line and the first reception touch routing line may be arranged in parallel to each other, the first transmission touch routing line may overlap the first reception touch sensor, the first transmission touch sensor and the first reception touch sensor may include the same conductive material as the pixel electrode, and the first transmission touch routing line and the first reception touch routing line may include the same conductive material as the relay electrode.

The touch sensor embedded light emitting diode display device may further include N (N is a natural number greater than or equal to 2) display tiles, M (M is a natural number greater than or equal to 1) timing controllers for controlling display driving of the N display tiles, M micro control units for controlling touch driving of the N display tiles, a central system communicating with the M micro control units or the M timing controllers, N or more source driver integrated circuits corresponding to the N display tiles, and N or more readout integrated circuits corresponding to the N display tiles.

Each of the N display tiles may include a respective display substrate.

According to aspects of the present disclosure, a touch display panel can be provided that includes: a display substrate; a first horizontal touch sensor disposed in a horizontal direction; a first vertical touch sensor disposed in a vertical direction and crossing the first horizontal touch sensor; a first horizontal touch routing line connected to the first horizontal touch sensor; and a first vertical touch routing line connected to the first vertical touch sensor.

The first horizontal touch routing line and the first vertical touch routing line may be disposed in the vertical direction, and the first horizontal touch routing line may overlap the first vertical touch sensor in the vertical direction.

According to one or more embodiments of the present disclosure, a touch sensor embedded light emitting diode display device and a touch display panel may be provided.

According to one or more embodiments of the present disclosure, a touch sensor embedded light emitting diode display device and a touch display panel may be provided that allow improved manufacturability and have a simple vertical structure by designing a stack structure of a touch sensor area to be corresponded to a stack structure of a display circuit area.

According to one or more embodiments of the present disclosure, a touch sensor embedded light emitting diode display device and a touch display panel may be provided that have an internal routing structure in which a bezel area is not used as running paths of touch routing lines, and thereby, are capable of reducing a bezel area.

According to one or more embodiments of the present disclosure, a touch sensor embedded light emitting diode display device and a touch display panel may be provided that have a noise reduction structure.

According to one or more embodiments of the present disclosure, a touch sensor embedded light emitting diode display device and a touch display panel may be provided that are configured in a type of tiling display.

According to one or more embodiments of the present disclosure, a display device may be provided that is capable of reducing power consumption using light emitting diodes as light emitting elements.

According to one or more embodiments of the present disclosure, a touch sensor embedded light emitting diode display device and a touch display panel may be provided that are capable of process optimization by configuring a touch sensor structure using layers used in a display circuit area.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1:
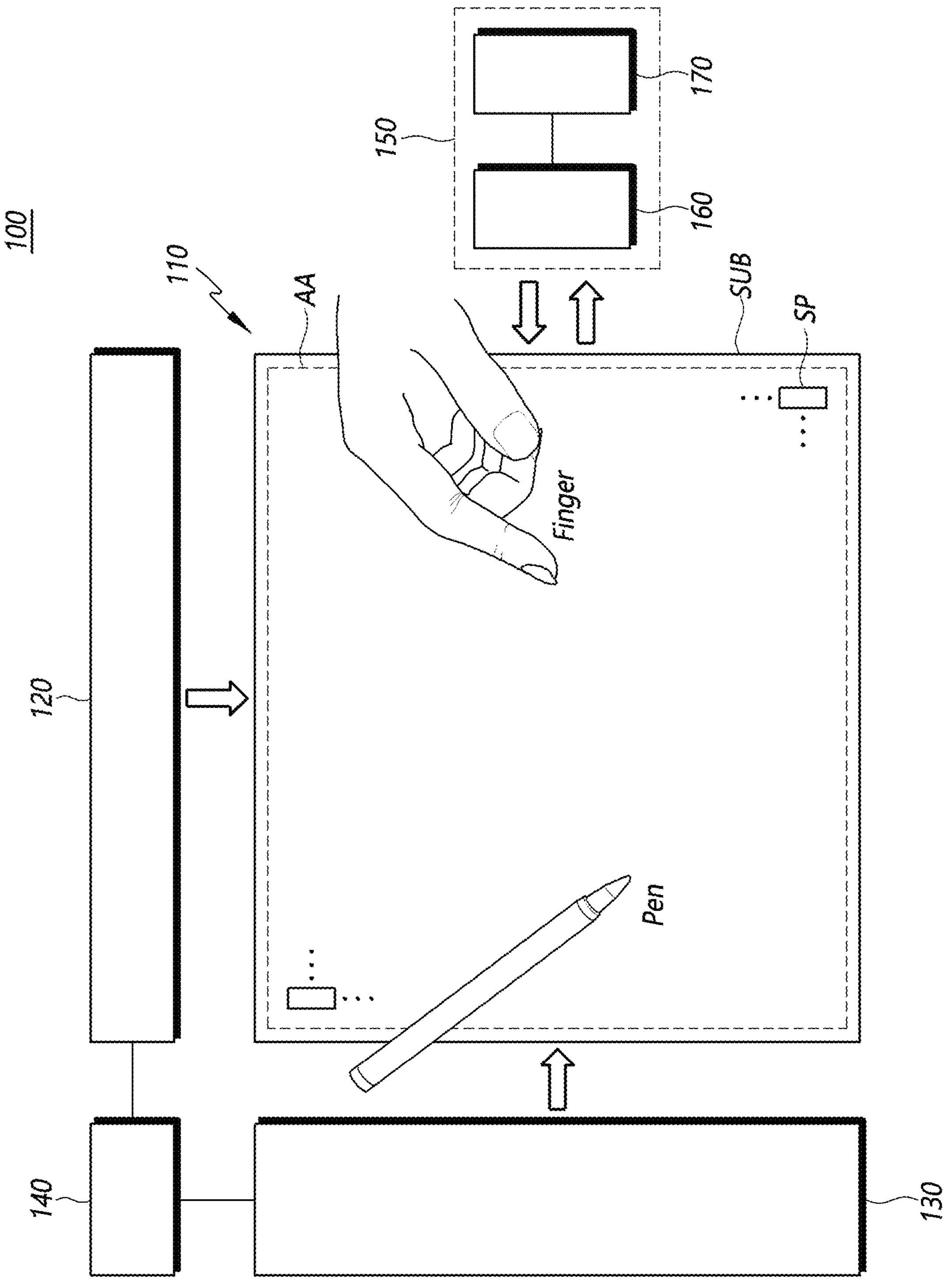
FIG. 1 illustrates an example system configuration of a touch sensor embedded light emitting diode display device according to aspects of the present disclosure.

Reference will now be made in detail to embodiments of the present disclosure, examples of which may be illustrated in the accompanying drawings. In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted.

The shapes, sizes, dimensions (e.g., length, width, height, thickness, radius, diameter, area, etc.), ratios, angles, numbers, and the like, which are illustrated in the drawings to describe various example embodiments of the present disclosure, are merely given by way of example. Therefore, the present disclosure is not limited to the illustrations in the drawings.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Where the terms “comprise,” “have,” “include,” “contain,” “constitute,” “make up of,” “formed of,” and the like are used, one or more other elements may be added unless the term, such as “only,” is used. An element described in the singular form is intended to include a plurality of elements, and vice versa, unless the context clearly indicates otherwise.

Although the terms “first,” “second,” “A,” “B,” “(a),” or “(b),” and the like may be used herein to describe various elements, these elements should not be interpreted to be limited by these terms as they are not used to define a particular order or precedence. These terms are used only to distinguish one element from another; thus, related elements should not be interpreted to be limited by these terms as they are not used to define a particular order or precedence.

Further, the expression of a first element, a second elements “and/or” a third element should be understood as one of the first, second and third elements or as any or all combinations of the first, second and third elements. By way of example, A, B and/or C can refer to only A, only B, or only C; any or some combination of A, B, and C; or all of A, B, and C.

For the expression that an element or layer is “connected,” “coupled,” or “adhered” to another element or layer, the element or layer can not only be directly connected, coupled, or adhered to another element or layer, but also be indirectly connected, coupled, or adhered to another element or layer with one or more intervening elements or layers “disposed” or “interposed” between the elements or layers, unless otherwise specified. Further, the another element may be included in one or more of the two or more elements connected, combined, coupled, or contacted (to) one another.

For the expression that an element or layer “contacts,” “overlaps,” or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference.

In describing a temporal relationship, when the temporal order is described as, for example, "after," "subsequent," "next," or "before," a case which is not continuous may be included unless a more limiting term, such as "just," "immediate(ly)," or "direct(ly)," is used.

In construing an element, the element is to be construed as including an error or tolerance range even where no explicit description of such an error or tolerance range is provided. Further, the term "may" fully encompasses all the meanings of the term "can."

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

Hereinafter, various example embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Hereinafter, various embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

FIG. 1 illustrates an example system configuration of a touch sensor embedded light emitting diode display device 100 according to aspects of the present disclosure.

Referring to FIG. 1, in one or more embodiments, the touch sensor embedded light emitting diode display device 100 may include a touch display panel 110 and a display driving circuit as elements for displaying an image.

The display driving circuit may be a circuit for driving display driving elements included in the touch display panel 110 so that an image can be displayed on the touch display panel 110, and include a data driving circuit 120, a gate driving circuit 130, and a display controller 140.

The touch display panel 110 may include an active area AA where an image can be displayed and may further include a non-active area where an image is not displayed. The non-active area may also be referred to as a bezel area. The touch display panel 110 may include a display substrate SUB, a plurality of subpixels SP disposed on the display substrate SUB, and various signal lines.

The signal lines may include a plurality of data lines for delivering data signals (also referred to as data voltages or image signals) and a plurality of gate lines for delivering gate signals (also referred to as scan signals). The plurality of data lines and the plurality of gate lines may intersect each other.

Each of the plurality of data lines may be disposed such that it extends in a first direction. Each of the plurality of gate lines may be disposed such that it extends in a second direction different from the first direction. For example, the first direction may be a column or vertical direction, and the second direction may be a row or horizontal direction. In another example, the first direction may be the row or horizontal direction, and the second direction may be the column or vertical direction. Hereinafter, for convenience of description and ease of understanding, it is assumed that the plurality of gate lines GL is arranged in the row or horizontal direction and the plurality of data lines DL is arranged in the column or vertical direction.

The data driving circuit 120 may be a circuit for driving the plurality of data lines, and can output data signals to the plurality of data lines. The gate driving circuit 130 may be a circuit for driving the plurality of gate lines, and can output gate signals to the plurality of gate lines. The display controller 140 may be a device for controlling the data driving circuit 120 and the gate driving circuit 130, and can control driving timings for the plurality of data lines and driving timings for the plurality of gate lines.

The display controller 140 can supply at least one data driving control signal to the data driving circuit 120 to control the data driving circuit 120, and supply at least one gate driving control signal to the gate driving circuit 130 to control the gate driving circuit 130.

The data driving circuit 120 can supply data signals to the plurality of data lines according to the driving timing control of the display controller 140. The data driving circuit 120 can receive digital image data from the display controller 140, convert the received image data into analog data signals, and output the resulting analog data signals to the plurality of data lines.

The gate driving circuit 130 can supply gate signals to the plurality of gate lines according to the timing control of the display controller 140. The gate driving circuit 130 can receive a first gate voltage corresponding to a turn-on level voltage and a second gate voltage corresponding to a turn-off level voltage along with several types of gate driving control signals (e.g., a start signal, a reset signal, and the like), generate gate signals, and supply the generated gate signals to the plurality of gate lines.

In one or more embodiments, the data driving circuit 120 may be connected to the touch display panel 110 using a tape-automated-bonding (TAB) technique, or connected to a conductive pad such as a bonding pad of the touch display panel 110 using a chip-on-glass (COG) technique or a chip-on-panel (COP) technique, or connected to the touch display panel 110 using a chip-on-film (COF) technique. Hereinafter, for convenience of description, it is assumed that the data driving circuit 120 is connected to the touch display panel 110 in the chip-on-film (COF) technique.

For example, the gate driving circuit 130 may be connected to the touch display panel 110 using the tape-automated-bonding (TAB) technique, or connected to a conductive pad such as a bonding pad of the touch display panel 110 using the chip-on-glass (COG) technique or the chip-on-panel (COP) technique, or connected to the touch display panel 110 using the chip-on-film (COF) technique. In one or more embodiments, the gate driving circuit 130 may be disposed in a non-active area or an active area AA of the touch display panel 110 using a gate-in-panel (GIP) technique.

In one or more embodiments, at least one of the data driving circuit 120 and the gate driving circuit 130 may be disposed in the active area AA of the touch display panel 110. For example, at least one of the data driving circuit 120 and the gate driving circuit 130 may be disposed not to overlap subpixels SP, or disposed to overlap one or more, or all, of the subpixels SP.

The data driving circuit 120 may be located in, and/or electrically connected to, but not limited to, only one side or portion (e.g., an upper edge or a lower edge) of the touch display panel 110. In one or more embodiments, the data driving circuit 120 may be located in, and/or electrically connected to, but not limited to, two sides or portions (e.g., an upper edge and a lower edge) of the touch display panel 110 or at least two of four sides or portions (e.g., the upper edge, the lower edge, a left edge, and a right edge) of the touch display panel 110 according to driving schemes, panel design schemes, or the like.

The gate driving circuit 130 may be located in, and/or electrically connected to, but not limited to, only one side or portion (e.g., a left edge or a right edge) of the touch display panel 110. In one or more embodiments, the gate driving circuit 130 may be located in, and/or electrically connected to, but not limited to, two sides or portions (e.g., a left edge and a right edge) of the touch display panel 110 or at least two of four sides or portions (e.g., an upper edge, a lower edge, the left edge, and the right edge) of the touch display panel 110 according to driving schemes, panel design schemes, or the like.

The display controller 140 may be implemented in a separate component from the data driving circuit 120, or incorporated in the data driving circuit 120 and thus implemented in an integrated circuit. The display controller 140 may be a timing controller used in the typical display technology or a controller or a control device capable of performing other control functions in addition to the function of the typical timing controller. In one or more embodiments, the display controller 140 may be a controller or a control device different from the timing controller, or a circuitry or a component included in the controller or the control device. The display controller 140 may be implemented with various circuits or electronic components such as an integrated circuit (IC), a field programmable gate array (FPGA), an application specific integrated circuit (ASIC), a processor, and/or the like.

The display controller 140 may be mounted on a printed circuit board, a flexible printed circuit, and/or the like and be electrically connected to the gate driving circuit 130 and the data driving circuit 120 through the printed circuit board, flexible printed circuit, and/or the like. The display controller 140 can transmit signals to, and receive signals from, the data driving circuit 120 via one or more predefined interfaces. In one or more embodiments, such interfaces may include a low voltage differential signaling (LVDS) interface, an embedded clock point-point interface (EPI), a serial peripheral interface (SPI), and the like.

The touch sensor embedded light emitting diode display device 100 can further provide a touch sensing function as well as an image display function. To provide such a touch sensing function, the touch sensor embedded light emitting diode display device 100 may include a touch sensor unit and a touch sensing circuit 150.

The touch sensor unit may include a plurality of touch sensors. For example, each, or one or more of a plurality of touch electrodes may also be referred to as a touch sensor.

In one or more embodiments, the touch sensing circuit 150 included in the touch sensor embedded light emitting diode display device 100 can sense all, or one or more, of the plurality of touch sensors included in the touch sensor unit, and thereby, detect whether a touch is input by a touch object, such as a finger, a pen, or the like, or detect the location of the touch. The touch sensing circuit 150 may include a touch driving circuit 160 configured to generate touch sensing data by sensing at least one of the plurality of touch sensors, a touch controller 170 configured to detect the presence or absence of a touch or detect the location of the touch based on the touch sensing data, and the like.

In the touch sensor embedded light emitting diode display device 100, the touch sensor unit may further include a plurality of touch routing lines for electrically connecting the plurality of touch electrodes to the touch driving circuit 160. The touch routing line may also be referred to as a touch line, an external routing line, or an external touch routing line.

For example, one touch sensor may be configured with one touch sensor electrode.

In another example, one touch sensor may be configured with two or more touch sensor electrodes electrically connected to each other. In this example, one touch sensor may further include at least one bridge electrically connecting two or more touch sensor electrodes. The bridge may also be referred to as a bridge pattern, a bridge electrode, a bridge line, an inner touch line, an inner touch routing line, or an inner routing line.

The touch display panel 110 may be a touch sensor embedded display panel. That is, a touch sensor unit may be disposed inside of the touch display panel 110. In this implementation, during the manufacturing process of the touch display panel 110, the touch sensor unit (touch sensors, and touch routing lines) may be disposed together with electrodes or signal lines related to display driving.

The touch sensing circuit 150 of the touch sensor embedded light emitting diode display device 100 may perform touch sensing using a self-capacitance sensing technique and/or a mutual-capacitance sensing technique.

When the touch sensing circuit 150 performs touch sensing using the self-capacitance sensing technique, the touch sensing circuit 150 can perform touch sensing based on capacitance between each touch sensor and a touch object (e.g., a finger, a pen, etc.).

To perform touch sensing based on the self-capacitance sensing technique, the touch driving circuit 160 can supply a touch driving signal to at least one of a plurality of touch sensors, and generate touch sensing data by sensing at least one of the plurality of touch sensors to which the touch driving signal is supplied. The touch controller 170 can detect a self-capacitance, or a self-capacitance variation, of the at least one touch sensor based on the touch sensing data, and determine the presence or absence of a touch and/or the location of the touch (or coordinates of the touch) based on the self-capacitance or the self-capacitance variation.

When the touch sensing circuit 150 performs touch sensing using the mutual-capacitance sensing technique, the touch sensing circuit 150 can perform touch sensing based on capacitance between touch sensors. According to the mutual-capacitance sensing technique, a plurality of touch sensors are classified into transmission touch sensors (which may be referred to as driving touch sensors) and reception touch sensors (which may be referred to as sensing touch sensors) based on their functions and/or roles.

To perform touch sensing based on the mutual-capacitance sensing technique, the touch driving circuit 160 can generate touch sensing data by driving at least one transmission touch sensor and sensing at least one reception touch sensor. The touch controller 170 can detect a mutual-capacitance, or a mutual-capacitance variation, between the transmission touch sensor and the reception touch sensor based on the touch sensing data, and determine the presence or absence of a touch and/or the location of the touch (or coordinates of the touch) based on the mutual-capacitance or the mutual-capacitance variation.

In one embodiment, each of the touch driving circuit 160 and the touch controller 170 may be implemented in a separate integrated circuit. In another embodiment, the touch driving circuit 160 and the touch controller 170 may be integrated into a single integrated circuit.

In one embodiment, each of the touch driving circuit 160 and the data driving circuit 120 may be implemented in a separate integrated circuit. In another embodiment, the touch driving circuit 160 and the data driving circuit 120 may be integrated into a single integrated circuit. In an example where the touch sensor embedded light emitting diode display device 100 includes one driving integrated circuit chip, the one driving integrated circuit chip may include the touch driving circuit 160 and the data driving circuit 120. In another example where the touch sensor embedded light emitting diode display device 100 includes two or more driving integrated circuit chips, each of the two or more driving integrated circuit chips may include one or more elements of the touch driving circuit 160 and one or more elements of the data driving circuit 120.

The touch sensor embedded light emitting diode display device 100 may further include a power supply circuit for supplying various types of power to the display driving circuit and/or the touch sensing circuit.

The touch sensor embedded light emitting diode display device 100 may be a mobile terminal such as a smart phone, a tablet, or the like, or a monitor or television (TV) of various sizes, but embodiments of the present disclosure are not limited thereto. For example, the touch sensor embedded light emitting diode display device 100 may include displays of various types, or displays of various sizes, suitable for presenting information or images. In one or more embodiments, the touch sensor embedded light emitting diode display device 100 according to aspects of the present disclosure may be a tiling display including a plurality of touch display panels 110.

The touch sensor embedded light emitting diode display device 100 may be a self-emissive display device, of which the touch display panel 110 itself emits light. Accordingly, each of a plurality of subpixels SP in the touch display panel 110 may include various types of light emitting elements.

Figure 2:
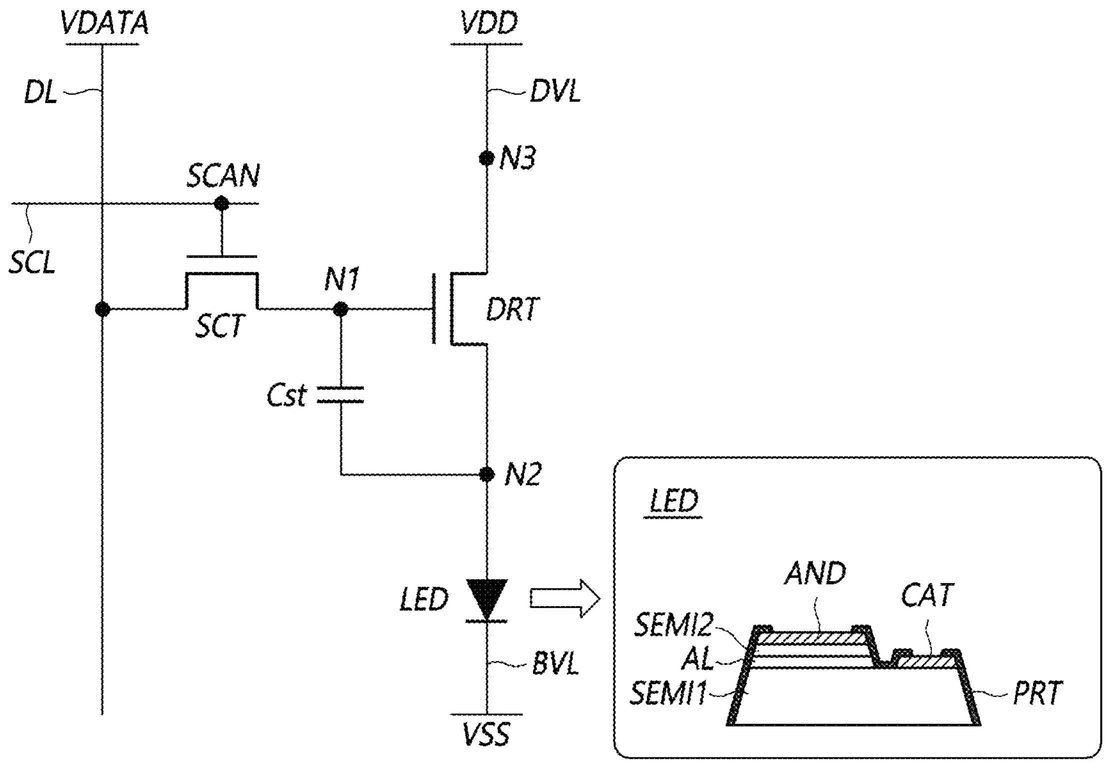
FIG. 2 illustrates an example equivalent circuit of a subpixel included in the touch sensor embedded light emitting diode display device according to aspects of the present disclosure.

FIG. 2 illustrates an example equivalent circuit of a subpixel SP included in the touch sensor embedded light emitting diode display device 100 according to aspects of the present disclosure.

Referring to FIG. 2, the touch display panel 110 may include a plurality of subpixels SP disposed over the display substrate SUB.

Each of the plurality of subpixels SP may include a light emitting diode LED as a light emitting element, a driving transistor DRT for driving the light emitting diode LED, a scan transistor SCT for transferring a data voltage VDATA to a first node N1 of the driving transistor DRT, and a storage capacitor Cst for maintaining a constant voltage for one frame.

The driving transistor DRT may include the first node N1 to which a data voltage VDATA is applied, a second node N2 electrically connected to the light emitting diode LED, and a third node N3 to which a first power signal VDD through a first power line DVL is applied. In the driving transistor DRT, the first node N1 may be a gate node, the second node N2 may be a source node or a drain node, and the third node N3 may be the drain node or the source node.

The light emitting diode LED may be referred to as a light emitting diode (LED) chip. For example, the light emitting diode LED may be referred to as a micro light emitting diode or a micro light emitting diode chip.

The light emitting diode LED may include a first semiconductor layer SEMI1, a second semiconductor layer SEMI2, and an active layer AL. The first semiconductor layer SEMI1 may be disposed over one portion (e.g., one side portion of an upper surface) of the second semiconductor layer SEMI2, and thereby, expose at least a portion of the other portion (e.g., at least a portion of the other side portion of the upper surface) of the second semiconductor layer SEMI2. The active layer AL may be interposed between the first semiconductor layer SEMI1 and the second semiconductor layer SEMI2. The active layer AL may also be referred to as an emission layer. The light emitting diode LED may further include a first electrode AND and a second electrode CAT.

The first electrode AND may be disposed on the first semiconductor layer SEMI1 and may be electrically connected to the first semiconductor layer SEMI1. The second electrode CAT may be disposed on the exposed second semiconductor layer SEMI2 and may be electrically connected to the second semiconductor layer SEMI2. The first electrode AND and the second electrode CAT may be spaced apart from each other by a predetermined distance.

The first semiconductor layer SEMI1 may be implemented as a p-type semiconductor layer.

The second semiconductor layer SEMI2 may be implemented as an n-type semiconductor layer.

The active layer AL may be a layer from which light emits by a band gap (or an energy difference) between energy bands according to materials included in the active layer AL while holes injected through the first semiconductor layer SEMI1 and electrons injected through the second semiconductor layer SEMI2 meet each other.

The light emitting diode LED may further include an insulating layer PRT for protecting elements of the light emitting diode LED. The insulating layer PRT may expose at least a portion of the first electrode AND and at least a portion of the second electrode CAT, while covering exposed outer surfaces of the light emitting diode LED. The insulating layer PRT may include an insulating material. For example, the insulating layer PRT may include any one selected from, or a stacked structure of, one or more of, a silicon oxide layer ($SiO_x$) and a silicon nitride layer ($SiN_x$).

In one or more embodiments, the first electrode AND of the light emitting diode LED may be electrically connected to a pixel electrode, and the second electrode CAT of the light emitting diode LED may be electrically connected to a common electrode.

The pixel electrode AND may be disposed in each subpixel SP and electrically connected to the second node N2 of the driving transistor DRT of each subpixel SP. The common electrode CAT may be commonly disposed in a plurality of subpixels SP.

The touch display panel 110 may further include a second power line BVL for supplying a second power signal VSS to the common electrode, and the second power line BVL may be electrically connected to the common electrode.

In one or more embodiments, the light emitting diode LED may be an organic light emitting diode (OLED) including an organic emission layer between the first electrode AND and the second electrode CAT.

The scan transistor SCT may be connected between the first node N1 of the driving transistor DRT and a corresponding data line DL among a plurality of data lines DL, and can control a voltage state in the first node N1 of the driving transistor DRT.

The scan transistor SCT can control a connection between the first node N1, which is the gate node of the driving transistor DRT and a corresponding data line DL among a plurality of data lines DL according to a scan signal SCAN delivered through a corresponding scan line SCL among a plurality of scan lines SCL, which are one type of gate line.

The drain node or the source node of the scan transistor SCT may be electrically connected to the data line DL. The source node or the drain node of the scan transistor SCT may be electrically connected to the first node N1 of the driving transistor DRT. The gate node of the scan transistor SCT may be electrically connected to the scan line SCL to receive the scan signal SCAN.

The scan transistor SCT can be turned on by the scan signal SCAN with a turn-on level voltage, and transfer a data voltage VDATA transmitted through the data line DL to the first node N1 of the driving transistor DRT.

The scan transistor SCT can be turned on by the scan signal SCAN with the turn-on level voltage and turned off by the scan signal SCAN with a turn-off level voltage. When the scan transistor SCT is an n-type transistor, the turn-on level voltage may be a high level voltage, and the turn-off level voltage may be a low level voltage. When the scan transistor SCT is a p-type transistor, the turn-on level voltage may be the low level voltage, and the turn-off level voltage may be the high level voltage.

The storage capacitor Cst may be electrically connected between the first node N1 and the second node N2 of the driving transistor DRT. In some embodiments, the storage capacitor Cst, which may be present between the first node N1 and the second node N2 of the driving transistor DRT, may be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Each of the driving transistor DRT and the scan transistor SCT may be an n-type transistor or a p-type transistor.

As illustrated in FIG. 2, each subpixel SP may have a 2T(Transistor)-1C(Capacitor) structure in which two transistors (DRT and SCT) and one capacitor Cst are included. In one or more implementations, each subpixel SP may further include one or more transistors or one or more capacitors in the 2T-1C structure.

In one or more embodiments, the touch sensor embedded light emitting diode display device 100 may have a top emission structure in which light from a light emitting diode is emitted in a direction opposite to the display substrate SUB of the touch display panel 110.

Figure 3:
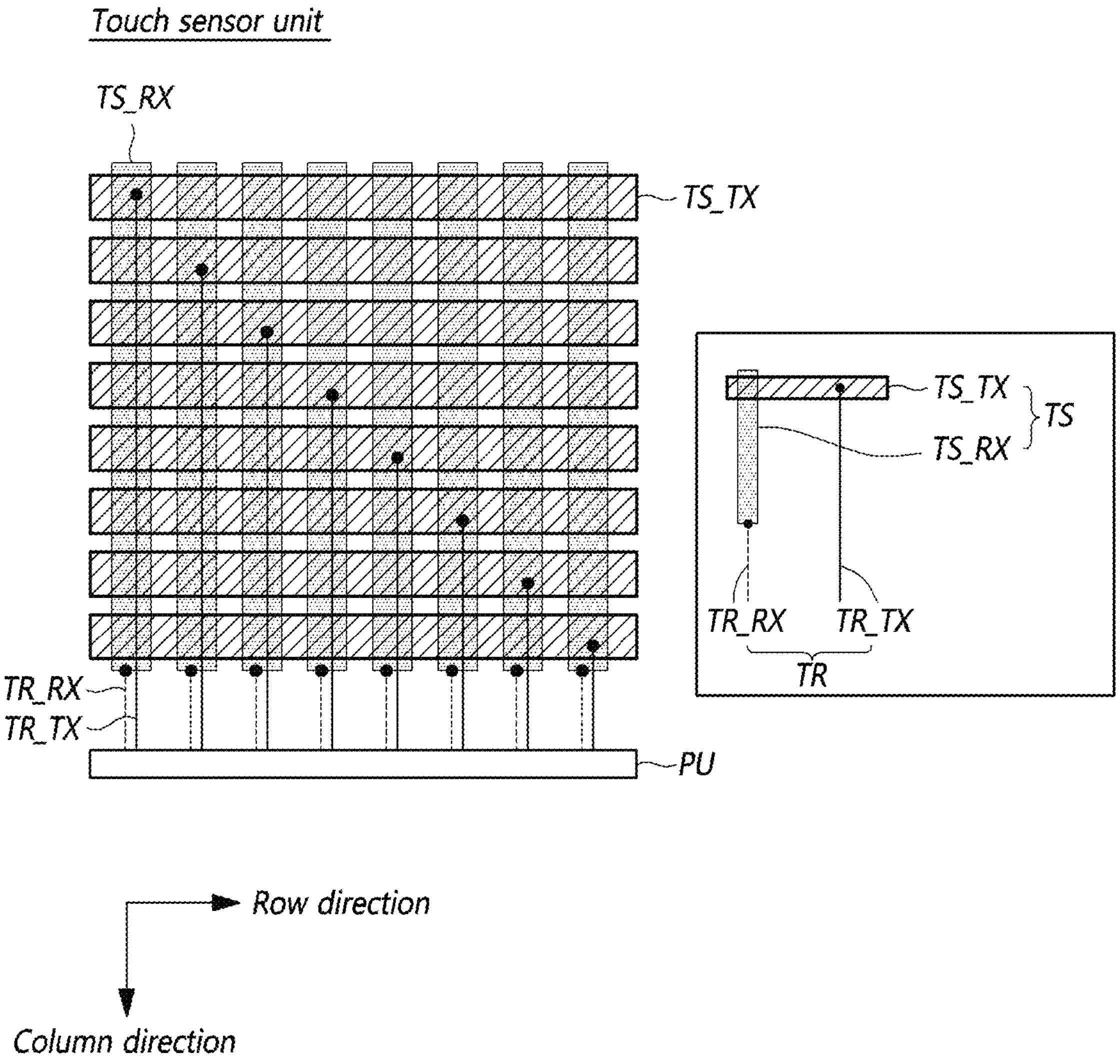
FIGS. 3 and 4 illustrate planar structures of example touch sensor units included in a touch display panel according to aspects of the present disclosure.
Figure 4:
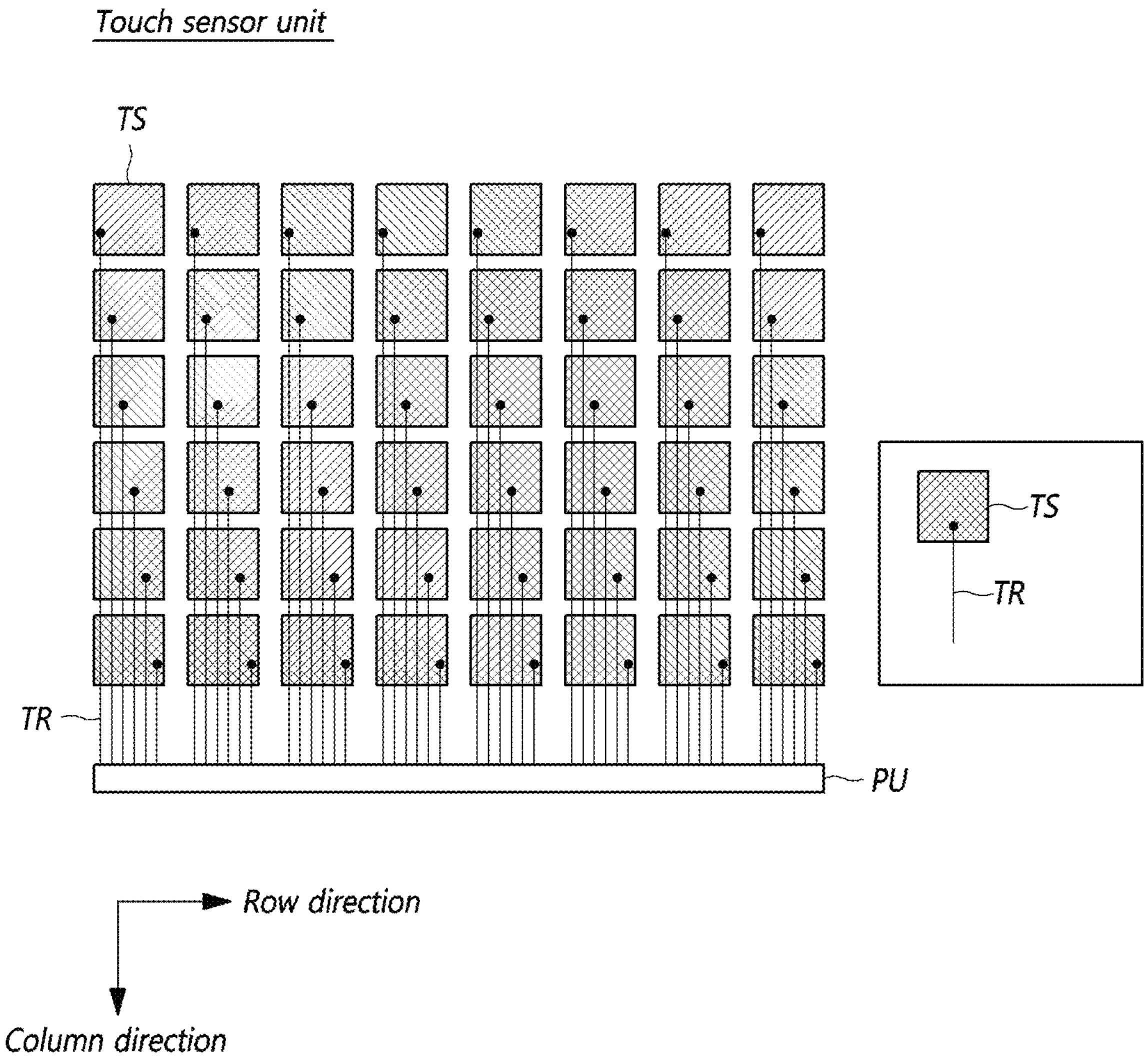

FIGS. 3 and 4 illustrate planar structures of example touch sensor units included in the touch display panel 110 according to aspects of the present disclosure.

With reference to FIG. 3, a touch sensor unit included in the touch display panel 110 may include a plurality of touch sensors TS and a plurality of touch routing lines TR.

The plurality of touch sensors TS may include a plurality of transmission touch sensors TS_TX and a plurality of reception touch sensors TS_RX.

The plurality of transmission touch sensors TS_TX and the plurality of reception touch sensors TS_RX may intersect each other. For example, each of the plurality of transmission touch sensors TS_TX may be disposed while extending in a row direction (herein, which may be referred to as a horizontal direction), and each of the plurality of reception touch sensors TS_RX may be disposed while extending in a column direction (herein, which may be referred to as a vertical direction). In another example, each of the plurality of transmission touch sensors TS_TX may be disposed while extending in the column direction, and each of the plurality of reception touch sensors TS_RX may be disposed while extending in the row direction. Hereinafter, for convenience of description, discussions are provided based on examples where each of the plurality of transmission touch sensors TS_TX is disposed while extending in the row direction, and each of the plurality of reception touch sensors TS_RX is disposed while extending in the column direction.

The plurality of touch routing lines TR may be lines (touch lines) for electrical connection between the plurality of touch sensors TS and a pad unit PU. For example, the pad unit PU may include a plurality of pads to which the touch driving circuit 160 is electrically connected.

The plurality of touch routing line TR may include a plurality of transmission touch routing lines TR_TX for electrical connection between the plurality of transmission touch sensors TS_TX and the pad unit PU and a plurality of reception touch routing lines TR_RX for electrical connection between the plurality of reception touch sensors TS_RX and the pad unit PU. Each of the plurality of transmission touch routing lines TR_TX may extend in the column direction (or the row direction) and be connected to the pad unit PU. Each of the plurality of reception touch routing lines TR_RX may extend in the column direction (or the row direction) and be connected to the pad unit PU.

FIG. 3 may be a planar structure of a touch sensor unit based on mutual-capacitance sensing. With reference to FIG. 3, the touch driving circuit 160 can supply a touch driving signal to at least one of a plurality of transmission touch sensors TS_TX through at least one of a plurality of transmission touch routing lines TR_TX. The touch driving circuit 160 can sense all, or one or more, of a plurality of reception touch sensors TS_RX through all, or one or more, of a plurality of reception touch routing lines TR_RX.

A signal or signals obtained by sensing all, or one or more, of the plurality of reception touch sensors TS_RX by the touch driving circuit 160 may be a signal or signals corresponding to mutual capacitance between all, or one or more, of the plurality of reception touch sensors TS_RX and at least one transmission touch sensor TS_TX.

In the touch sensor unit, in an example where each transmission touch sensor TS_TX extends in the row direction and each receiving touch sensor TS_RX extends in the column direction, each of the plurality of transmission touch routing lines TR_TX may be connected to one end of corresponding one of the plurality of transmission touch sensor TS_TX, and run along an outer edge of the active area AA or an edge outside of the active area AA. In this example, each of the plurality of transmission touch routing lines TR_TX may not overlap other touch sensors TS except for the corresponding touch sensor TS. In another example, with reference to FIG. 3, each of the plurality of transmission touch routing lines TR_TX may extend while overlapping a corresponding reception touch sensor TS_RX and be connected to the pad unit PU.

As described above, all of the touch routing lines TR may directly pass through the active area AA and be connected to the pad unit PU without running along left and right outer edges of the active area AA or left and right edges outside of the active area AA to be connected to the pad unit PU. This arrangement structure of the touch routing lines TR may be referred to as an inner routing structure.

Unlike the example of FIG. 3, in the touch sensor unit, in an example where each transmission touch sensor TS_TX extends in the column direction, and each reception touch sensor TS_RX extends in the row direction, according to the internal routing structure, each of the plurality of reception touch routing lines TR_RX may extend while overlapping a corresponding transmission touch sensor TS_TX and be connected to the pad unit PU.

According to the internal routing structure discussed above, touch routing lines TR may not be disposed in three outer edges, or three areas outside, of the touch sensor unit. Therefore, the size of the bezel can be greatly reduced by the internal routing structure.

FIG. 4 illustrates a planar structure of another example touch sensor unit included in the touch display panel 110 according to aspects of the present disclosure.

With reference to FIG. 4, a touch sensor unit included in the touch display panel 110 may include a plurality of touch sensors TS and a plurality of touch routing lines TR.

The plurality of touch sensors TS may be disposed spaced apart from each other.

The plurality of touch routing lines TR may electrically connect the plurality of touch sensors TS to the pad unit PU. Each of the plurality of touch routing lines TR may extend in the column direction (or the row direction) and be connected to the pad unit PU. Each of the plurality of touch routing lines TR may overlap two or more touch sensors TS. This may be an implementation to which the internal routing structure mentioned above is applied.

FIG. 4 may be a planar structure of a touch sensor unit based on self-capacitance sensing. With reference to FIG. 4, the touch driving circuit 160 can supply a touch driving signal to at least one of a plurality of touch sensors TS through at least one of a plurality of touch routing lines TR. The touch driving circuit 160 can sense the touch sensor TS to which the touch driving signal is supplied through the corresponding touch routing line TR.

A signal obtained by sensing at least one touch sensor TS by the touch driving circuit 160 may be a signal corresponding to a self-capacitance between at least one touch sensor TS and a touch object (e.g., a finger, a pen, or the like).

Figure 5:
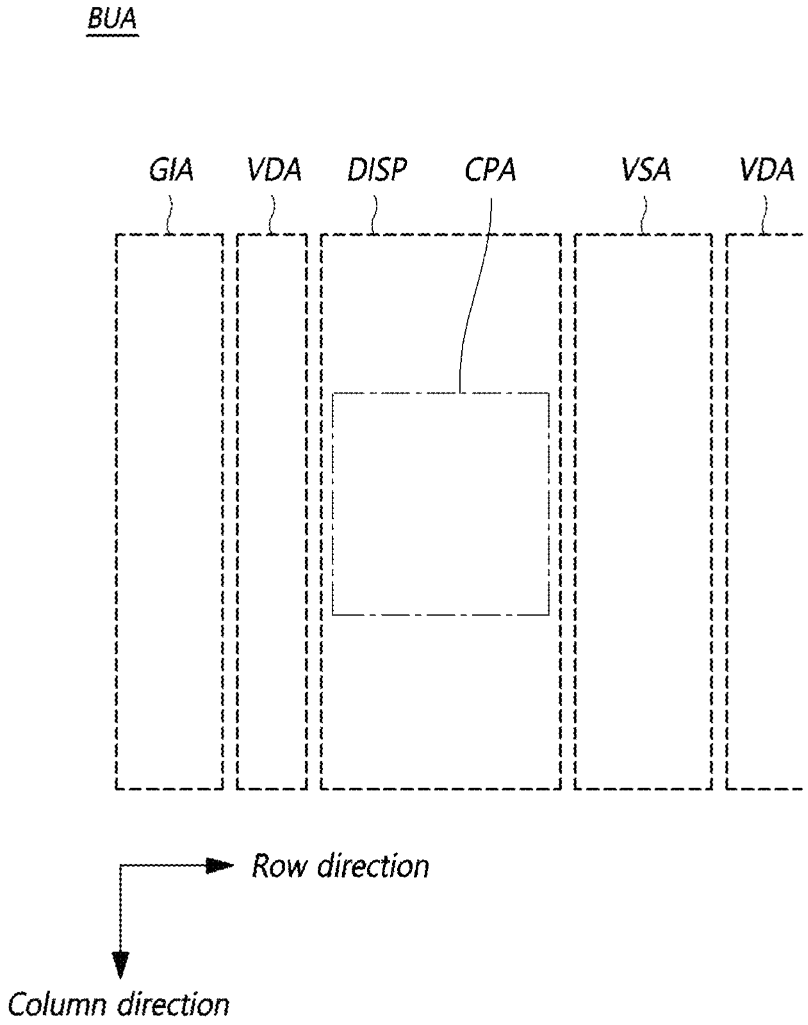
FIG. 5 illustrates an example basic unit area of the touch display panel according to aspects of the present disclosure.

FIG. 5 illustrates a basic unit area BUA of the touch display panel 110 included in the touch sensor embedded light emitting diode display device 100 according to aspects of the present disclosure.

With reference to FIG. 5, in the touch display panel 110 included in the touch sensor embedded light emitting diode display device 100, an active area AA where an image is displayed may include a plurality of core pixel areas CPA that are distributed in several locations. For example, one light emitting diode LED or two or more light emitting diodes LED may be disposed in each of the plurality of core pixel areas CPA.

The active area AA may include a plurality of basic unit areas BUA corresponding to the plurality of core pixel areas CPA. Each of the plurality of basic unit areas BUA may be an area having a predetermined size with respect to one core pixel area CPA.

Each of the plurality of basic unit areas BUA included in the active area AA may include a display circuit area DISP, a core pixel area CPA located in the display circuit area DISP and allowing at least one light emitting diode LED to be disposed, a first power supply area VDA located outside of the display circuit area DISP and allowing a first power line VDL to be disposed, a second power supply area VSA located outside of the display circuit area DISP and allowing a second power line BVL to be disposed, and a gate driving circuit area GIA located outside of the display circuit area DISP and allowing the gate driving circuit 130 to be disposed.

The core pixel area CPA may be an area in which one or more light emitting diodes LED are disposed, and may be a light emitting area in which light from the one or more light emitting diodes LED is emitted.

At least one subpixel circuit may be disposed in the display circuit area DISP.

As shown in FIG. 2, one subpixel circuit may include one or more light emitting diodes LED and a subpixel driving circuit for driving the one or more light emitting diodes LED. The subpixel driving circuit may include a driving transistor DRT, a scan transistor SCT, and a storage capacitor Cst.

For example, one subpixel circuit may include one light emitting diode LED and one subpixel driving circuit for driving the light emitting diodes LED. In another example, one subpixel circuit may include two or more light emitting diodes LED and one subpixel driving circuit for driving the two or more light emitting diodes LED in common.

One or more light emitting diodes LEDs included in one subpixel circuit may be disposed in the core pixel area CPA.

One subpixel driving circuit (e.g., including DRT, SCT, and Cst) included in one subpixel circuit may be disposed in the core pixel area CPA, or be disposed in an outer area, or an area outside of, the core pixel area CAP in the display circuit area DISP.

With reference to FIG. 5, the first power supply area VDA may be an area where the first power line DVL is disposed, and may be disposed on a first side of the display circuit area DISP.

The second power supply area VSA may be an area where the second power line BVL is disposed, and may be disposed on a second side of the display circuit area DISP opposing to the first side. Another first power supply area VDA may be further disposed on a side of the second power supply area VSA opposing to the display circuit area DISP.

The gate driving circuit area GIA may be disposed on a first side of the first power supply area VDA. Thus, since the gate driving circuit area GIA is disposed in the active area AA, an area (bezel area) outside of the active area AA may be greatly reduced.

Figure 6:
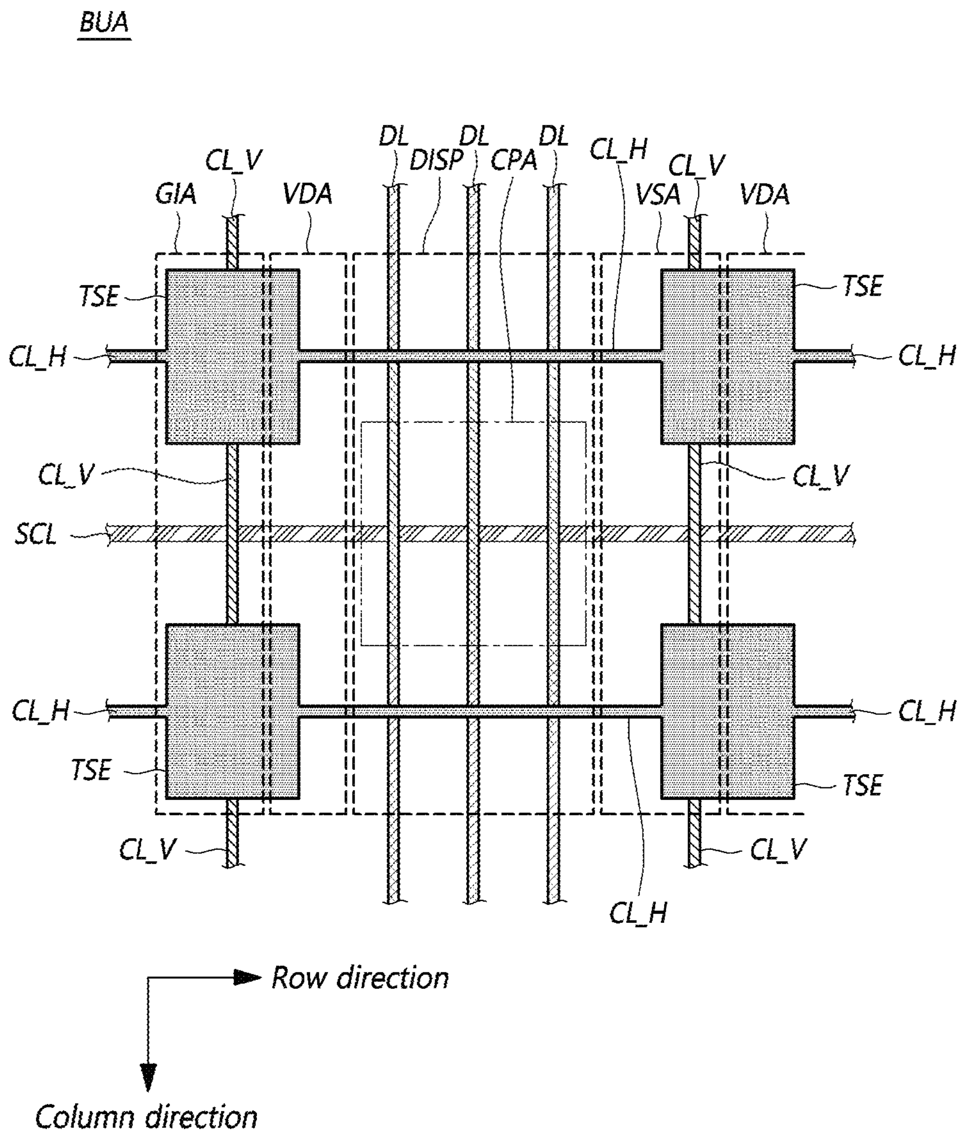
FIGS. 6, 7, and 8 illustrate example touch sensor structures in the basic unit area of the touch display panel according to aspects of the present disclosure.
Figure 7:
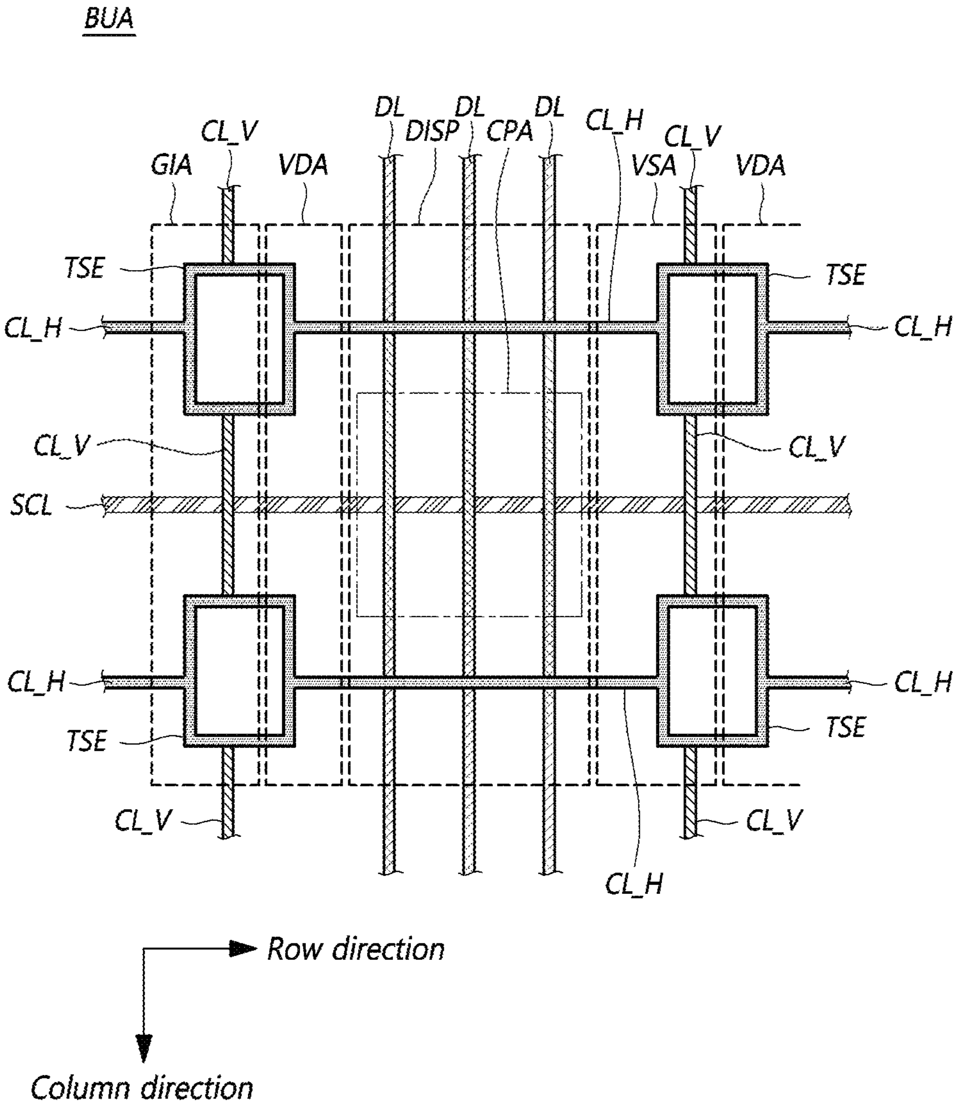
Figure 8:
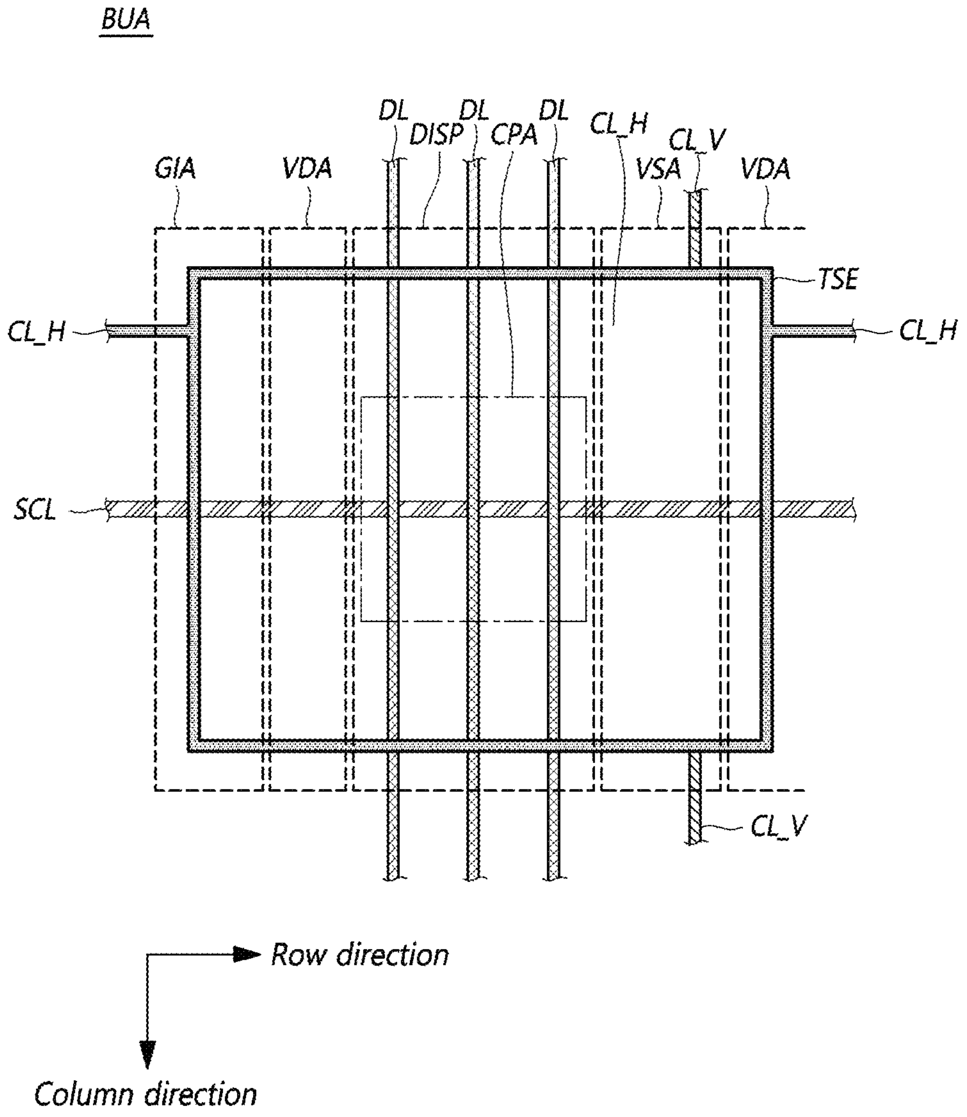

FIGS. 6, 7, and 8 illustrate example touch sensor structures in the basic unit area BUA of the touch display panel 110 included in the touch sensor embedded light emitting diode display device 100 according to aspects of the present disclosure.

One touch sensor TS may include a plurality of touch sensor electrodes TSE electrically connected to each other. One touch sensor TS may include a plurality of connection lines (CL_H and CL_V) for electrically interconnecting the plurality of touch sensor electrodes TSE. That is, one touch sensor TS may include a plurality of touch sensor electrodes TSE and a plurality of connection lines (CL_H and CL_V).

One touch sensor TS may be configured by the plurality of touch sensor electrodes TSE electrically connected by the plurality of connection lines (CL_H and CL_V).

All of elements included in one touch sensor TS may not be disposed in one basic unit area BUA. Accordingly, one or more touch sensor electrodes TSE among a plurality of touch sensor electrodes TSE included in one touch sensor TS may be disposed in one basic unit area BUA.

For example, as shown in FIGS. 6 and 7, four touch sensor electrodes TSE may be disposed in one basic unit area BUA. In another example, as shown in FIGS. 8, one touch sensor electrode TSE may be disposed in one basic unit area BUA.

With reference to FIGS. 6, 7, and 8, in the basic unit area BUA, a light emitting diode LED may be disposed in the core pixel area CPA, and touch sensor electrodes TSE may be disposed such that they overlap at least one of the first power supply area VDA, the second power supply area VSA, and the gate driving circuit area GIA.

With reference to FIGS. 6 and 7, four touch sensor electrodes TSE disposed in one basic unit area BUA among a plurality of touch sensor electrodes TSE included in one touch sensor TS may be arranged in a matrix form (e.g., 2 rows and 2 columns).

With reference to FIGS. 6 and 7, four touch sensor electrodes TSE disposed in one basic unit area BUA may include two touch sensor electrodes TSE adjacent to each other in the row direction. For example, two of the four touch sensor electrodes TSE may be disposed adjacent to each other in a first row, and the other two thereof may be disposed adjacent to each other in a second row. Further, the four touch sensor electrodes TSE disposed in one basic unit area BUA may include two touch sensor electrodes TSE adjacent to each other in the column direction. For example, two of the four touch sensor electrodes TSE may be disposed adjacent to each other in a first column, and the other two thereof may be disposed adjacent to each other in a second column.

With reference to FIGS. 6 and 7, in one basic unit area BUA, two adjacent touch sensor electrodes TSE in the row direction may be electrically connected through a horizontal connection line CL_H.

With reference to FIGS. 6 and 7, for example, the horizontal connection line CL_H may include the same conductive material as corresponding two touch sensor electrodes TSE. In another example, the horizontal connection line CL_H may include a conductive material different from corresponding two touch sensor electrodes TSE.

When the horizontal connection line CL_H includes the same conductive material as corresponding two touch sensor electrodes TSE, the horizontal connection line CL_H may be integrally formed as a single unit with corresponding two touch sensor electrodes TSE.

With reference to FIGS. 6 and 7, in one basic unit area BUA, two adjacent touch sensor electrodes TSE in the column direction may be electrically connected through a vertical connection line CL_V.

With reference to FIGS. 6 and 7, for example, the vertical connection line CL_V may include a different conductive material from corresponding two touch sensor electrodes TSE. In another example, the vertical connection line CL_V may include the same conductive material as corresponding two touch sensor electrodes TSE.

With reference to FIGS. 6 and 7, the horizontal connection line CL_H may be located (or always located) between corresponding two touch sensor electrodes TSE adjacent to each other in the row direction. Unlike this configuration, first and second touch sensor electrodes TSE adjacent to each other in the row direction may be connected by the horizontal connection line CL_H, and third and fourth touch sensor electrodes TSE adjacent to each other in the row direction may not be connected by the horizontal connection line CL_H.

With reference to FIGS. 6 and 7, the vertical connection line CL_V may be located (or always located) between corresponding two touch sensor electrodes TSE adjacent to each other in the column direction. Unlike this configuration, first and second touch sensor electrodes TSE adjacent to each other in the column direction may be connected by the vertical connection line CL_V, and third and fourth touch sensor electrodes TSE adjacent to each other in the column direction may not be connected by the vertical connection line CL_V.

As described above, in order to electrically connect the plurality of touch sensor electrodes TSE included in one touch sensor TS, the plurality of touch sensor electrodes TSE may be electrically connected to each other using one or more horizontal connection lines CL_H and one or more vertical connection lines CL_V.

In one or more embodiments, one or more vertical connection lines CL_V for electrically interconnecting a plurality of touch sensor electrodes TSE included in one touch sensor TS may serve as a touch routing line TR.

With reference to FIGS. 6 and 7, one or more data lines DL and one or more scan lines SCL connected to one or more subpixel driving circuits disposed in the display circuit area DISP included in one basic unit area BUA may run through the basic unit area BUA.

With reference to FIGS. 6 and 7, one or more data lines DL running through the basic unit area BUA may intersect one or more horizontal connection lines CL_H disposed in the basic unit area BUA. Accordingly, one or more data lines DL running through the basic unit area BUA and one or more horizontal connection lines CL_H disposed in the basic unit area BUA may include different conductive materials from each other.

With reference to FIGS. 6 and 7, one or more scan lines SCL running through the basic unit area BUA may intersect one or more vertical connection lines CL_V disposed in the basic unit area BUA. Accordingly, one or more scan lines SCL running through the basic unit area BUA and one or more vertical connection lines CL_V disposed in the basic unit area BUA may include different conductive materials.

With reference to FIG. 8, a plurality of touch sensor electrodes TSE included in one touch sensor TS may be disposed in a plurality of basic unit areas BUA, respectively.

With reference to FIG. 8, two touch sensor electrodes TSE disposed in two basic unit areas BUA adjacent to each other in the row direction among the plurality of basic unit areas BUA, in which the plurality of touch sensor electrodes TSE included in one touch sensor TS are disposed, respectively, may be connected to each other by a horizontal connection line CL_H.

Two touch sensor electrodes TSE disposed in two basic unit areas BUA adjacent to each other in the column direction among the plurality of basic unit areas BUA, in which the plurality of touch sensor electrodes TSE included in one touch sensor TS are disposed, respectively, may be connected to each other by a vertical connection line CL_H.

For example, the horizontal connection line CL_H may include the same conductive material as the two touch sensor electrodes TSE respectively disposed in the two adjacent basic unit areas BUA in the row direction. In another example, the horizontal connection line CL_H may include a different conductive material from the two touch sensor electrodes TSE respectively disposed in the two adjacent basic unit areas BUA in the row direction.

When the horizontal connection line CL_H includes the same conductive material as the two touch sensor electrodes TSE respectively disposed in the two adjacent basic unit areas BUA in the row direction, the horizontal connection line CL_H may be integrally formed with the two touch sensor electrodes TSE respectively disposed in the two adjacent basic unit areas BUA in the row direction.

For example, the vertical connection line CL_V may include a different conductive material from the two touch sensor electrodes TSE respectively disposed in the two adjacent basic unit areas BUA in the column direction. In another example, the vertical connection line CL_V may include the same conductive material as the two touch sensor electrodes TSE respectively disposed in the two adjacent basic unit areas BUA in the column direction.

For example, the horizontal connection line CL_H may be located (or always disposed) between the two touch sensor electrodes TSE respectively disposed in the two adjacent basic unit areas BUA in the row direction. In another example, first and second touch sensor electrodes TSE respectively disposed in two adjacent basic unit areas BUA in the row direction may be connected by a horizontal connection line CL_H, and third and fourth touch sensor electrodes TSE respectively disposed in two adjacent basic unit areas BUA in the row direction may not be connected by a horizontal connection line CL_H.

For example, the vertical connection line CL_V may be located (or always disposed) between the two touch sensor electrodes TSE respectively disposed in the two adjacent basic unit areas BUA in the column direction. In another example, first and second touch sensor electrodes TSE respectively disposed in two adjacent basic unit areas BUA in the column direction may be connected by a vertical connection line CL_V, and third and fourth touch sensor electrodes TSE respectively disposed in two adjacent basic unit areas BUA in the column direction may not be connected by a vertical connection line CL_V.

As described above, in order to electrically connect the plurality of touch sensor electrodes TSE included in one touch sensor TS, the plurality of touch sensor electrodes TSE may be electrically connected to each other using one or more horizontal connection lines CL_H and one or more vertical connection lines CL_V.

In one or more embodiments, one or more vertical connection lines CL_V for electrically interconnecting a plurality of touch sensor electrodes TSE included in one touch sensor TS may serve as a touch routing line TR.

With reference to FIG. 8, one or more data lines DL and one or more scan lines SCL connected to one or more subpixel driving circuits disposed in the display circuit area DISP included in one basic unit area BUA may run through the basic unit area BUA.

With reference to FIG. 8, one or more data lines DL running through the basic unit area BUA may intersect a touch sensor electrode TSE disposed in the basic unit area BUA. Accordingly, one or more data lines DL running through the basic unit area BUA and the touch sensor electrode TSE disposed in the basic unit area BUA may include different conductive materials.

With reference to FIG. 8, one or more scan lines SCL running through the basic unit area BUA may intersect a touch sensor electrode TSE disposed in the basic unit area BUA. Accordingly, one or more scan lines SCL running through the basic unit area BUA and the touch sensor electrode TSE disposed in the basic unit area BUA may include different conductive materials. The scan line SCL may intersect the vertical connection line CL_V and may include a different conductive material from the vertical connection line CL_V.

With reference to FIGS. 6 and 7, two touch sensor electrodes TSE disposed adjacent to each other in the row direction may include the same conductive material as a pixel electrode (e.g., the PXL in FIG. 9) connected to a first electrode AND of a light emitting diode LED.

The horizontal connection line CL_H electrically connecting two touch sensor electrodes TSE disposed adjacent to each other in the row direction may include the same conductive material as the pixel electrode (e.g., the PXL in FIG. 9) connected to the first electrode AND of the light emitting diode LED.

One or more data lines DL may intersect the horizontal connection line CL_H and may include a different conductive material from the pixel electrode (e.g., the PXL in FIG. 9) connected to the first electrode AND of the light emitting diode LED.

With reference to FIGS. 6 and 7, in the basic unit area BUA, the four touch sensor electrodes TSE may be disposed adjacent to a light emitting diode LED. In the basic unit area BUA, the first touch sensor electrode TSE, the second touch sensor electrode TSE, the third touch sensor electrode TSE, and the fourth touch sensor electrode TSE included in the four touch sensor electrodes TSE may include the same conductive material as the pixel electrode PXL.

With reference to FIGS. 6 and 7, in the basic unit area BUA, the four touch sensor electrodes TSE may not overlap the light emitting diode LED. In the basic unit area BUA, the four touch sensor electrodes TSE may be electrically connected to form one touch sensor TS. In the basic unit area BUA, the four touch sensor electrodes TSE may be disposed spaced apart from the light emitting diode LED and be disposed in a different direction with respect to the core pixel area CPA where the light emitting diode LEDs is disposed.

With reference to FIG. 6, in the basic unit area BUA, each of the four touch sensor electrodes TSE may have a block shape. That is, in the basic unit area BUA, each of the four touch sensor electrodes TSE may be a block-shaped electrode without an opening. For example, the block shape may be a square block shape, a circular block shape, a polygonal block shape, or an irregular block shape.

With reference to FIG. 7, in the basic unit area BUA, each of the four touch sensor electrodes TSE may have a ring shape. That is, in the basic unit area BUA, each of the four touch sensor electrodes TSE may be a ring-shaped electrode with an opening. For example, the ring shape may be a square ring shape, a circular ring shape, a polygonal ring shape, or an irregular ring shape.

With reference to FIG. 8, the first touch sensor electrode TSE may have a ring shape surrounding one or more light emitting diodes LED. That is, the first touch sensor electrode TSE may have a ring shape surrounding the core pixel area CPA. For example, the ring shape may be a square ring shape, a circular ring shape, a polygonal ring shape, or an irregular ring shape. In this implementation, the first touch sensor electrode TSE may intersect at least one data line DL and intersect at least one scan line SCL.

Figure 9:
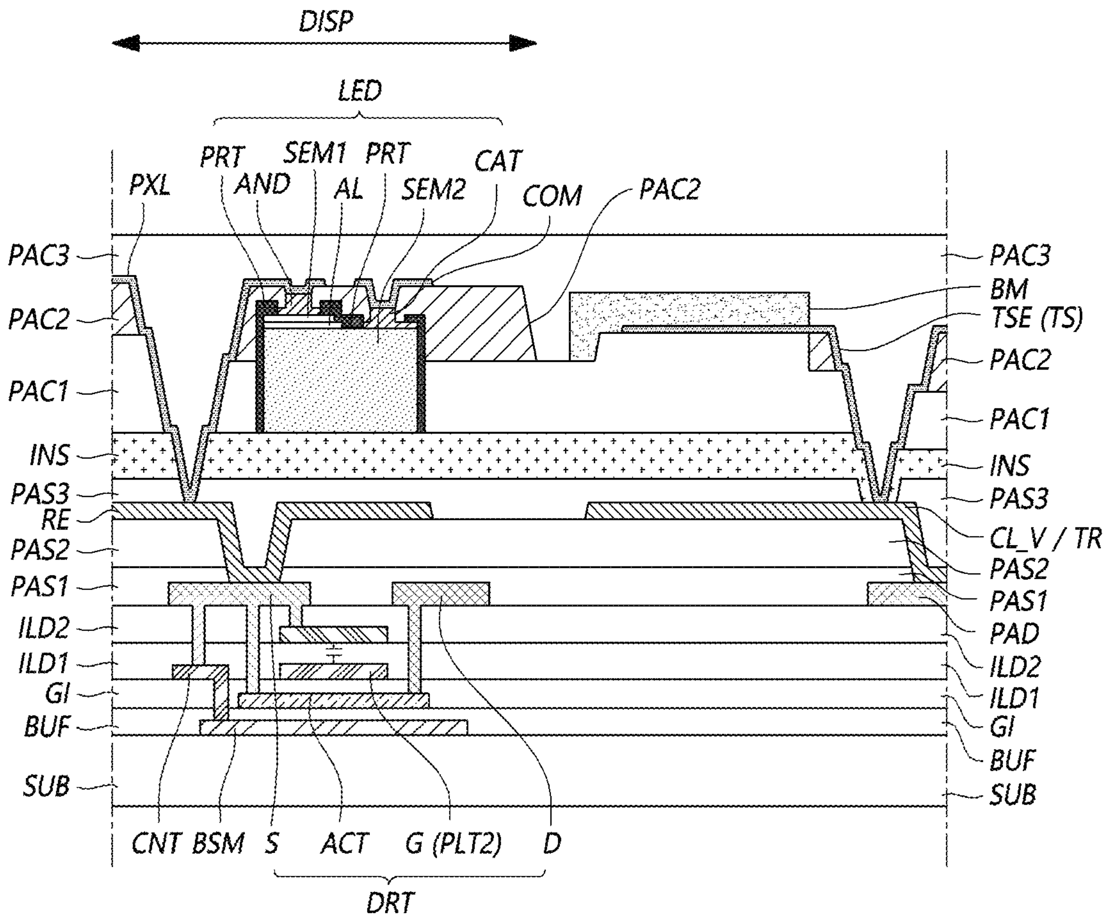
FIG. 9 illustrates an example vertical structure of the touch display panel according to aspects of the present disclosure.

FIG. 9 illustrates an example vertical structure of the touch display panel 110 included in the touch sensor embedded light emitting diode display device 100 according to aspects of the present disclosure.

With reference to FIG. 9, the vertical structure of the basic unit area BUA of the active area AA in the touch display panel 110 will be discussed. FIG. 9 shows a cross-sectional view of an area of the basic unit area BUA in which a light emitting diode LED and one touch sensor electrode TSE are disposed.

With reference to FIG. 9, the touch display panel 110 may include a display substrate SUB, a light emitting diode LED disposed on the display substrate SUB and including a first electrode AND and a second electrode CAT, a driving transistor DRT disposed on the display substrate SUB and including an active layer ACT, a source electrode S, a drain electrode D, and a gate electrode G, and a touch sensor electrode TSE disposed over the display substrate SUB, and spaced apart from the light emitting diode LED.

With reference to FIG. 9, the touch display panel 110 may further include a pixel electrode PXL electrically connected to the first electrode AND of the light emitting diode LED, a common electrode COM electrically connected to the second electrode CAT of the light emitting diode LED, a relay electrode RE electrically connecting the source electrode S or drain electrode D of the driving transistor DRT to the pixel electrode PXL, and a first touch sensor electrode TSE disposed spaced apart from the light emitting diode LED and including the same conductive material as the pixel electrode PXL. The first touch sensor electrode TSE may be one of a plurality of touch sensor electrodes TSE included in one touch sensor TS.

The stack structure of the touch display panel 110 will be described in more detail below with reference to FIG. 9.

A stack structure in the display circuit area DISP will be discussed firstly.

A lower shield metal BSM may be disposed on the display substrate SUB. For example, the lower shield metal BSM may include at least one of molybdenum (Mo), titanium (Ti), molybdenum-titanium (MoTi), copper (Cu), or aluminum (Al).

A buffer layer BUF may be disposed on the lower shield metal BSM. For example, the buffer layer BUF may include silicon oxide (SiOx) and/or silicon nitride (SiNx).

The active layer ACT may be disposed on the buffer layer BUF. For example, the active layer ACT may include an oxide semiconductor material or a silicon semiconductor material.

A gate insulating layer GI may be disposed on the active layer ACT. For example, the gate insulating layer GI may include silicon oxide (SiOx) and/or silicon nitride (SiNx).

The gate electrode G may be disposed on the gate insulating layer GI. For example, the gate electrode G may include at least one of molybdenum (Mo), titanium (Ti), molybdenum-titanium (MoTi), copper (Cu), or aluminum (Al).

A contact pattern CNT may be further disposed on the gate insulating layer GI. The contact pattern CNT may include the same conductive material as the gate electrode G.

The contact pattern CNT may be connected to the lower shield metal BSM through holes in the gate insulating layer GI and the buffer layer BUF.

A first interlayer insulating layer ILD1 may be disposed such that it covers the gate electrode G. For example, the first interlayer insulating layer ILD1 may include silicon nitride (SiNx) and/or silicon oxide (SiOx).

A first capacitor electrode PLT1 may be disposed on the first interlayer insulating layer ILD1. For example, the first capacitor electrode PLT1 may include at least one of molybdenum (Mo), titanium (Ti), molybdenum-titanium (MoTi), copper (Cu), or aluminum (Al).

The first capacitor electrode PLT1 may overlap the gate electrode G, and the first interlayer insulating layer ILD1 may be disposed between the first capacitor electrode PLT1 and the gate electrode G. Accordingly, the gate electrode G may serve as a second capacitor electrode PLT2, and thereby, a storage capacitor Cst may be formed between the first capacitor electrode PLT1 and the gate electrode G.

In other words, the storage capacitor Cst may include the first capacitor electrode PLT1 and the second capacitor electrode PLT2. The first capacitor electrode PLT1 may be electrically connected to the source electrode S, and the second capacitor electrode PLT2 may be the gate electrode G or electrically connected to the gate electrode G.

A second interlayer insulating layer ILD2 may be disposed such that it covers the first capacitor electrode PLT1. For example, the second interlayer insulating layer ILD2 may include silicon nitride (SiNx) and/or silicon oxide (SiOx).

The source electrode S and the drain electrode D may be disposed on the second interlayer insulating layer ILD2. For example, the source electrode S and the drain electrode D may include at least one of molybdenum (Mo), titanium (Ti), molybdenum-titanium (MoTi), copper (Cu), or aluminum (Al).

The source electrode S may be connected to a portion of the active layer ACT through holes in the second interlayer insulating layer ILD2, the first interlayer insulating layer ILD1, and the gate insulating layer GI.

The drain electrode D may be connected to another portion of the active layer ACT through holes in the second interlayer insulating layer ILD2, the first interlayer insulating layer ILD1, and the gate insulating layer GI.

To form the storage capacitor Cst, the source electrode S may be connected to the first capacitor electrode PLT1 through a hole in the second interlayer insulating layer ILD2.

The source electrode S may be connected to the contact pattern CNT through holes in the second interlayer insulating layer ILD2 and the first interlayer insulating layer ILD1. Accordingly, the source electrode S may be connected to the lower shield metal BSM through the contact pattern CNT.

A first passivation layer PAS1 may be disposed such that it covers the source electrode S and the drain electrode D. A second passivation layer PAS2 may be disposed on the first passivation layer PAS1. In one or more embodiments, both the first passivation layer PAS1 and the second passivation layer PAS2 may be disposed, or only one of the first passivation layer PAS1 and the second passivation layer PAS2 may be disposed. For example, the first passivation layer PAS1 may include silicon nitride (SiNx) and/or silicon oxide (SiOx), or may be an organic layer in an implementation. The second passivation layer PAS2 may be an organic layer or an inorganic layer.

A relay electrode RE may be disposed on the second passivation layer PAS2. The relay electrode RE may be connected to the source electrode S of the driving transistor DRT through holes in the second passivation layer PAS2 and the first passivation layer PAS1.

The relay electrode RE may be a reflector for enabling light emitted from the light emitting diode LED to be reflected upwardly from the display substrate SUB. The relay electrode RE may have a flat shape corresponding to that of the light emitting diode LED. The relay electrode RE may be disposed such that it covers most of an area of one subpixel SP.

The relay electrode RE may include a reflective electrode material to serve as a reflector. For example, the relay electrode RE may be an alloy of indium tin oxide (ITO) and aluminum (Al).

The relay electrode RE may be located under the light emitting diode LED, overlap the light emitting diode LED, and include a reflective electrode material.

A third passivation layer PAS3 may be disposed on the relay electrode RE. For example, the third passivation layer PAS3 may include silicon nitride (SiNx) and/or silicon oxide (SiOx), or may be an organic layer in an implementation.

A support layer INS may be disposed on the third passivation layer PAS3.

The support layer INS may be a layer for fixing the light emitting diode LED disposed on the support layer INS. For example, the support layer INS may include an adhesive material such as resin, but embodiments of the present disclosure are not limited thereto.

The light emitting diode LED may be disposed on the supporting layer INS. The light emitting diode LED may be an element configured to emit light by current and can emit light of various colors such as red light, green light, blue light, or the like. For example, in order that white light can be emitted from one core pixel area CPA, at least one light emitting diode LED emitting red light, at least one light emitting diode LED emitting green light, and at least one light emitting diode LED emitting blue light may be disposed in the one core pixel area CPA.

The light emitting diode LED may be referred to as a light emitting diode (LED) chip.

The light emitting diode LED may include a first semiconductor layer SEMI1, a second semiconductor layer SEMI2, and an active layer AL. The first semiconductor layer SEMI1 may be disposed over one portion (e.g., one side portion of an upper surface) of the second semiconductor layer SEMI2, and thereby, expose at least a portion of the other portion (e.g., at least a portion of the other side portion of the upper surface) of the second semiconductor layer SEMI2. The active layer AL may be interposed between the first semiconductor layer SEMI1 and the second semiconductor layer SEMI2. The active layer AL may also be referred to as an emission layer.

The light emitting diode LED may further include a first electrode AND and a second electrode CAT. The first electrode AND may be disposed on the first semiconductor layer SEMI1 and may be electrically connected to the first semiconductor layer SEMI1. The second electrode CAT may be disposed on the exposed second semiconductor layer SEMI2 and may be electrically connected to the second semiconductor layer SEMI2.

The first electrode AND and the second electrode CAT may be spaced apart from each other by a predetermined distance. The first electrode AND and the second electrode CAT may include an oxide-based transparent conductive material, such as titanium dioxide (TiO2), aluminum zinc oxide (AZO), zinc oxide (ZnO), indium tin oxide (ITO), gallium zinc oxide (GZO), indium zinc oxide (IZO), and the like, or include PEDOT(poly(3,4-ethylenedioxythiophene)):PSS(poly(styrenesulfonate))-based conductive material, graphene, metallic wire, and the like.

The first semiconductor layer SEMI1 may be implemented as a p-type semiconductor layer. The first semiconductor layer SEMI1 may be implemented with a semiconductor compound, for example, a compound semiconductor such as group II-IV and group III-V. The first semiconductor layer SEMI1 may include a single layer or multiple layers. The first semiconductor layer SEMI1 may include a semiconductor material having a composition formula of $In_xAl_yGa_{1-x-y}N$ ($0 \le x \le 1$, $0 \le y \le 1$, $0 \le x+y \le 1$), but embodiments of the present disclosure are not limited thereto. For example, the first semiconductor layer SEMI1 may include one or more materials selected from GaN, AlN, AlGaN, InN, InAlGaN, AlInN, AlGaAs, GaP, GaAs, GaAsP, AlGaInP, and the like, and a p-type dopant such as Mg, Zn, Ca, Sr, Ba, and the like may be doped to the selected one or more materials.

The second semiconductor layer SEMI2 may be implemented as an n-type semiconductor layer. The second semiconductor layer SEMI2 may be implemented with a semiconductor compound, for example, a compound semiconductor such as group II-IV and group III-V. The second semiconductor layer SEMI2 may include a single layer or multiple layers. The second semiconductor layer SEMI2 may include a semiconductor material having a composition formula of $In_xAl_yGa_{1-x-y}N$ ($0 \le x \le 1$, $0 \le y \le 1$, $0 \le x+y \le 1$), but embodiments of the present disclosure are not limited thereto. For example, the second semiconductor layer SEMI2 may include one or more materials selected from GaN, AlN, AlGaN, InN, InAlGaN, AlInN, AlGaAs, GaP, GaAs, GaAsP, AlGaInP, and the like, and a n-type dopant such as Si, Ge, Sn, Se, Te, and the like may be doped to the selected one or more materials.

The active layer AL may be a layer from which light emits by a band gap (or an energy difference) between energy bands according to materials included in the active layer AL while holes injected through the first semiconductor layer SEMI1 and electrons injected through the second semiconductor layer SEMI2 meet each other. The active layer AL may selectively include a single quantum well (SQW), multi quantum well (MQW), quantum wire structure, or quantum dot structure. The active layer AL may include a compound semiconductor. For example, the active layer AL may be implemented with at least one of group II-IV and group III-V compound semiconductors.

The light emitting diode LED may further include an insulating layer PRT for protecting elements of the light emitting diode LED. The insulating layer PRT may expose at least a portion of the first electrode AND and at least a portion of the second electrode CAT, while covering exposed outer surfaces of the light emitting diode LED. The insulating layer PRT may include an insulating material. For example, the insulating layer PRT may include any one selected from, or a stacked structure of one or more of, a silicon oxide layer (SiOx) and a silicon nitride layer (SiNx).

In one or more embodiments, the first electrode AND of the light emitting diode LED may be electrically connected to the pixel electrode PXL, and the second electrode CAT of the light emitting diode LED may be electrically connected to the common electrode COM.

First and second planarization layers PAC1 and PAC2 may be disposed on one or more side surfaces and disposed on, or one or more upper portions of, the light emitting diode LED.

The pixel electrode PXL and the common electrode COM may be disposed on the second planarization layer PAC2. For example, the pixel electrode PXL and the common electrode COM may include a transparent electrode material. For example, the pixel electrode PXL and the common electrode COM may include a transparent conductive oxide. For example, the transparent conductive oxide (TCO) may include one or more of indium zinc oxide (IZO), indium tin oxide (ITO), indium-gallium-zinc oxide (IGZO), Indium gallium zinc tin oxide (IGZTO), zinc oxide (ZnO), aluminum-doped zinc oxide (AZO), gallium-doped zinc oxide (GZO), antimony tin oxide (ATO), fluorine-doped transparent oxide (FTO), and the like.

The pixel electrode PXL may be electrically connected to the first electrode AND of the light emitting diode LED through a hole in the second planarization layer PAC2. The common electrode COM may be electrically connected to the second electrode CAT of the light emitting diode LED through another hole of the second planarization layer PAC2.

In addition, the pixel electrode PXL may be connected to the relay electrode RE through through-holes of the second planarization layer PAC2, the first planarization layer PAC1, the support layer INS, and the third passivation layer PAS3. Accordingly, the pixel electrode PXL may be electrically connected to the source electrode S of the driving transistor DRT through the relay electrode RE.

A third planarization layer PAC3 may be disposed on the pixel electrode PXL and the common electrode COM.

Each of the first, second, and third planarization layers (PAC1, PAC2, and PAC3) may include a single layer or a multilayer, and may be an organic layer. For example, each of the first, second, and third planarization layers (PAC1, PAC2, and PAC3) may include benzocyclobutene or an acryl-based organic material, but embodiments of the present disclosure are not limited thereto.

Next, a stack structure in an area in which a touch sensor electrode TSE included in a touch sensor TS is disposed will be discussed.

The example of FIG. 9 can be characterized by a structure in which the stack structure of the display circuit area DISP as discussed above is utilized substantially equally for the stack structure in the area in which the touch sensor electrode TSE is disposed.

The touch sensor TS may include a plurality of touch sensor electrodes TSE electrically connected to each other. The touch sensor electrodes TSE included in the touch sensor TS may include the same conductive material as the pixel electrode PXL. That is, the touch sensor electrode TSE and the pixel electrode PXL may be formed by the same conductive material layer. Specifically, the touch sensor electrode TSE and the pixel electrode PXL may be formed simultaneously by patterning one conductive material layer. It should be understood that in the present disclosure, at least one layer (for example, a pixel electrode, a relay electrode) in a stack structure of the display circuit area DISP and at least one layer (for example, a touch sensor electrode, a vertical connection line, a horizontal connection line, a touch routing line) in a stack structure of a touch sensor area may be formed by the same conductive material layer. Accordingly, it may simplify the manufacturing process by configuring a touch sensor structure using layers used in a display circuit area.

A touch routing line TR or a vertical connection line CL_V connected to the touch sensor electrode TSE may include the same conductive material as the relay electrode RE, which is a reflector.

A touch pad PAD included in a pad unit PU may include the same conductive material as the source electrode S and the drain electrode D.

The touch pad PAD may be located on the display substrate SUB, and, for example, may be disposed on the second interlayer insulating layer ILD2.

The touch routing line TR or the vertical connection line CL_V may be disposed on the second passivation layer PAS2 and connected to the touch pad PAD through a hole in the second passivation layer PAS2. Accordingly, the touch sensor electrode TSE included in the touch sensor TS and the touch pad PAD may be electrically connected through the touch routing line TR.

For example, the touch routing line TR or the vertical connection line CL_V connected to the touch sensor electrode TSE may include the same conductive material as the relay electrode RE.

In another example, the touch routing line TR or the vertical connection line CL_V connected to the touch sensor electrode TSE may include the same conductive material as the source electrode S or the drain electrode D, include the same conductive material as an electrode between the source electrode S or the drain electrode D and the active layer ACT, or include the same conductive material as an electrode under the active layer ACT.

The touch sensor electrode TSE may be electrically connected to the touch routing line TR or the vertical connection line CL_V through through-holes of the first and second planarization layers (PAC1 and PAC2), the support layer INS, and the third passivation layer PAS3.

A bank layer BM may be disposed on the touch sensor electrode TSE, and the third planarization layer PAC3 may be disposed on the bank layer BM. The bank layer BM may define a light emitting area or serve as a black matrix.

Figure 10:
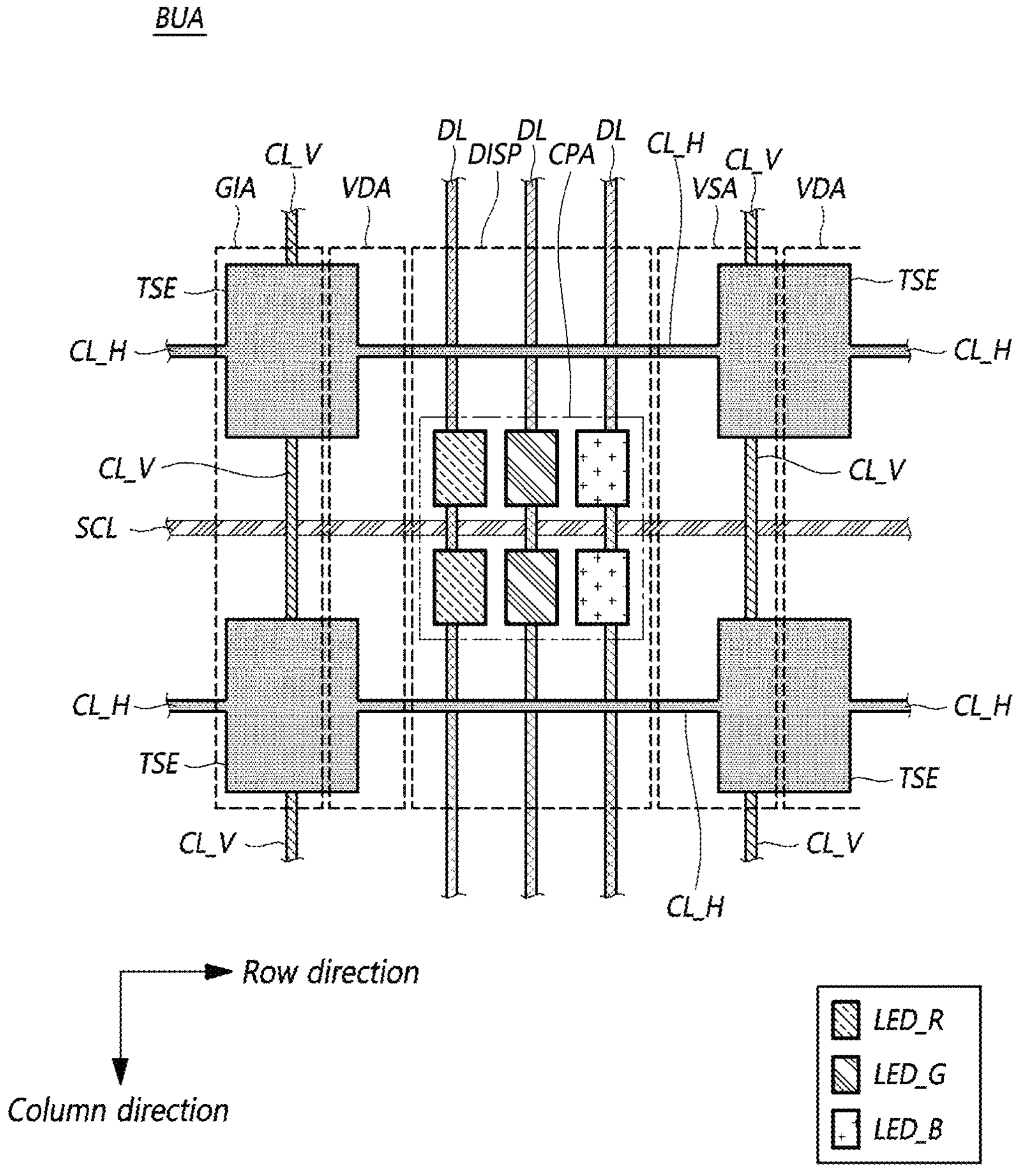
FIG. 10 illustrates an example subpixel arrangement in the basic unit area of the touch display panel according to aspects of the present disclosure.

FIG. 10 illustrates an example subpixel arrangement in a basic unit area of the touch display panel 110 included in the touch sensor embedded light emitting diode display device 100 according to aspects of the present disclosure.

With reference to FIG. 10, a core pixel area CPA may include at least one red light emitting diode LED_R emitting red light, at least one green light emitting diode LED_G emitting green light, and at least one blue light emitting diode LED_B emitting blue light. Accordingly, in this implementation, white light can be emitted from the core pixel area CPA. The light emitting diode LED of FIG. 9 may be one of a red light emitting diode LED_R, a green light emitting diode LED_G, and a blue light emitting diode LED_B.

For example, in preparation for failure or damage of the light emitting diode LED, as shown in FIG. 10, one core pixel area CPA may include two or more red light emitting diodes LED_R, two or more green light emitting diodes LED_G, and two or more blue light emitting diodes LED_B.

Even if two or more red light emitting diodes LED_R, two or more green light emitting diodes LED_G, and two or more blue light emitting diodes LED_B are included in one core pixel area CPA, one subpixel driving circuit (a circuit including a DRT, a SCT, and a Cst) can drive two or more red light emitting diodes LED_R, one subpixel driving circuit (a circuit including a DRT, a SCT, and a Cst) can drive two or more green light emitting diodes LED_G, and one subpixel driving circuit (a circuit including a DRT, a SCT, and a Cst) can drive two or more blue light emitting diodes LED_B.

In this implementation, three data lines DL may be disposed in the column direction and one scan line SCL may be disposed in the row direction in the display circuit area DISP.

Figure 11:
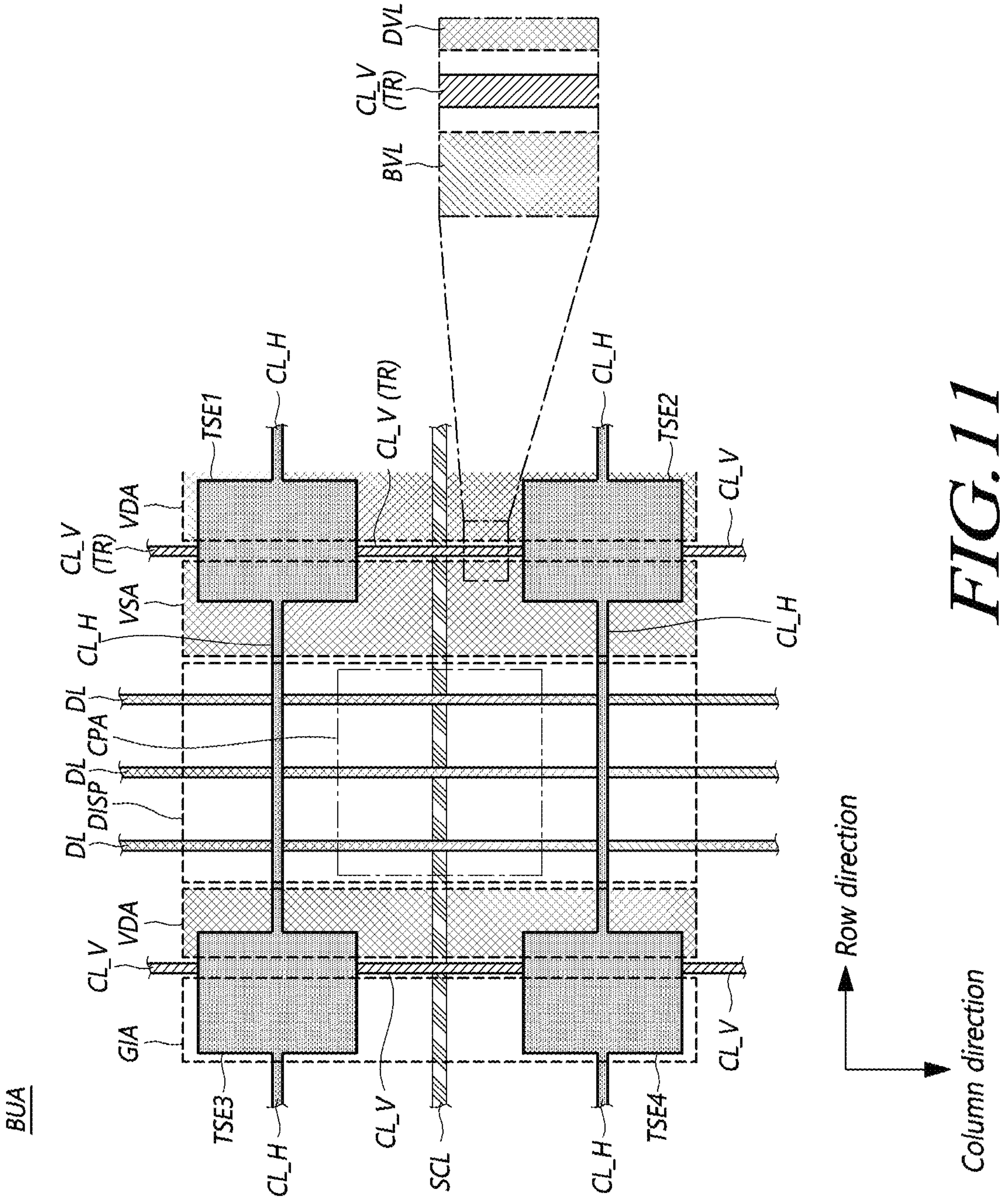
FIGS. 11 and 12 illustrate example planar structures of the touch display panel according to aspects of the present disclosure.

FIG. 11 illustrates an example planar structure of the touch display panel 110 included in the touch sensor embedded light emitting diode display device 100 according to aspects of the present disclosure.

With reference to FIG. 11, four touch sensor electrodes TSE disposed in a basic unit area BUA may include a first touch sensor electrode TSE1 in an upper right portion, a second touch sensor electrode TSE2 in a lower right portion, a third touch sensor electrode TSE3 in an upper left portion, and a fourth touch sensor electrode TSE4 in a lower left portion.

The second touch sensor electrode TSE2 may be disposed adjacent to the first touch sensor electrode TSE1 in the column direction. The third touch sensor electrode TSE3 may be disposed adjacent to the first touch sensor electrode TSE1 in the row direction. The fourth touch sensor electrode TSE4 may be disposed adjacent to the third touch sensor electrode TSE3 in the column direction.

In the basic unit area BUA, a first power line DVL may be disposed in a first power supply area VDA, and a second power line BVL may be disposed in a second power supply area VSA.

The touch display panel 110 may include at least one column line electrically connected to the first touch sensor electrode TSE1 and running in the column direction. For example, the column line may be a vertical connection line CL_V for electrically interconnecting the first touch sensor electrode TSE1 and the second touch sensor electrode TSE2, or a touch routing line TR for electrically connecting the first touch sensor electrode TSE1 to the touch driving circuit 160.

For example, the column line electrically connected to the first touch sensor electrode TSE1 and disposed in the column direction may be disposed between the first power line DVL and the second power line BVL.

The vertical connection line CL_V or the touch routing line TR may be disposed between the first power line DVL and the second power line BVL to which a positive voltage is applied. Accordingly, an influence of the vertical connection line CL_V or the touch routing line TR on circuit elements (e.g., a light emitting diode, one or more transistors, and the like), one or more electrodes (e.g., a pixel electrode), or one or more lines (e.g., a data line), which are disposed in the display circuit area DISP, can be reduced.

In other words, touch-related signals applied to the vertical connection line CL_V or the touch routing line TR may act as a type of noise on circuit elements (e.g., a light emitting diode, one or more transistors, and the like), one or more electrodes (e.g., a pixel electrode), or one or more lines (e.g., a data line), which are disposed in the display circuit area DISP. Since the vertical connection line CL_V or the touch routing line TR is disposed between the first power line DVL and the second power line BVL to which a positive voltage is applied, touch-related signals applied to the vertical connection line CL_V or the touch routing line TR can be reduced or blocked from being transferred to circuit elements (e.g., a light emitting diode, one or more transistors, and the like), one or more electrodes (e.g., a pixel electrode), or one or more lines (e.g., a data line), which are disposed in the display circuit area DISP. Accordingly, undesirable noise in circuit elements (e.g., light emitting diodes, transistors, etc.), electrodes (e.g., pixel electrodes), or lines (e.g., data lines) disposed in the display circuit area DISP can be reduced.

Figure 12:
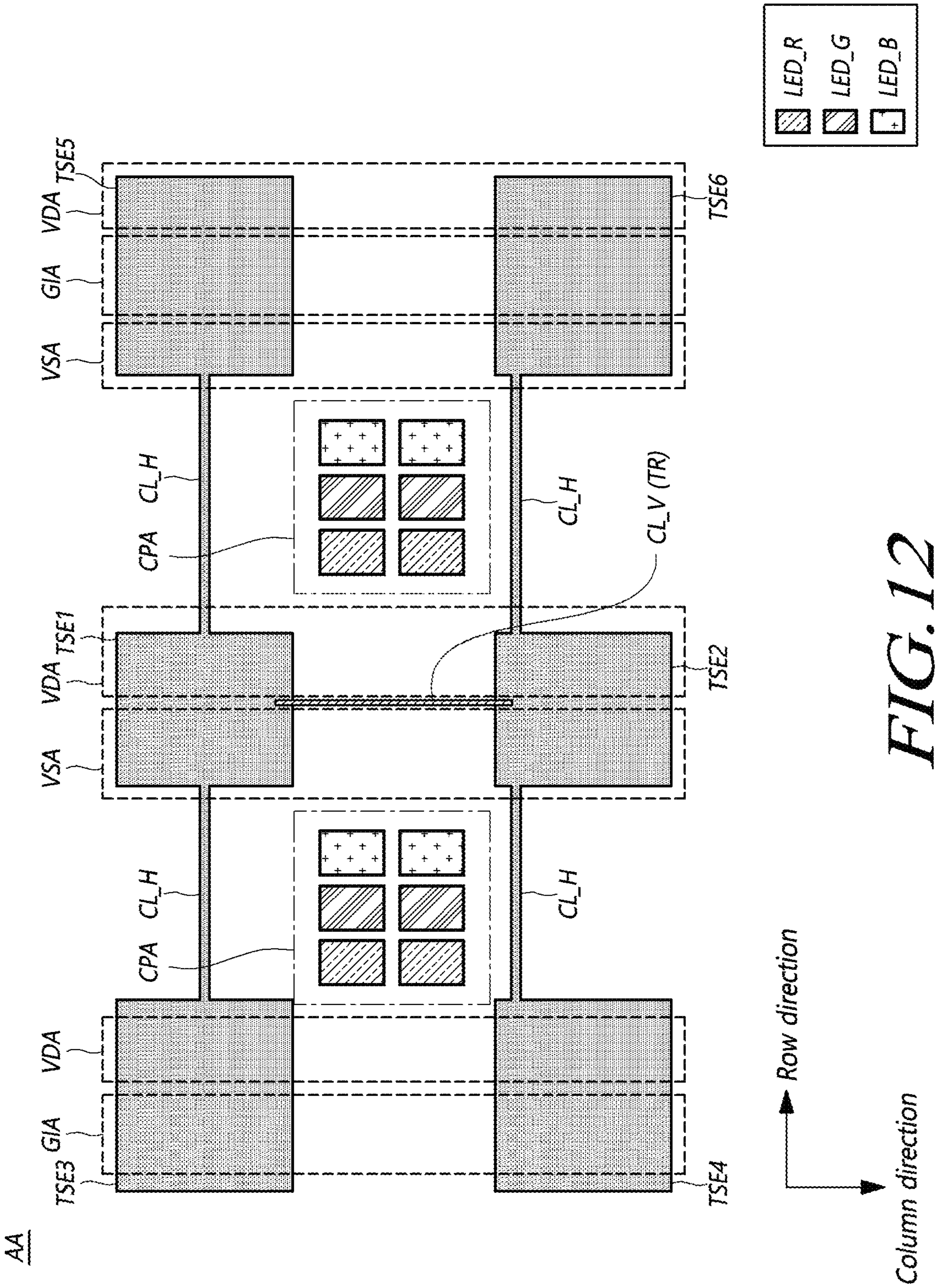

FIG. 12 illustrates an example planer structure of the touch display panel 110 included in the touch sensor embedded light emitting diode display device 100 according to aspects of the present disclosure. FIG. 12 shows a plan view of a larger area in comparison with an area shown in FIG. 11.

With reference to FIG. 12, first to sixth touch sensor electrodes (TSE1, TSE2, TSE3, TSE4, TSE5, and TSE6) may be disposed in an area of the active area AA.

The third touch sensor electrode TSE3, the first touch sensor electrode TSE1, and the fifth touch sensor electrode TSE5 may be disposed adjacent to each other in the row direction.

The third touch sensor electrode TSE3 and the first touch sensor electrode TSE1 may be connected through a horizontal connection line CL_H, and the first touch sensor electrode TSE1 and the fifth touch sensor electrode TSE5 may be connected through another horizontal connection line CL_H.

The fourth touch sensor electrode TSE4, the second touch sensor electrode TSE2, and the sixth touch sensor electrode TSE6 may be disposed adjacent to each other in the row direction.

The fourth touch sensor electrode TSE4 and the second touch sensor electrode TSE2 may be connected through further another horizontal connection line CL_H, and the second touch sensor electrode TSE2 and the sixth touch sensor electrode TSE6 may be connected through yet another horizontal connection line CL_H.

The third touch sensor electrode TSE3 and the fourth touch sensor electrode TSE4 may be disposed adjacent to each other in the column direction, the first touch sensor electrode TSE1 and the second touch sensor electrode TSE2 may be disposed adjacent to each other in the column direction, and the fifth touch sensor electrode TSE5 and the sixth touch sensor electrode TSE6 may be disposed adjacent to each other in the column direction.

The first touch sensor electrode TSE1 and the second touch sensor electrode TSE2 may be connected by a vertical connection line CL_V.

The first to sixth touch sensor electrodes (TSE1, TSE2, TSE3, TSE4, TSE5, and TSE6) may include the same conductive material as the pixel electrode PXL.

The horizontal connection line CL_H may include the same conductive material as the pixel electrode PXL. The vertical connection line CL_V may include the same conductive material as the relay electrode RE, which is a reflector, may include the same conductive material (a source-drain material) as the source electrode S and the drain electrode D, or may include another conductive material located in a lower layer than a layer in which the source-drain material is disposed.

Figure 13:
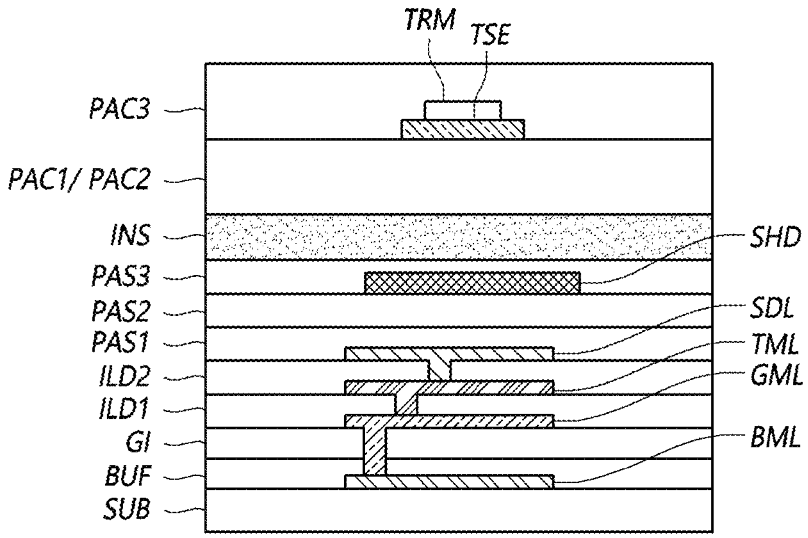
FIGS. 13 and 14 illustrate example shield structures of the touch display panel according to aspects of the present disclosure.
Figure 14:
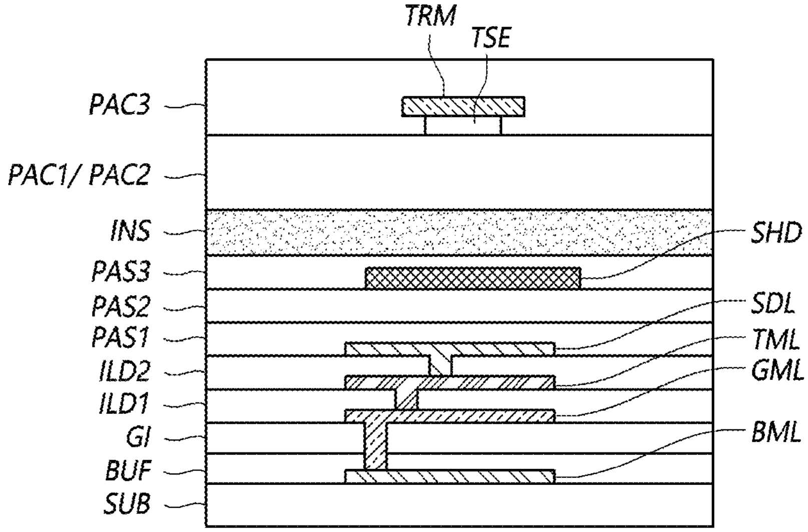
Figure 15:
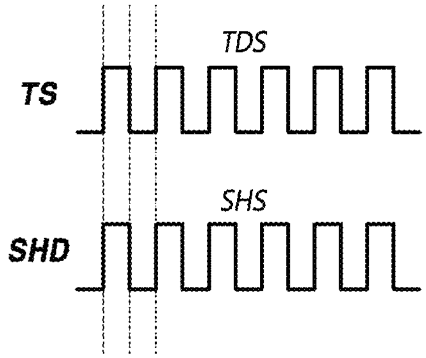
FIG. 15 illustrates example shield driving of the touch sensor embedded light emitting diode display device according to aspects of the present disclosure.

FIGS. 13 and 14 illustrate example shield structures of the touch display panel 110 included in the touch sensor embedded light emitting diode display device 100 according to aspects of the present disclosure. FIG. 15 illustrates example shield driving of the touch sensor embedded light emitting diode display device 100 according to aspects of the present disclosure.

With reference to FIGS. 13 and 14, the touch display panel 110 may further include a shield SHD disposed under a touch sensor electrode TSE. The shield SHD may include the same conductive material as the relay electrode RE. That is, the shield SHD may be disposed in the same conductive material layer as the relay electrode RE, which functions as a reflector.

With reference to FIGS. 13 and 14, in the touch display panel 110, an organic layer may be disposed between the touch sensor electrode TSE and the shield SHD. For example, the organic layer may include a first planarization layer PAC1 and a second planarization layer PAC2.

With reference to FIGS. 13 and 14, metal may be additionally deposited before and/or after a pixel electrode material layer in which a pixel electrode PXL corresponding to a transparent electrode material is formed is deposited to be used as a touch sensor electrode TSE and a touch routing metal TRM. The respective locations of the touch sensor electrode TSE and the touch routing metal TRM in FIGS. 13 and 14 may be changed according to design considerations.

With reference to FIGS. 13 and 14, a source-drain material layer SDL between a first passivation layer PAS1 and a second interlayer insulating layer ILD2, an additional metal layer TML between the second interlayer insulating layer ILD2 and a first interlayer insulating layer ILD1, a gate material layer GML between the first interlayer insulating layer ILD1 and a gate insulating layer GI, and a lower shield metal layer BML between the display substrate SUB and a buffer layer BUF may be disposed under the shield SHD disposed between a second passivation layer PAS2 and a third passivation layer PAS3.

With reference to FIGS. 13 and 14, a first power line DVL and a second power line BVL may be disposed in the source-drain material layer SDL. In this implementation, since the shield SHD is disposed between the first power line DVL and the touch sensor electrode TSE, undesirable electrical influence between the first power line DVL and the touch sensor electrode TSE can be reduced. Further, since the shield SHD is disposed between the second power line BVL and the touch sensor electrode TSE, undesirable electrical influence between the second power line BVL and the touch sensor electrode TSE can be reduced.

With reference to FIG. 15, when a touch driving signal TDS whose voltage level is varied is applied to the touch sensor electrode TSE, a shield driving signal SHS whose amplitude or phase corresponds to the touch driving signal TDS can be applied to the shield SHD. Accordingly, when the touch driving signal TDS whose voltage level is varied is applied to the touch sensor electrode TSE, an electric potential difference between the touch sensor electrode TSE and the shield SHD can be maintained constant. Due to this, parasitic capacitance may be prevented or reduced from being formed across the touch sensor electrode TSE. Further, a variance in capacitance due to thermal drift in at least one organic layers (e.g., PAC1 and/or PAC2) may not affect touch sensing performance.

Figure 16:
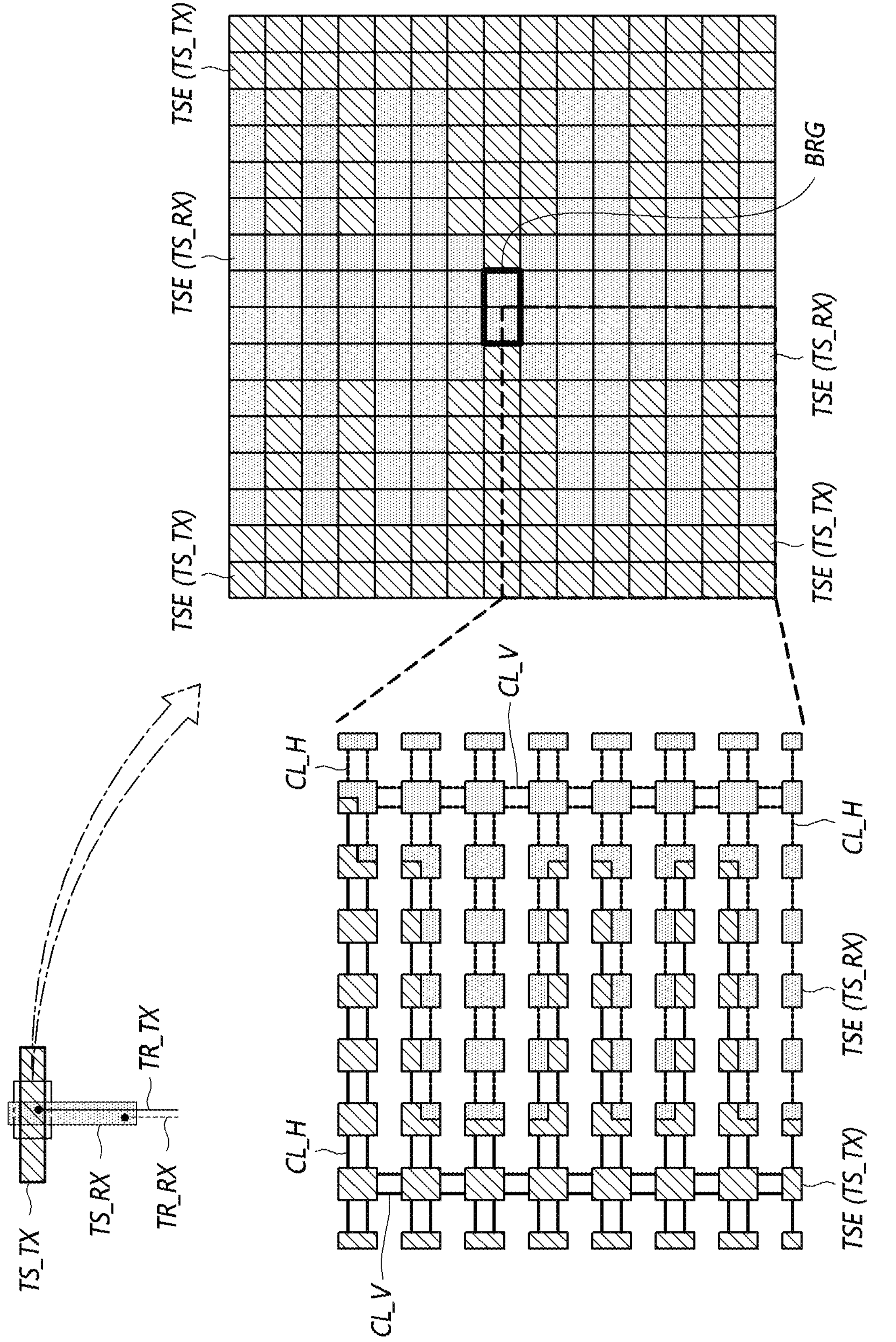
FIG. 16 illustrates an example comb pattern of a touch sensor in the touch display panel according to aspects of the present disclosure.

FIG. 16 illustrates an example comb pattern of a touch sensor in the touch display panel 110 included in the touch sensor embedded light emitting diode display device 100 according to aspects of the present disclosure.

With reference to FIG. 16, when a touch sensor unit based on the mutual-capacitance sensing is applied, the touch sensor unit may include at least one transmission touch sensor TS_TX and at least one reception touch sensor TS_RX, which intersect each other, and may further include at least one transmission touch routing line TR_TX connected to the at least one transmission touch sensor TS_TX and at least one reception touch routing line TR_RX connected to the at least one reception touch sensor TS_RX.

The transmission touch sensor TS_TX may include a plurality of touch sensor electrodes TSE electrically connected to each other by a horizontal connection line CL_H and a vertical connection line CL_V. The reception touch sensor TS_RX may include a plurality of touch sensor electrodes TSE electrically connected to each other by a horizontal connection line CL_H and a vertical connection line CL_V.

With reference to FIG. 16, in an area CR where the transmission touch sensor TS_TX and the reception touch sensor TS_RX intersect, the plurality of touch sensor electrodes TSE included in the reception touch sensor TS_RX and arranged in the column direction may be connected by one or more vertical connection lines CL_V.

With reference to FIG. 16, in an area CR where the transmission touch sensor TS_TX and the reception touch sensor TS_RX intersect, the plurality of touch sensor electrodes TSE included in the transmission touch sensor TS_TX and arranged in the row direction may be electrically connected by one or more bridges BRG.

The bridge BRG may include the same conductive material as the vertical connection line CL_V or the touch routing lines (TR_TX and/or TR_RX).

A boundary line between the plurality of touch sensor electrodes TSE included in the transmission touch sensor TS_TX and the plurality of touch sensor electrodes TSE included in the reception touch sensor TS_RX may not be a straight line but a non-straight line having one or more portions in which the boundary line moves left and/or right. The structure of such a boundary line disposed in a touch sensor TS may be referred to as having a comb pattern.

Figure 17:
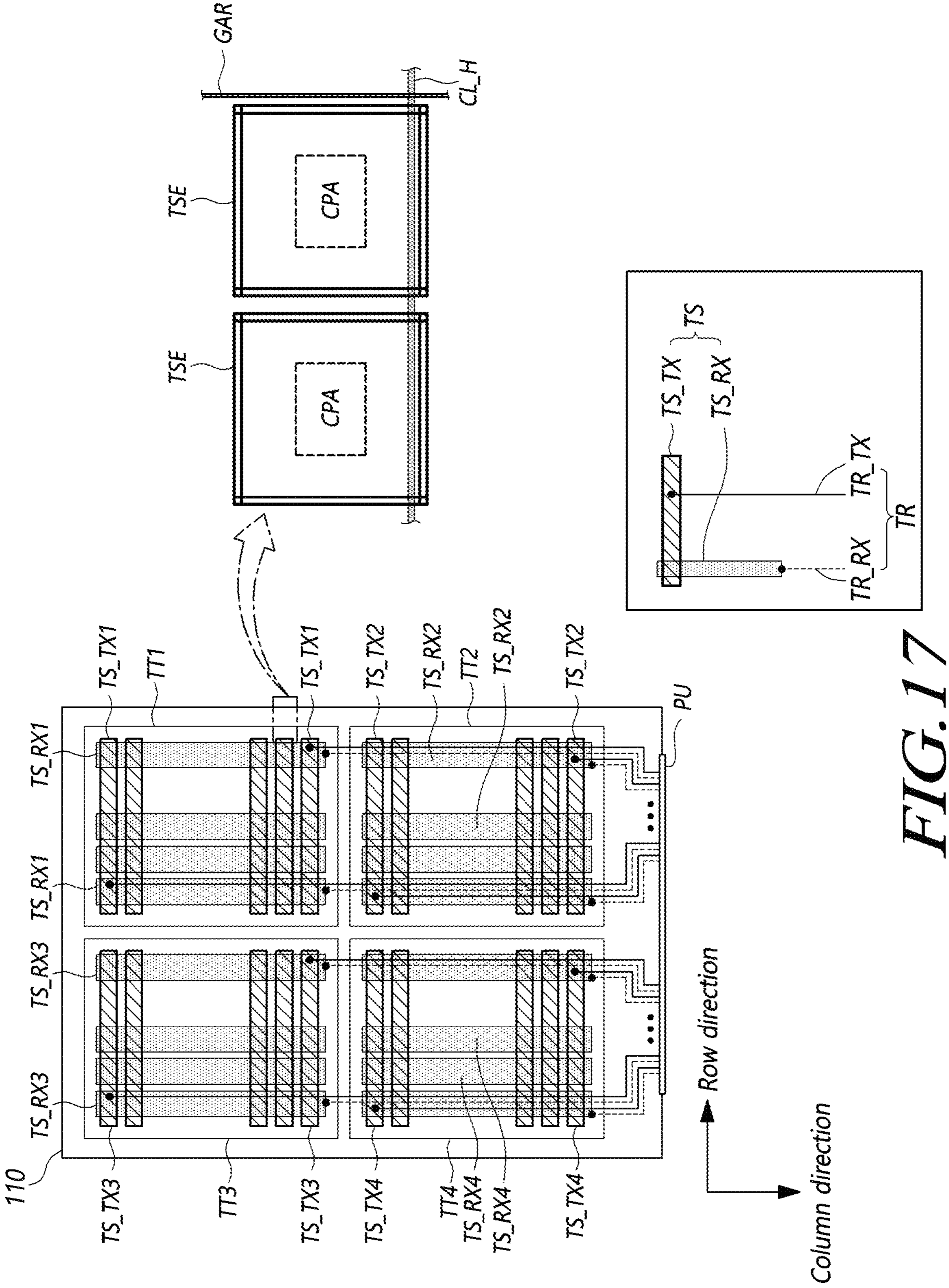
FIG. 17 illustrates an example planar structure of the touch display panel according to aspects of the present disclosure.
Figure 18:
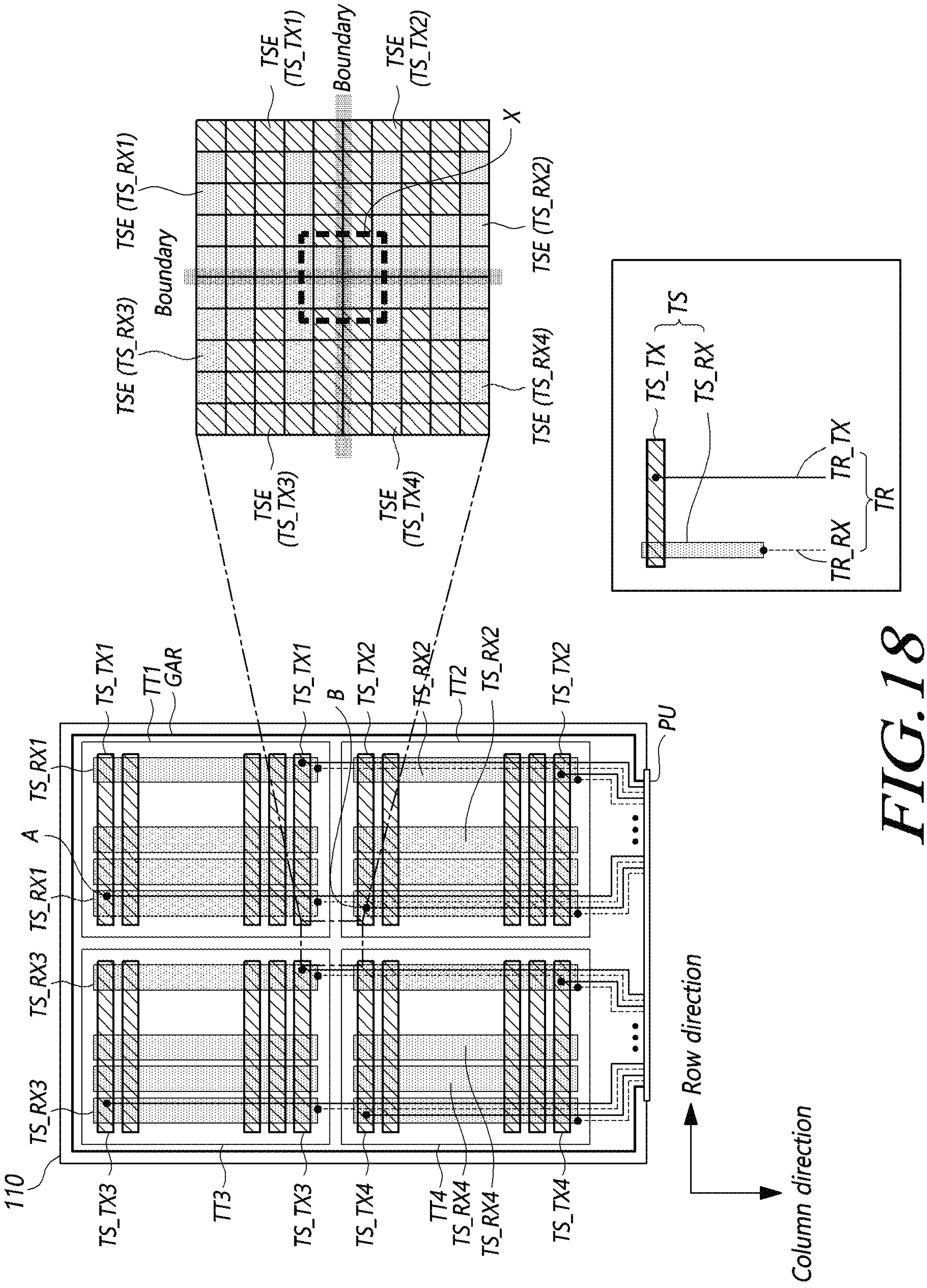
FIGS. 18 and 19 illustrate other example planar structures of the touch display panel according to aspects of the present disclosure.
Figure 19:
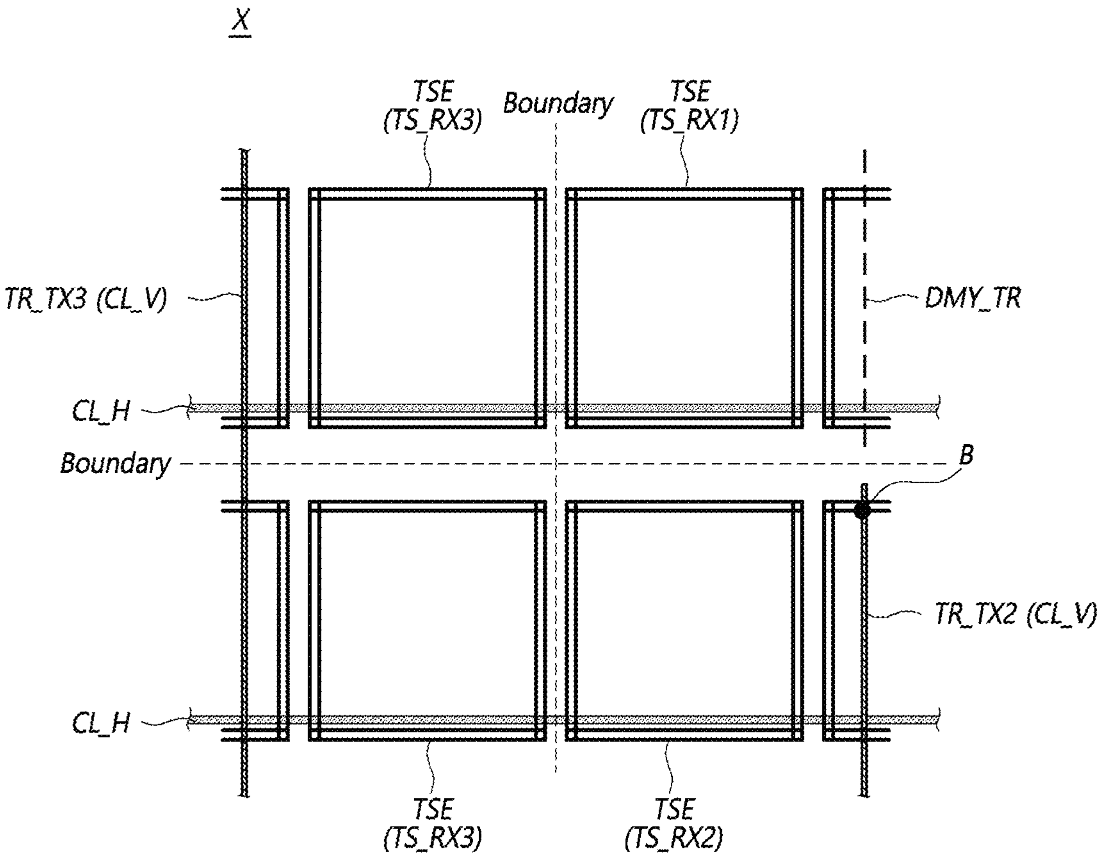

FIG. 17 illustrates an example planar structure of the touch display panel 110 included in the touch sensor embedded light emitting diode display device 100 according to aspects of the present disclosure. FIG. 18 illustrates another example planar structure of the touch display panel 110 included in the touch sensor embedded light emitting diode display device 100 according to aspects of the present disclosure. FIG. 19 is an enlarged view of an X area of FIG. 18.

With reference to FIGS. 17 and 18, a touch sensor unit included in the touch display panel 110 may be classified into two or more touch tiles (TT1, TT2, TT3, and/or TT4).

Each of the plurality of touch tiles (TT1, TT2, TT3, and/or TT4) is an area that can be independently driven and sensed, and may also be referred to as a sub-touch sensor unit or a sub-touch sensing area.

In one or more embodiments, the touch driving circuit 160 may be configured in one readout integrated circuit (Readout IC), or may be configured in two or more readout integrated circuits (Readout IC) according to design considerations. Considering such implementations, the plurality of touch tiles (TT1, TT2, TT3, and/or TT4) may be driven and sensed by one readout integrated circuit, or may be driven and sensed by different readout integrated circuits.

FIGS. 17 and 18 illustrate an example in which the touch sensor unit included in the touch display panel 110 is classified into four touch tiles (TT1, TT2, TT3, and/or TT4). Thus, discussions are provided based on the touch sensor unit included in the touch display panel 110 classified into four touch tiles (TT1, TT2, TT3, and/or TT4) with reference to FIGS. 17 and 18.

Among the four touch tiles (TT1, TT2, TT3, and/or TT4), a first touch tile TT1 may include a plurality of first touch sensors (TS_TX1 and TS_RX1). A second touch tile TT2 may be adjacent to the first touch tile TT1 in the column direction and may include a plurality of second touch sensors (TS_TX2 and TS_RX2). A third touch tile TT3 may be adjacent to the first touch tile TT1 in the row direction and may include a plurality of third touch sensors (TS_TX3 and TS_RX3). A fourth touch tile TT4 may be adjacent to the third touch tile TT3 in the column direction and may include a plurality of fourth touch sensors (TS_TX4 and TS_RX4).

The plurality of first touch sensors (TS_TX1 and TS_RX1) may include a plurality of first transmission touch sensors TS_TX1 and a plurality of first reception touch sensors TS_RX1. The plurality of second touch sensors (TS_TX2 and TS_RX2) may include a plurality of second transmission touch sensors TS_TX2 and a plurality of second reception touch sensors TS_RX2. The plurality of third touch sensors (TS_TX3 and TS_RX3) may include a plurality of third transmission touch sensors TS_TX3 and a plurality of third reception touch sensors TS_RX3. The plurality of fourth touch sensors (TS_TX4 and TS_RX4) may include a plurality of fourth transmission touch sensors TS_TX4 and a plurality of fourth reception touch sensors TS_RX4.

The pluralities of first to fourth transmission touch sensors (TS_TX1, TS_TX2, TS_TX3, and TS_TX4) may intersect the pluralities of first to fourth reception touch sensors (TS_RX1, TS_RX2, TS_RX3, and TS_RX4). Each of the pluralities of first to fourth transmission touch sensors (TS_TX1, TS_TX2, TS_TX3, and TS_TX4) may be disposed to extend in the row direction (or the column direction). Each of the pluralities of first to fourth reception touch sensors (TS_RX1, TS_RX2, TS_RX3, and TS_RX4) may be disposed to extend in the column direction (or the row direction).

With reference to FIGS. 17 and 18, the touch display panel 110 may include a plurality of first touch routing lines (TR_TX1 and TR_RX1) connected to the plurality of first touch sensors (TS_TX1 and TS_RX1), a plurality of second touch routing lines (TR_TX2 and TR_RX2) connected to the plurality of second touch sensors (TS_TX2 and TS_RX2), a plurality of third touch routing lines (TR_TX3 and TR_RX3) connected to the plurality of third touch sensors (TS_TX3 and TS_RX3), and a plurality of fourth touch routing lines (TR_TX4 and TR_RX4) connected to the plurality of fourth touch sensors (TS_TX4 and TS_RX4).

The plurality of first touch routing lines (TR_TX1 and TR_RX1) may include a plurality of first transmission touch routing lines TR_TX1 connected to the plurality of first transmission touch sensors TS_TX1 and a plurality of first reception touch routing lines TR_RX1 connected to the plurality of first reception touch sensors TS_RX1.

According to the internal routing structure, each of the plurality of first transmission touch routing lines TR_TX1 may extend in the column direction (or the row direction), and each of the plurality of first transmission touch routing lines TR_TX1 may overlap a corresponding first reception touch sensor TS_RX1 and a corresponding second reception touch sensor TS_RX2 in the column direction (or the row direction).

According to the internal routing structure, each of the plurality of first transmission touch routing lines TR_TX1 may intersect one or more first transmission touch sensors TS_TX1 and one or more second transmission touch sensors TS_TX2.

According to the internal routing structure, the plurality of first reception touch routing lines TR_RX1 may be disposed in parallel with the plurality of first transmission touch routing lines TR_TX1.

The plurality of second touch routing lines (TR_TX2 and TR_RX2) may include a plurality of second transmission touch routing lines TR_TX2 connected to the plurality of second transmission touch sensors TS_TX2 and a plurality of second reception touch routing lines TR_RX2 connected to the plurality of second reception touch sensors TS_RX2.

According to the internal routing structure, each of the plurality of second transmission touch routing lines TR_TX2 may extend in the column direction (or the row direction), and each of the plurality of second transmission touch routing lines TR_TX2 may overlap a corresponding second reception touch sensor TS_RX2 in the column direction (or the row direction).

According to the internal routing structure, each of the plurality of second transmission touch routing lines TR_TX2 may intersect one or more second transmission touch sensors TS_TX2.

According to the internal routing structure, the plurality of second reception touch routing lines TR_RX2 may be disposed in parallel with the plurality of second transmission touch routing lines TR_TX2.

The plurality of third touch routing lines (TR_TX3 and TR_RX3) may include a plurality of third transmission touch routing lines TR_TX3 connected to the plurality of third transmission touch sensors TS_TX3 and a plurality of third reception touch routing lines TR_RX3 connected to the plurality of third reception touch sensors TS_RX3.

According to the internal routing structure, each of the plurality of third transmission touch routing lines TR_TX3 may extend in the column direction (or the row direction), and each of the plurality of third transmission touch routing lines TR_TX3 may overlap a corresponding third reception touch sensor TS_RX3 and a corresponding fourth reception touch sensor TS_RX4 in the column direction (or the row direction).

According to the internal routing structure, each of the plurality of third transmission touch routing lines TR_TX3 may intersect one or more third transmission touch sensors TS_TX3 and one or more fourth transmission touch sensors TS_TX4.

According to the internal routing structure, the plurality of third reception touch routing lines TR_RX3 may be disposed in parallel with the plurality of third transmission touch routing lines TR_TX3.

The plurality of fourth touch routing lines (TR_TX4 and TR_RX4) may include a plurality of fourth transmission touch routing lines TR_TX4 connected to the plurality of fourth transmission touch sensors TS_TX4 and a plurality of fourth reception touch routing lines TR_RX4 connected to the plurality of fourth reception touch sensors TS_RX4.

According to the internal routing structure, each of the plurality of fourth transmission touch routing lines TR_TX4 may extend in the column direction (or the row direction), and each of the plurality of fourth transmission touch routing lines TR_TX4 may overlap a corresponding fourth reception touch sensor TS_RX4 in the column direction (or the row direction).

According to the internal routing structure, each of the plurality of fourth transmission touch routing lines TR_TX4 may intersect one or more fourth transmission touch sensors TS_TX4.

According to the internal routing structure, the plurality of fourth reception touch routing lines TR_RX4 may be disposed in parallel with the plurality of fourth transmission touch routing lines TR_TX4.

All of the pluralities of first to fourth transmission touch routing lines (TS_TX1, TS_TX2, TS_TX3, and TS_TX4) and the pluralities of first to fourth reception touch routing lines (TS_RX1, TS_RX2, TS_RX3, and TS_RX4) may be disposed in parallel to each other in the column direction (or the row direction).

The touch display panel 110 may include a pad unit PU positioned in the column direction from the second touch tile TT2 and the fourth touch tile TT4.

The pad unit PU may be connected to the plurality of first touch routing lines (TR_TX1 and TR_RX1), the plurality of second touch routing lines (TR_TX2 and TR_RX2), the plurality of third touch routing lines (TR_TX3 and TR_RX3), and the plurality of fourth touch routing lines (TR_TX4, TR_RX4).

The plurality of first touch routing lines (TR_TX1 and TR_RX1) may electrically interconnect the plurality of first touch sensors (TS_TX1 and TS_RX1) and the pad unit PU. The plurality of second touch routing lines (TR_TX2 and TR_RX2) may electrically interconnect the plurality of second touch sensors (TS_TX2 and TS_RX2) and the pad unit PU. The plurality of third touch routing lines (TR_TX3 and TR_RX3) may electrically interconnect the plurality of third touch sensors (TS_TX3 and TS_RX3) and the pad unit PU. The plurality of fourth touch routing lines (TR_TX4 and TR_RX4) may electrically interconnect the plurality of fourth touch sensors (TS_TX4 and TS_RX4) and the pad unit PU.

With reference to FIGS. 17 and 18, according to the internal routing structure, the display substrate SUB may include an active area AA in which an image is displayed, and one or more signal lines TR may be disposed only in an area in which the pad unit PU is located among outer areas, or areas outside, of the active area AA.

With reference to FIG. 18, the touch display panel 110 may further include a guard pattern GAR disposed along an outer edge of the display substrate SUB. The guard pattern GAR may be disposed along one or more remaining areas except for an area in which the pad unit PU is located among areas outside, or outer areas, of the active area AA, and may have an open ring shape. For example, a constant DC voltage may be applied to the guard pattern GAR. The constant DC voltage may be, for example, a ground voltage.

With reference to FIG. 18, respective ends of extended portions of the plurality of touch routing lines TR electrically connected to the plurality of touch sensors TS disposed in the active area AA of the display substrate SUB may be disposed between opposing ends of the guard pattern GAR.

Since the touch display panel 110 according to aspects of the present disclosure has a structure in which a bezel area is not formed in three of four outer edges of the active area AA, noise affecting touch sensors TS can be shielded through the guard pattern GAR disposed outside of one or more outermost touch sensors TS. For example, the guard pattern GAR may include the same conductive material as the touch sensor electrode TSE.

The first to fourth transmission touch sensors (TS_TX1 to TS_TX4) may include the same conductive material (e.g., a pixel electrode material) as the pixel electrode PXL. The first to fourth reception touch sensors (TS_RX1 to TS_RX4) may include the same conductive material as the pixel electrode PXL.

The first to fourth transmission touch routing lines (TR_TX1 to TR_TX4) may include the same conductive material (e.g., a relay electrode material or a reflective electrode material) as the relay electrode RE. The first to fourth reception touch routing lines (TR_TX1 to TR_TX4) may include the same conductive material as the relay electrode RE.

Unlike this configuration, the first to fourth transmission touch routing lines (TR_TX1 to TR_TX4) and the first to fourth reception touch routing lines (TR_TX1 to TR_TX4) may include the same conductive material (e.g., a source-drain material) as the source electrode S and drain electrode D of the driving transistor DRT, or one or more other conductive material.

The touch sensor unit will be briefly described again below by expressing the row direction as the horizontal direction and the column direction as the vertical direction.

The touch display panel 110 according to aspects of the present disclosure may include a display substrate SUB, a first horizontal touch sensor (e.g., a first transmission touch sensor TS_TX1) disposed in the horizontal direction (the row direction), a first vertical touch sensor (e.g., a first reception touch sensor TS_RX1) intersecting the first horizontal touch sensor and disposed in the vertical direction, a first horizontal touch routing line (e.g., a first transmission touch routing line TR_TX1) connected to the first horizontal touch sensor, and a first vertical touch routing line (e.g., a first reception touch routing line TR_RX1) connected to the first vertical touch sensor.

According to the internal routing structure, the first horizontal touch routing line (e.g., the first transmission touch routing line TR_TX1) and the first vertical touch routing line (e.g., the first reception touch routing line TR_RX1) may be disposed in the vertical direction.

According to the internal routing structure, the first horizontal touch routing line (e.g., the first transmission touch routing line TR_TX1) may overlap the first vertical touch sensor (e.g., the first reception touch sensor TS_RX1) in the vertical direction.

In the touch display panel 110 according to aspects of the present disclosure, the display substrate SUB may include an active area AA where an image is displayed, and signal lines may not be disposed in the remaining one or more outer areas except for one outer area in which a pad unit is disposed among outer areas of the active area AA.

In the touch display panel 110 according to aspects of the present disclosure, each of the first horizontal touch sensor (e.g., the first transmission touch sensor TS_TX1) and the first vertical touch sensor (e.g., the first reception touch sensor TS_RX1) may include a first touch sensor electrode TSE, a second touch sensor electrode TSE, a third touch sensor electrode TSE, and a fourth touch sensor electrode TSE, which are electrically connected to each other.

The first touch sensor electrode TSE and the second touch sensor electrode TSE may be disposed adjacent to each other in the vertical direction, the first touch sensor electrode TSE and the third touch sensor electrode TSE may be disposed adjacent to each other in the horizontal direction, the third touch sensor electrode TSE and the fourth touch sensor electrode TSE may be disposed adjacent to each other in the vertical direction.

The first touch sensor electrode TSE, the second touch sensor electrode TSE, the third touch sensor electrode TSE, and the fourth touch sensor electrode TSE may include a transparent electrode material (e.g., a pixel electrode material).

The first touch sensor electrode TSE and the third touch sensor electrode TSE may be connected through a horizontal connection line CL_H including a transparent electrode material (e.g., the pixel electrode material).

The second touch sensor electrode TSE and the fourth touch sensor electrode TSE may be connected through a horizontal connection line CL_H including a transparent electrode material (e.g., the pixel electrode material).

The first touch sensor electrode TSE and the second touch sensor electrode TSE may be connected through a vertical connection line CL_V including a reflective electrode material (e.g., a relay electrode material).

The third touch sensor electrode TSE and the fourth touch sensor electrode TSE may be connected through a vertical connection line CL_V including a reflective electrode material (e.g., the relay electrode material).

One or more light emitting diodes LED and one or more driving transistors DRT may be disposed between a first touch sensor electrode TSE, a second touch sensor electrode TSE, a third touch sensor electrode TSE, and a fourth touch sensor electrode TSE.

A pixel electrode PXL may be connected to a first electrode AND of the light emitting diode LED and may include a transparent electrode material.

A common electrode COM may be connected to a second electrode CAT of the light emitting diode LED and may include a transparent electrode material.

A relay electrode RE may interconnect the pixel electrode PXL and the source electrode S or drain electrode D of the driving transistor, and may include a reflective electrode material.

With reference to FIG. 18, a first connection point A between the first transmission touch sensor TS_TX1 and the first transmission touch routing line TR_TX1 may be located farther away from the pad unit PU than a second connection point B between the second transmission touch sensor TS_TX2 and the second transmission touch routing line TR_TX2.

With reference to FIG. 18, the first transmission touch routing line TR_TX1 may be disposed only from the pad unit PU to the first connection point A, and the second transmission touch routing line TR_TX2 may be disposed only from the pad unit PU to the second connection point B.

With reference to FIG. 18, the length of the first transmission touch routing line TR_TX1 may be greater than that of the second transmission touch routing line TR_TX2.

As shown in FIG. 18, in the case of a single structure where the first transmission touch routing line TR_TX1 is disposed only from the pad unit PU to the first connection point A, and the second transmission touch routing line TR_TX2 is disposed only from the pad unit PU to the second connection point B, the load of the second transmission touch routing line TR_TX2 having a shorter length than the first transmission touch routing line TR_TX1 can be reduced.

However, in the case of the single structure, a situation where the length of the second transmission touch routing line TR_TX2 is shorter than the length of the first transmission touch routing line TR_TX1, that is, the presence of a difference in length between the touch routing lines, may cause an abnormal phenomena in which images are not normally displayed. This abnormal phenomenon of the displayed image may be referred to as a visibility issue.

As shown in FIG. 19, the touch display panel 110 according to aspects of the present disclosure may employ a dummy routing structure to address such a visibility issue.

With reference to FIG. 19, the touch display panel 110 according to aspects of the present disclosure may further include a dummy touch routing line DMY_TR extending from the second connection point B in a direction opposite to the pad unit PU.

With reference to FIG. 19, the dummy touch routing line DMY_TR may not be electrically connected to the second transmission touch sensor TS_TX2 and the second transmission touch routing line TR_TX2.

Figure 20:
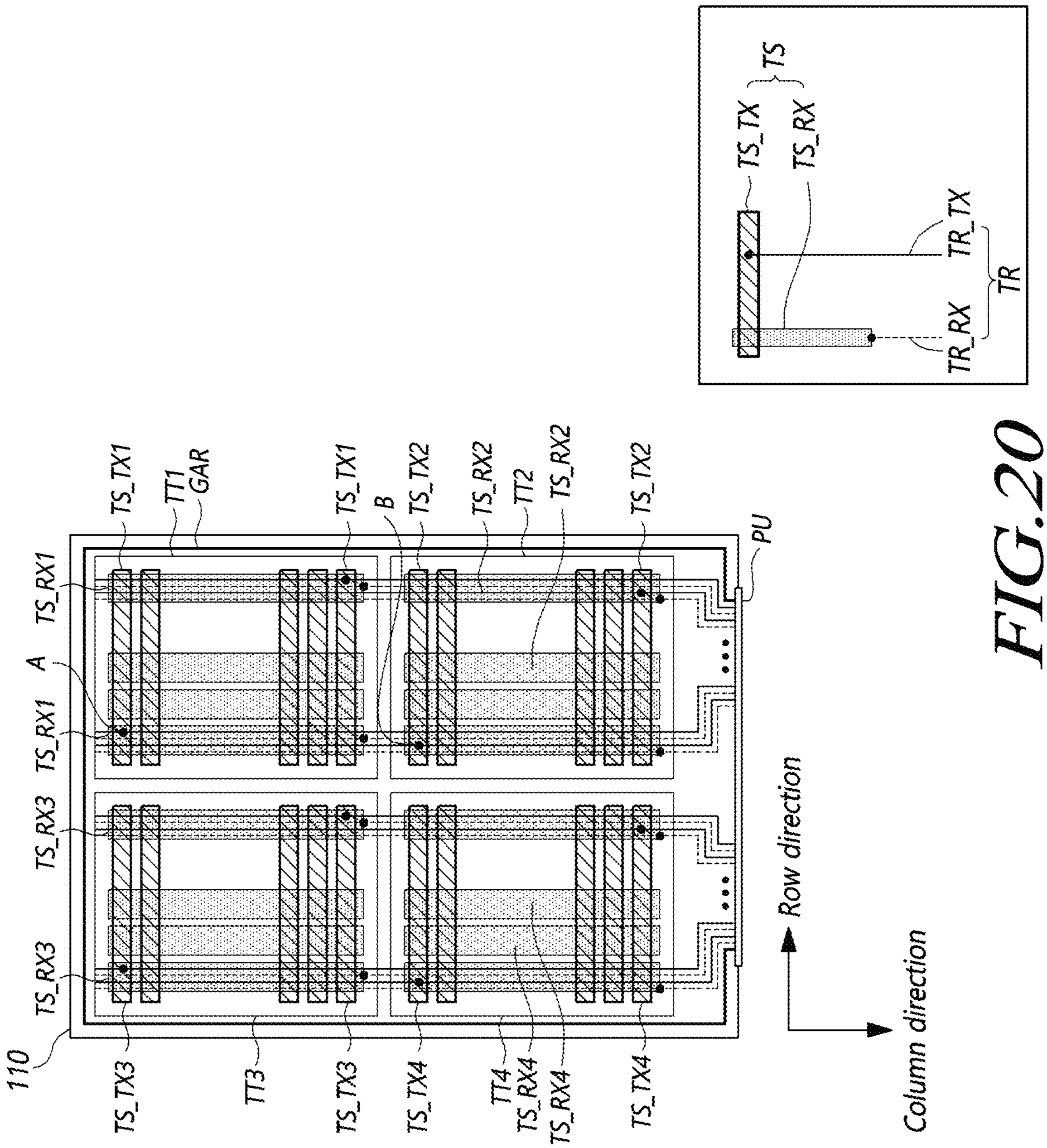
FIG. 20 illustrates another planar structure of the touch display panel included in the touch sensor embedded light emitting diode display device according to aspects of the present disclosure.

FIG. 20 illustrates another planar structure of the touch display panel 110 included in the touch sensor embedded light emitting diode display device 100 according to aspects of the present disclosure.

With reference to FIG. 20, in one or more embodiments, the touch display panel 110 according to aspects of the present disclosure may employ an extended structure different from the single structure shown in FIGS. 17 and 18.

With reference to FIG. 20, a first connection point A between the first transmission touch sensor TS_TX1 and the first transmission touch routing line TR_TX1 may be located farther away from the pad unit PU than a second connection point B between the second transmission touch sensor TS_TX2 and the second transmission touch routing line TR_TX2.

According to the extended structure, the length of the first transmission touch routing line TR_TX1 may be substantially, or nearly, the same as that of the second transmission touch routing line TR_TX2.

According to the extended structure, the first transmission touch routing line TR_TX1 may extend from the pad unit PU through the first connection point A to an end, or an any point, of the active area AA. The second transmission touch routing line TR_TX2 may extend from the pad unit PU through the second connection point B to an end, or an any point, of the active area AA.

According to this configuration, the second connection point B may be present between both ends of the second transmission touch routing line TR_TX2. The first connection point A may be present between both ends of the first transmission touch routing line TR_TX1.

According to the extended structure shown in FIG. 20, even though the load of the second transmission touch routing line TR_TX2 may slightly increase, since a difference in length between the second transmission touch routing line TR_TX2 and the first transmission touch routing line TR_TX1 can be reduced or eliminated, the visibility issue can be reduced or eliminated.

As described above, the touch display panel 110 according to aspects of the present disclosure may be a display panel that includes subpixels SP based on light emitting diodes LED and includes a touch sensor unit embedded therein.

The touch display panel 110 according to aspects of the present disclosure may be a display panel in which allocation of a separate bezel area or a wider bezel area is not desirable or facilitative. Accordingly, the touch display panel 110 according to aspects of the present disclosure may include a bezel-free structure in three sides of the active area AA by allowing the gate driving circuit 130 to be disposed in the active area AA and designing an internal routing structure.

In the touch display panel 110 according to aspects of the present disclosure, since the touch sensor unit can be designed with multi-metal, that is, different types of conductive materials, it is not necessary to determine the location of routing metal in the horizontal area.

Figure 21:
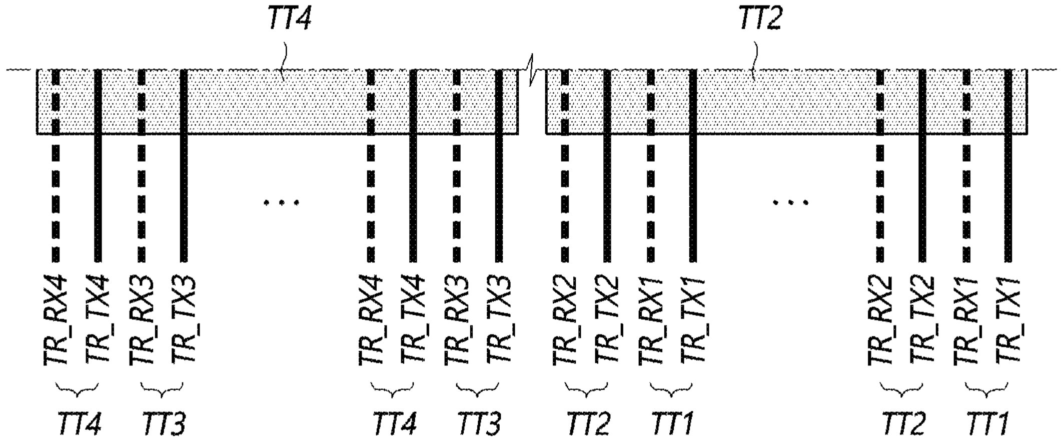
FIG. 21 illustrates an example arrangement of touch routing lines of the touch display panel included in the touch sensor embedded light emitting diode display device according to aspects of the present disclosure.

FIG. 21 illustrates an example arrangement of touch routing lines (TR_TX1 to TR_TX4 and TR_RX1 to TR_RX4) of the touch display panel 110 according to aspects of the present disclosure.

With reference to FIG. 21, when having the touch sensor unit structure as shown in FIGS. 17, 18 and 20, in the pad unit PU, a plurality of first touch routing lines (TR_TX1 and TR_RX1) and a plurality of second touch routing lines (TR_TX2 and TR_RX2) may be disposed together within one predetermined area of the pad unit PU without being disposed in respective areas spaced apart from each other, and a plurality of third touch routing lines (TR_TX3 and TR_RX3) and a plurality of fourth touch routing lines (TR_TX4 and TR_RX4) may be disposed together within another predetermined area of the pad unit PU without being disposed in respective areas spaced apart from each other.

Accordingly, in the pad unit PU connected to the touch driving circuit 160 including a lead-out integrated circuit implemented based on the chip-on-film (COF) technique, signals through the plurality of first touch routing lines (TR_TX1 and TR_RX1) and signals through the plurality of second touch routing lines (TR_TX2 and TR_RX2) may be mixed with each other, and signals through the plurality of third touch routing lines (TR_TX3 and TR_RX3) and signals through the plurality of fourth touch routing lines (TR_TX4 and TR_RX4) may be mixed with each other.

Considering this situation, the touch controller 170 mounted on a printed circuit board or other circuit components may perform a signal grouping process before executing a touch algorithm for determining the presence or absence of a touch or coordinates of the touch.

The touch controller 170 or another circuit configuration can perform the signal grouping process by grouping signals through a plurality of first touch routing lines (TR_TX1 and TR_RX1), grouping signals through a plurality of second touch routing lines (TR_TX2 and TR_RX2), grouping signals through a plurality of third touch routing lines (TR_TX3 and TR_RX3), and grouping signals through a plurality of fourth touch routing lines (TR_TX4 and TR_RX4).

Figure 22:
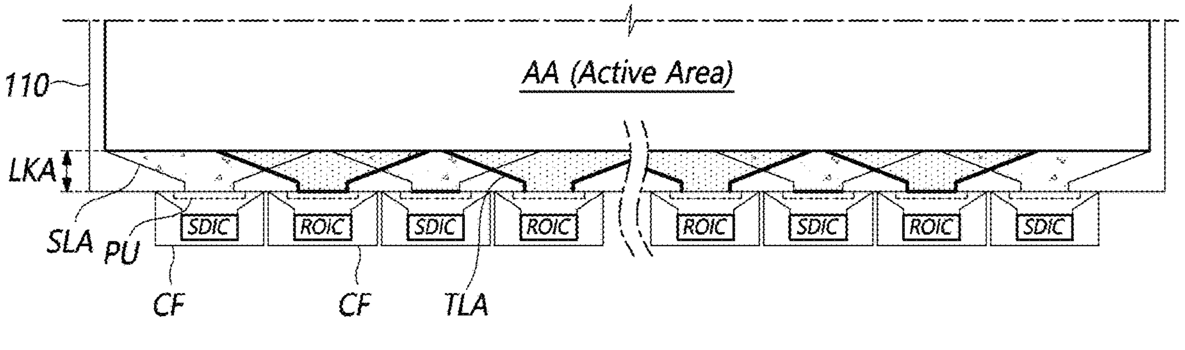
FIG. 22 illustrates an example link structure of the touch display panel included in the touch sensor embedded light emitting diode display device according to aspects of the present disclosure.
Figure 23:
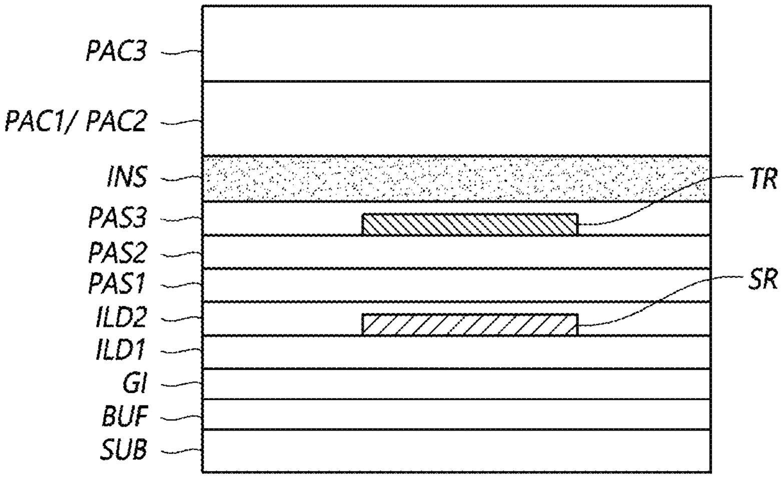
FIG. 23 illustrates an example vertical structure of a link area having the link structure of FIG. 22.

FIG. 22 illustrates an example link structure of the touch display panel 110 included in the touch sensor embedded light emitting diode display device 100 according to aspects of the present disclosure. FIG. 23 illustrates an example vertical structure of a link area having the link structure of FIG. 22.

With reference to FIG. 22, in one or more embodiments, in the touch sensor embedded light emitting diode display device 100 according to aspects of the present disclosure, the data driving circuit 120 may include a plurality of source driver integrated circuits SDICs, and the touch driving circuit 160 may include a plurality of read-out integrated circuits ROICs.

Each of the plurality of source driver integrated circuits SDICs may be configured based on the chip-on-film (COF) technique and connected to the touch display panel 110. In this implementation, each of the plurality of source driver integrated circuits SDIC may be mounted on a circuit film CF and be configured based on the chip-on-film (COF) technique, and one side (or one edge) of the circuit film CF may be connected to the touch display panel 110.

Each of the plurality of read-out integrated circuits ROICs may be configured based on the chip-on-film (COF) technique and be connected to the touch display panel 110. In this implementation, each of the plurality of read-out integrated circuits ROIC may be mounted on a circuit film CF and be configured based on the chip-on-film (COF) technique, and one side (or one edge) of the circuit film CF may be connected to the touch display panel 110.

The source driver integrated circuit SDIC and the readout integrated circuit ROIC may be mounted on different circuit films CF. Source driver integrated circuits SDIC configured based on the chip-on-film (COF) technique and read-out integrated circuits ROIC configured based on the chip-on-film (COF) technique may be alternately connected to the touch display panel 110.

With reference to FIG. 22, the touch display panel 110 may include a link area LKA outside of the active area AA. The link area LKA may include a plurality of source link areas SLA and a plurality of touch link areas TLA.

The plurality of source link areas SLA may correspond to areas to which a plurality of circuit films CF on which the plurality of source driver integrated circuits SDICs are mounted are connected, and the plurality of touch link areas TLA may correspond to areas to which a plurality of circuit films CF on which the plurality of readout integrated circuits ROIC are mounted are connected.

With reference to FIGS. 22 and 23, each of the plurality of source link areas SLA may be located over a display substrate SUB, and a source routing line SR for electrically connecting a data line DL disposed in the active area AA to the corresponding source driver integrated circuit SDIC may be located in the corresponding source link area SLA. Each of the plurality of touch link areas TLA may be located over the display substrate SUB, and a touch routing line TR for electrically connecting a touch sensor disposed in the active area AA to the corresponding read-out integrated circuit ROIC may be located in the corresponding touch link area TLA.

With reference to FIGS. 22 and 23, a portion of the source link area SLA and a portion of the touch link area TLA may overlap each other.

With reference to FIG. 23, in an area where the portion of the source link area SLA and the portion of the touch link area TLA overlap, the touch routing line TR may be located in a layer (which may be referred to as a relay electrode material layer or a reflective electrode material layer) in which a relay electrode RE is disposed, and the source routing line SR may be located in a layer (which may be referred to as a source-drain material layer) in which a source electrode S and a drain electrode D are disposed.

A second passivation layer PAS2 and a first passivation layer PAS1 may be disposed between the touch routing line TR and the source routing line SR.

Figure 24:
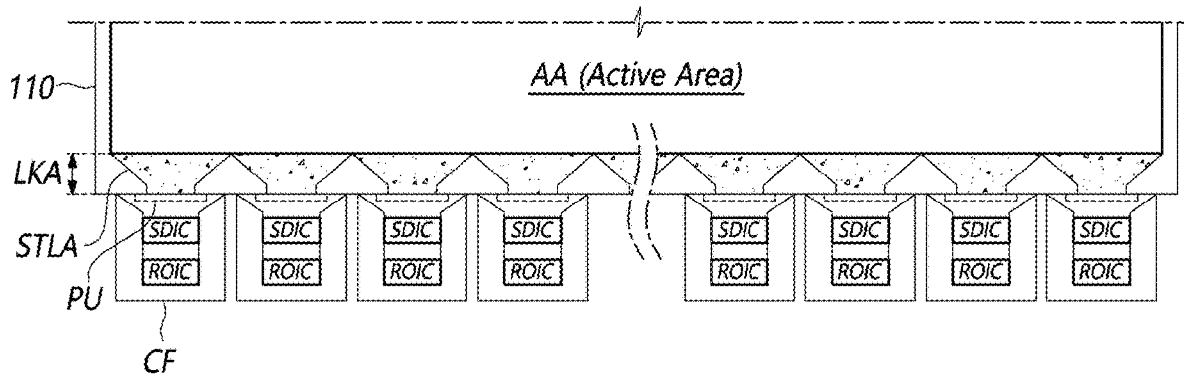
FIG. 24 illustrates another example link structure of the touch display panel included in the touch sensor embedded light emitting diode display device according to aspects of the present disclosure.
Figure 25:
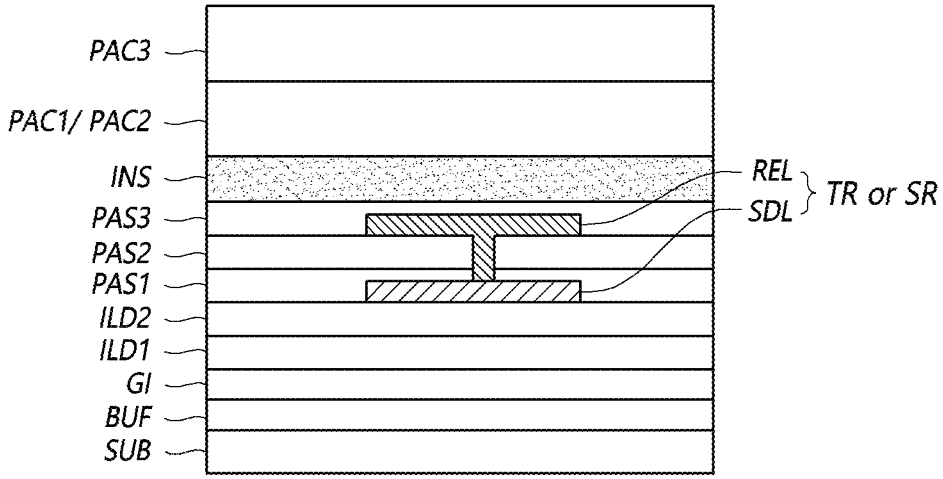
FIG. 25 illustrates an example vertical structure of a link area having the link structure of FIG. 24.

FIG. 24 illustrates another example link structure of the link area LKA of the touch display panel 110 included in the touch sensor embedded light emitting diode display device 100 according to aspects of the present disclosure. FIG. 25 illustrates an example vertical structure of the link area LKA having the link structure of FIG. 24.

With reference to FIG. 24, in the touch sensor embedded light emitting diode display device 100 according to aspects of the present disclosure, a source driver integrated circuit SDIC and a readout integrated circuit ROIC may be mounted on the same circuit film CF. That is, one source driver integrated circuit SDIC and one readout integrated circuit ROIC may be mounted on one circuit film CF and configured based on the chip-on-film (COF) technique. One side of one circuit film CF on which one source driver integrated circuit SDIC and one readout integrated circuit ROIC are mounted may be connected to the touch display panel 110.

A plurality of circuit films CF may be connected side by side to the touch display panel 110. A source driver integrated circuit SDIC and a readout integrated circuit ROIC may be mounted together on each of the plurality of circuit films CF.

In each of the plurality of circuit films CF, the source driver integrated circuit SDIC may be mounted closer to the touch display panel 110 than the readout integrated circuit ROIC.

With reference to FIG. 24, the touch display panel 110 according to aspects of the present disclosure may include a link area LKA outside of the active area AA. The link area LKA may include a plurality of source and touch link areas STLA.

Referring to FIG. 24, each of the plurality of source and touch link areas STLA may correspond to an area connected to each of the plurality of circuit films CF.

With reference to FIGS. 24 and 25, each of the plurality of source and touch link areas STLA may be located on the display substrate SUB. A source routing line SR for connecting a data line DL disposed in the active area AA to the corresponding source driver integrated circuit SDIC may be disposed in the corresponding source and touch link area STLA, and a touch routing line TR for connecting a touch sensor TS disposed in the active area AA to the corresponding readout integrated circuit ROIC may be disposed in the corresponding source and touch link area STLA.

With reference to FIGS. 24 and 25, a portion of the source link area SLA and a portion of the touch link area TLA may overlap each other.

With reference to FIGS. 24 and 25, in an area where the portion of the source link area SLA and the portion of the touch link area TLA overlap, the touch routing line TR may be located in a layer (which may be referred to as a relay electrode material layer or a reflective electrode material layer) in which a relay electrode RE is disposed, and the source routing line SR may be located in a layer (which may be referred to as a source-drain material layer) in which a source electrode S and a drain electrode D are disposed.

With reference to FIGS. 24 and 25, each of the touch routing line TR and/or the source routing line SR may include a first line REL including the same conductive material as the relay electrode RE.

With reference to FIGS. 24 and 25, each of the touch routing line TR and/or the source routing line SR may further include a second line SDL including the same conductive material as the source electrode S and the drain electrode D. The second line SDL may be electrically connected to the first line REL through holes formed in the second passivation layer PAS2 and the first passivation layer PAS1. Accordingly, the load (e.g., resistance) of the touch routing line TR and/or the source routing line SR may be reduced.

In one embodiment, the touch sensor embedded light emitting diode display device 100 according to aspects of the present disclosure may include one touch display panel 110 as discussed above.

In another embodiment, the touch sensor embedded light emitting diode display device 100 according to aspects of the present disclosure may include a plurality of touch display panels 110. The touch sensor embedded light emitting diode display device 100 according to this embodiment is discussed below.

Figure 26:
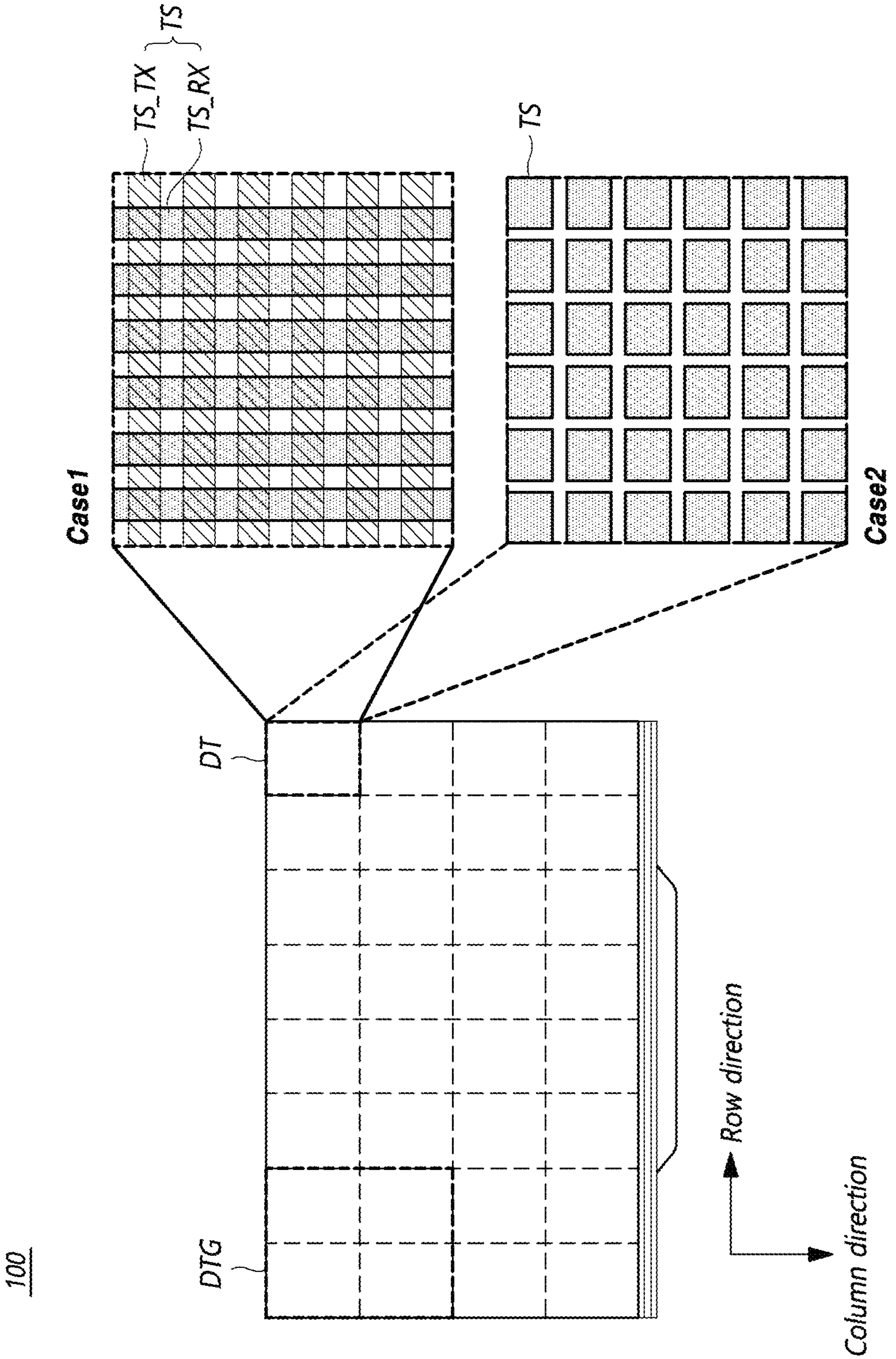
FIG. 26 illustrates an example configuration of the touch sensor embedded light emitting diode display device according to aspects of the present disclosure when the touch sensor embedded light emitting diode display device is configured in a tiling display type.

FIG. 26 illustrates an example configuration of the touch sensor embedded light emitting diode display device 100 according to aspects of the present disclosure when the touch sensor embedded light emitting diode display device 100 is configured in a tiling display type.

With reference to FIS. 26, in one or more embodiments, the touch sensor embedded light emitting diode display device 100 according to aspects of the present disclosure may be configured in the tiling display type including a plurality of touch display panels 110. Hereinafter, each of the plurality of touch display panels 110 is referred to as a display tile DT.

With reference to FIG. 26, the touch sensor embedded light emitting diode display device 100 configured in the tiling display type may include the plurality of display tiles DT.

Each of the plurality of display tiles DT may be the same as the touch display panel 110 described above with reference to FIGS. 1 to 25. Each of the plurality of display panels DT may include a separate display substrate SUB.

The plurality of display tiles DT may be arranged in a matrix form. In the example of FIG. 26, the touch sensor embedded light emitting diode display device 100 may include 32 display tiles DT, and the 32 display tiles DT may be arranged in 4 rows and 8 columns.

Each of the plurality of display tiles DT may include a mutual-capacitance-based touch sensor unit (Case 1, which is the same as that in FIG. 3) including a plurality of transmission touch sensors TS_TX and a plurality of reception touch sensors TS_RX, or a self-capacitance-based touch sensor unit (Case 2, which is the same as that in FIG. 4) including a plurality of touch sensors TS_TX.

Each of the plurality of display tiles DT may include one touch tile or may include a plurality of touch tiles (TT1, TT2, TT3, and TT4) as shown in FIGS. 17 to 20.

For example, driving of each of the plurality of display tiles DT may be individually controlled. In another example, driving of two or more display tiles DT among the plurality of display tiles DT may be simultaneously controlled. In this implementation, two or more display tiles DT among the plurality of display tiles DT may be organized into one display tile group DTG. In the example of FIG. 26, four display tiles DT may be organized into one display tile group DTG.

The touch sensor embedded light emitting diode display device 100 illustrated in FIG. 26 may include 32 display tiles DT arranged in 4 rows and 8 columns, and may include 8 display tile groups DTG.

Figure 27:
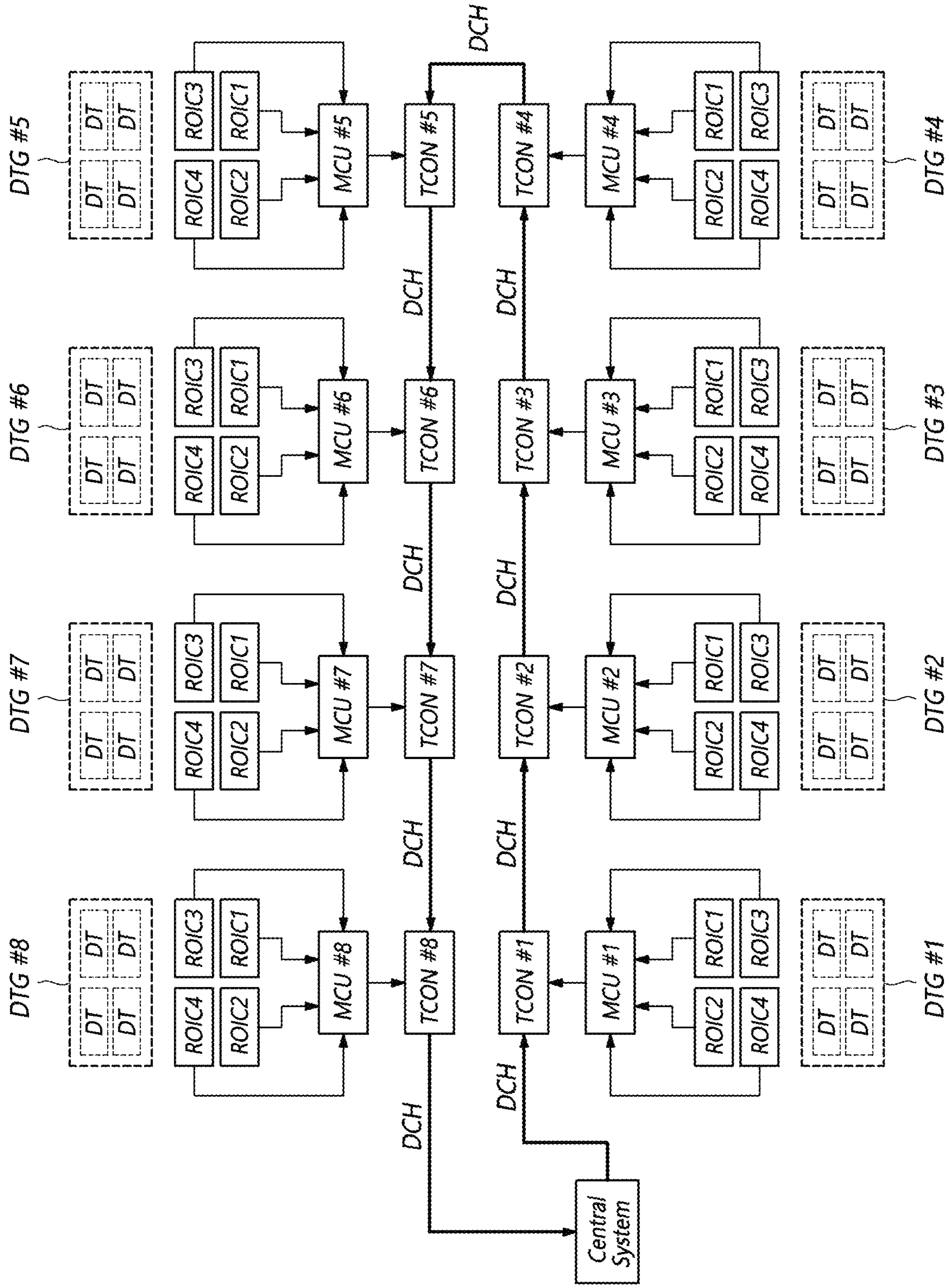
FIG. 27 illustrates an example system configuration of the touch sensor embedded light emitting diode display device according to aspects of the present disclosure when the touch sensor embedded light emitting diode display device is configured in the tiling display type.

FIG. 27 illustrates an example system configuration of the touch sensor embedded light emitting diode display device 100 of FIG. 26 when the touch sensor embedded light emitting diode display device 100 is configured in the tiling display type.

In one or more embodiments, the touch sensor embedded light emitting diode display device 100 according to aspects of the present disclosure may include N (N is a natural number of 2 or greater) number of display tiles DT, or M (M is a natural number of 1 or greater) number of display tile groups DTG. In the case of the example of FIG. 26, N (the number of display tiles) is 32, and M (the number of display tile groups) is 8.

In one or more embodiments, the touch sensor embedded light emitting diode display device 100 according to aspects of the present disclosure may include M timing controllers (TCON #1 to TCON #8), which correspond to the number of display tile groups, and M micro control units (MCU #1 to MCU #8), which correspond to the number of display tile groups, and a central system.

The M timing controllers (TCON #1 to TCON #8) may be controllers included in the display controller 140. The M micro control units (MCU #1 to MCU #8) may be controllers included in the touch controller 170.

The M timing controllers (TCON #1 to TCON #8) can control display driving of the N display tiles DT. The M micro control units (MCU #1 to MCU #8) may control touch driving of the N display tiles DT.

The central system can communicate with the M micro control units (MCU #1 to MCU #8) or the M timing controllers (TCON #1 to TCON #8).

Hereinafter, discussions are provided based on an example where the number of display tiles, N, is 32, the number of display tile groups, M, is 8, and the number of display tiles, K, included in one display tile group DTG is 4.

With reference to FIG. 27, the touch sensor embedded light emitting diode display device 100 according to aspects of the present disclosure may include M (M=8) display tile groups (DTG #1 to DTG #8), and each of the M display tile groups (DTG #1 to DTG #8) may include four display tiles DT.

With reference to FIG. 27, the touch sensor embedded light emitting diode display device 100 may include N (N=32) or more readout integrated circuits (M number of ROIC1*s*, M number of ROIC2*s*, M number of ROIC3*s*, and M number of ROIC4*s*) respectively corresponding to the N display tiles DT.

For touch sensing for each of the M display tile groups (DTG #1 to DTG #8), K (K=4) readout integrated circuits (ROIC1, ROIC2, ROIC3, and ROIC4) may be connected to each of the M display tile groups (DTG #1 to DTG #8).

The K readout integrated circuits (ROIC1, ROIC2, ROIC3, ROIC4) can sense touch sensor units included in the K display tiles DT included in one of the M display tile groups (DTG #1 to DTG #8).

The touch sensor embedded light emitting diode display device 100 may include M timing controllers (TCON #1 to TCON #8) respectively corresponding to the M display tile groups (DTG #1 to DTG #8) to control display driving.

The touch sensor embedded light emitting diode display device 100 may include M micro control units (MCU #1 to MCU #8) respectively corresponding to the M display tile groups (DTG #1 to DTG #8) to control touch driving.

The touch sensor embedded light emitting diode display device 100 may include N or more source driver integrated circuits SDICs respectively corresponding to the N display tiles DT.

For data driving control for each of the M display tile groups (DTG #1 to DTG #8), K source driver integrated circuits SDICs may be connected to each of the M display tile groups (DTG #1 to DTG #8).

The touch sensor embedded light emitting diode display device 100 may connect the M micro control units (MCU #1 to MCU #8) or the M timing controllers (TCON #1 to TCON #8) to each other in series, and may further include a daisy chain DCH through which touch sensing data is transferred.

For each of the M display tile groups (DTG #1 to DTG #8), four readout integrated circuits (ROIC1 to ROIC4) can sense four display tiles DT included in a corresponding display tile group (one of DTG #1 to DTG #8), and thereby, generate and output touch sensing data.

For each of the M display tile groups (DTG #1 to DTG #8), a respective micro control unit (each of MCU #1 to MCU #8) can collect the touch sensing data provided by four readout integrated circuits (ROIC1 to ROIC4), execute a touch algorithm using the collected touch sensing data, generate a touch sensing result (e.g., the presence/absence of a touch or the location of the touch (or touch coordinates)), and output the touch sensing result to the daisy chain DCH.

For each of the M display tile groups (DTG #1 to DTG #8), the touch sensing result (e.g., the presence/absence of a touch or the location of the touch (or touch coordinates)) output from the respective micro control unit (each of MCU #1 to MCU #8) can be transmitted sequentially to the central system.

A first micro control unit (MCU #1) can output its first touch sensing result to the daisy chain DCH. A second micro control unit (MCU #2) can output its second touch sensing result to the daisy chain DCH, and at this stage, the first touch sensing result received from the first micro control unit (MCU #1) can be output together. A third micro control unit (MCU #3) can output its third touch sensing result to the daisy chain DCH, and at this stage, the first and second touch sensing results received from the second micro control unit (MCU #2) can be output together. A fourth micro control unit (MCU #4) can output its fourth touch sensing result to the daisy chain DCH, and at this stage, the first, second and third touch sensing results received from the third micro control unit (MCU #3) can be output together. A fifth micro control unit (MCU #5) can output its fifth touch sensing result to the daisy chain DCH, and at this stage, the first, second, third, and fourth touch sensing results received from the fourth micro control unit (MCU #4) can be output together. A sixth micro control unit (MCU #6) can output its sixth touch sensing result to the daisy chain DCH, and at this stage, the first, second, third, fourth, and fifth touch sensing results received from the fifth micro control unit (MCU #5) can be output together. A seventh micro control unit (MCU #7) can output its seventh touch sensing result to the daisy chain DCH, and at this stage, the first, second, third, fourth, fifth, and sixth touch sensing results received from the sixth micro control unit (MCU #6) can be output together.

An eighth micro control unit (MCU #8) can output its eighth touch sensing result to the daisy chain DCH, and at this stage, the first, second, third, fourth, fifth, sixth, and seventh touch sensing results received from the seventh micro control unit (MCU #7) can be output together.

Accordingly, the central system may collect all of the first to eighth touch sensing results, and finally determine the presence or absence of a touch or the location of the touch (or touch coordinates) in all areas of the 32 display tiles DT.

The embodiments described above will be briefly described as follows.

According to aspects of the present disclosure, the touch sensor embedded light emitting diode display device 100 can be provided that includes: a display substrate; a light emitting diode disposed over the display substrate and including a first electrode and a second electrode; a pixel electrode electrically connected to the first electrode; a common electrode electrically connected to the second electrode; a driving transistor disposed over the display substrate and including an active layer, a source electrode, a drain electrode, and a gate electrode; a relay electrode electrically connecting the source electrode or drain electrode to the pixel electrode; and a first touch sensor electrode disposed spaced apart from the light emitting diode and including the same conductive material as the pixel electrode.

The relay electrode may be located under the light emitting diode, overlap the light emitting diode, and include a reflective electrode material.

The touch sensor embedded light emitting diode display device may further include a second touch sensor electrode disposed adjacent to the first touch sensor electrode in a column direction and including the same conductive material as the relay electrode, and a vertical connection line electrically interconnecting the first touch sensor electrode and the second touch sensor electrode.

The vertical connection line interconnecting the first and second touch sensor electrodes in the vertical direction (column direction) may include at least one of the same conductive material as the relay electrode (e.g., a reflective electrode material, etc.), the same conductive material as the source electrode or drain electrode (e.g., a source-drain material, etc.), the same conductive material as an electrode between the source electrode or drain electrode and the active layer (e.g., a gate electrode material, etc.), and the same conductive material as an electrode under the active layer (e.g., a lower shield metal, etc.).

The touch sensor embedded light emitting diode display device may further include a third touch sensor electrode disposed adjacent to the first touch sensor electrode in a row direction and including the same conductive material as the pixel electrode, and a horizontal connection line electrically interconnecting the first touch sensor electrode and the third touch sensor electrode.

The horizontal connection line may include the same conductive material as the pixel electrode.

The touch sensor embedded light emitting diode display device may further include a second touch sensor electrode, a third touch sensor electrode, and a fourth touch sensor electrode disposed adjacent to the light emitting diode and including the same conductive material as the pixel electrode.

The first touch sensor electrode, the second touch sensor electrode, the third touch sensor electrode, and the fourth touch sensor electrode may not overlap the light emitting diode.

The first touch sensor electrode, the second touch sensor electrode, the third touch sensor electrode, and the fourth touch sensor electrode may be electrically connected to each other to form one touch sensor.

The first touch sensor electrode, the second touch sensor electrode, the third touch sensor electrode, and the fourth touch sensor electrode may be disposed spaced apart from the light emitting diode, and disposed in different directions from each other with respect to a core pixel area where the light emitting diode is disposed.

For example, the first touch sensor electrode may be disposed spaced apart from the light emitting diode and may have a block shape without an opening. In another example, the first touch sensor electrode may be spaced apart from the light emitting diode and may have a ring shape with an opening. In further another example, the first touch sensor electrode may have a ring shape surrounding the light emitting diode. The first touch sensor electrode may intersect at least one data line and intersect at least one scan line.

The touch sensor embedded light emitting diode display device may include a first touch sensor to which a plurality of touch sensor electrodes including the first touch sensor electrode are electrically connected, a first touch pad located on the display substrate, and a first touch routing line electrically connecting the first touch sensor to the first touch pad. The first touch pad may include the same conductive material as the source electrode or the drain electrode.

The first touch routing line may include the same conductive material as the relay electrode, the same conductive material as the source electrode or the drain electrode, the same conductive material as an electrode between the source electrode or drain electrode and the active layer, or the same conductive material as an electrode under the active layer.

The touch sensor embedded light emitting diode display device may include an active area in which an image is displayed. The active area may include a display circuit area, a core pixel area located in the display circuit area and allowing at least one light emitting diode to be disposed, a first power supply area located outside of the display circuit area and allowing a first power line to be disposed, a second power supply area located outside of the display circuit area and allowing a second power line to be disposed, and a gate driving circuit area located outside of the display circuit area and allowing a gate driving circuit to be disposed.

The light emitting diode may be disposed in the core pixel area, and the first touch sensor electrode may overlap at least one of the first power supply area, the second power supply area, and the gate driving circuit area.

The touch sensor embedded light emitting diode display device may further include a column line electrically connected to the first touch sensor electrode and disposed in the column direction, and a second touch sensor electrode adjacent to the first touch sensor electrode in the column direction.

The column line may be disposed between the first power line and the second power line. The column line may be a vertical connection line electrically interconnecting the first touch sensor electrode and the second touch sensor electrode, or a touch routing line electrically connecting the first touch sensor electrode to a touch driving circuit.

The touch sensor embedded light emitting diode display device may further include a shield disposed under the first touch sensor electrode, and an organic layer disposed between the first touch sensor electrode and the shield. The shield may include the same conductive material as the relay electrode. When a signal whose voltage level is varied is applied to the first touch sensor electrode, an electric potential difference between the first touch sensor electrode and the shield may be maintained constant.

According to aspects of the present disclosure, the touch sensor embedded light emitting diode display device 100 can be provided that includes: a first touch tile including a plurality of first touch sensors, a second touch tile adjacent to the first touch tile in a column direction and including a plurality of second touch sensors, a third touch tile adjacent to the first touch tile in a row direction and including a plurality of third touch sensors, a fourth touch tile adjacent to the third touch tile in the column direction and including a plurality of fourth touch sensors, a plurality of first touch routing lines connected to the plurality of first touch sensors, a plurality of second touch routing lines connected to the plurality of second touch sensors, a plurality of third touch routing lines connected to the plurality of third touch sensors, a plurality of fourth touch routing lines connected to the plurality of fourth touch sensor, and a pad unit connected to the plurality of first touch routing lines, the plurality of second touch routing lines, the plurality of third touch routing lines, and the plurality of fourth touch routing lines, and located in a column direction from the second touch tiles and the fourth touch tiles.

In the pad unit, the plurality of first touch routing lines and the plurality of second touch routing lines may be disposed such that they are disposed adjacent to each other, and the plurality of third touch routing lines and the plurality of fourth touch routing lines may be disposed such that they disposed adjacent to each other.

The display substrate of the touch sensor embedded light emitting diode display device may include an active area in which images can be displayed, and one or more signal lines may be disposed only in one of areas outside, or outer areas, of the active area.

The touch sensor embedded light emitting diode display device may further include a guard pattern disposed along an outer edge of the display substrate. Respective ends of extended portions of a plurality of touch routing lines electrically connected to a plurality of touch sensors disposed in the active area of the display substrate may be disposed between opposing ends of the guard pattern.

The touch sensor embedded light emitting diode display device may include a first transmission touch sensor, a first reception touch sensor intersecting the first transmission touch sensor, a first transmission touch routing line connected to the first transmission touch sensor, and a first reception touch routing line connected to the first reception touch sensor.

The first transmission touch routing line and the first reception touch routing line may be arranged in parallel to each other, the first transmission touch routing line may overlap the first reception touch sensor, the first transmission touch sensor and the first reception touch sensor may include the same conductive material as the pixel electrode, and the first transmission touch routing line and the first reception touch routing line may include the same conductive material as the relay electrode.

The touch sensor embedded light emitting diode display device may include a first touch sensor, a first touch routing line connected to the first touch sensor, a second touch sensor, a second touch routing line connected to the second touch sensor, and a pad unit connected to the first touch routing line and the second touch routing line.

A first connection point between the first touch sensor and the first touch routing line may be located farther away from the pad unit than a second connection point between the second touch sensor and the second touch routing line. In this implementation, the length of the first touch routing line may be greater than the length of the second touch routing line, the first touch routing line may be disposed only from the pad unit to the first connection point, and the second touch routing line may be disposed only from the pad unit to the second connection point. In this implementation, the touch sensor embedded light emitting diode display device may further include a dummy touch routing line, which is disposed such that it extends from the second connection point in an direction opposite to the pad unit. The dummy touch routing line may not be electrically connected to the second touch sensor and the second touch routing line.

The touch sensor embedded light emitting diode display device may include a first touch sensor, a first touch routing line connected to the first touch sensor, a second touch sensor, a second touch routing line connected to the second touch sensor, and a pad unit connected to the first touch routing line and the second touch routing line.

A first connection point between the first touch sensor and the first touch routing line may be located farther away from the pad unit than a second connection point between the second touch sensor and the second touch routing line. The length of the first touch routing line may be substantially, or nearly, the same as that of the second touch routing line. The second connection point may be present between both ends of the second touch routing line.

The touch sensor embedded light emitting diode display device may further include a source link area located on the display substrate and allowing a source routing line to be disposed for connecting a data line disposed in the active area to a source driver integrated circuit, and a touch link area located on the display substrate and allowing a touch routing line to be disposed for connecting a touch sensor disposed in the active area to a readout integrated circuit. The source driver integrated circuit and the readout integrated circuit may be mounted on different circuit films.

A portion of the source link area and a portion of the touch link area may overlap. In an area where the portion of the source link area and the portion of the touch link area overlap, the touch routing line may be positioned in a layer where the relay electrode is disposed, and the source routing line may be positioned in a layer where the source electrode and the drain electrode are disposed.

The touch sensor embedded light emitting diode display device may further include a source-and-touch link area located on the display substrate, allowing a source routing line to be disposed for connecting a data line disposed in the active area to a source driver integrated circuit, and allowing a touch routing line to be disposed for connecting a touch sensor disposed in the active area to a readout integrated circuit. The source driver integrated circuit and the readout integrated circuit may be mounted together on one circuit film.

Each of the touch routing line and the source routing line may include a first line including the same conductive material as the relay electrode, and a second line electrically connected to the first line and including the same conductive material as the source electrode and the drain electrode.

The touch sensor embedded light emitting diode display device may further include N (N is a natural number greater than or equal to 2) display tiles, M (M is a natural number greater than or equal to 1) timing controllers for controlling display driving of the N display tiles, M micro control units for controlling touch driving of the N display tiles, a central system communicating with the M micro control units or the M timing controllers, N or more source driver integrated circuits corresponding to the N display tiles, and N or more readout integrated circuits corresponding to the N display tiles. Each of the N display tiles may include a respective display substrate.

The touch sensor embedded light emitting diode display device may further include a daisy chain connecting the M micro control units or the M timing controllers in series and transferring touch sensing data.

According to aspects of the present disclosure, the touch display panel 110 can be provided that includes: a display substrate; a first horizontal touch sensor disposed in a horizontal direction; a first vertical touch sensor disposed in a vertical direction and crossing the first horizontal touch sensor; a first horizontal touch routing line connected to the first horizontal touch sensor; and a first vertical touch routing line connected to the first vertical touch sensor.

The first horizontal touch routing line and the first vertical touch routing line may be disposed in the vertical direction, and the first horizontal touch routing line may overlap the first vertical touch sensor in the vertical direction.

The display substrate may include an active area where an image is displayed, and signal lines may not be disposed in the remaining one or more areas except for one of outer areas (or areas outside), of the active area.

Each of the first horizontal touch sensor and the first vertical touch sensor may include a first touch sensor electrode, a second touch sensor electrode, a third touch sensor electrode, and a fourth touch sensor electrode, which are electrically connected to each other. The first touch sensor electrode and the second touch sensor electrode may be disposed adjacent to each other in the vertical direction, the first touch sensor electrode and the third touch sensor electrode may be disposed adjacent to each other in the horizontal direction, the third touch sensor electrode and the fourth touch sensor electrode may be disposed adjacent to each other in the vertical direction. The first touch sensor electrode, the second touch sensor electrode, the third touch sensor electrode, and the fourth touch sensor electrode may include a transparent electrode material.

The first touch sensor electrode and the third touch sensor electrode may be connected through a horizontal connection line including the transparent electrode material. The second touch sensor electrode and the fourth touch sensor electrode may be connected through a horizontal connection line including the transparent electrode material. The first touch sensor electrode and the second touch sensor electrode may be connected through a vertical connection line including a reflective electrode material. The third touch sensor electrode and the fourth touch sensor electrode may be connected through a vertical connection line including the reflective electrode material.

The touch display panel may include a light emitting diode and a driving transistor disposed between the first touch sensor electrode, the second touch sensor electrode, the third touch sensor electrode, and the fourth touch sensor electrode, a pixel electrode connected to the first electrode of the light emitting diode and including a transparent electrode material, and a relay electrode interconnecting the pixel electrode and the source electrode or drain electrode of the driving transistor, and including a reflective electrode material.

According the embodiments described herein, the touch sensor embedded light emitting diode display device 100 and the touch display panel 110 may be provided.

According the embodiments described herein, the touch sensor embedded light emitting diode display device 100 and the touch display panel 110 may be provided that allow improved manufacturability and have a simple vertical structure by designing a stack structure of a touch sensor area to be corresponded to a stack structure of a display circuit area.

According the embodiments described herein, the touch sensor embedded light emitting diode display device 100 and the touch display panel 110 may be provided that have an internal routing structure in which a bezel area is not used as running paths of touch routing lines, and thereby, are capable of reducing a bezel area.

According the embodiments described herein, the touch sensor embedded light emitting diode display device 100 and the touch display panel 110 may be provided that have a noise reduction structure.

According the embodiments described herein, the touch sensor embedded light emitting diode display device 100 and the touch display panel 110 may be provided that are configured in a type of tiling display.

According the embodiments described herein, the touch sensor embedded light emitting diode display device 100 may be provided that is capable of reducing power consumption using light emitting diodes as light emitting elements.

According the embodiments described herein, the touch sensor embedded light emitting diode display device 100 and the touch display panel 110 may be provided that are capable of process optimization by configuring a touch sensor structure using layers used in a display circuit area.

The embodiments of the present disclosure described above have been described for illustrative purposes; those skilled in the art will appreciate that various modifications, additions and substitutions are possible, without departing from the scope and spirit of the disclosure as disclosed in the accompanying claims. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified.

The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims.

The scope of protection of the present disclosure is to be construed according to the claims, and all technical ideas within the scope of the claims should be interpreted as being included in the scope of the present disclosure. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting diode display device comprising:
- a substrate;
- a driving transistor disposed on the substrate and comprising an active layer, a source electrode, a drain electrode, and a gate electrode;
- a first passivation layer disposed on the source electrode and the drain electrode;
- a reflective layer disposed on the first passivation layer, and connected to the source electrode or the drain electrode of the driving transistor through a hole in the first passivation layer;
- a support layer disposed on the reflective layer;
- at least one micro light emitting diode disposed on the support layer, emitting red light, green light or blue light, and comprising a pixel electrode, the pixel electrode electrically connected to the source electrode or the drain electrode of the driving transistor through the reflective layer;
- a touch sensor surrounding the at least one the micro light emitting diode;
- a first connection line and a second connection line connected to the touch sensor;
- a touch pad located on the display substrate; and
- a touch routing line electrically connecting the touch sensor to the touch pad,
- wherein the touch pad comprises a same conductive material as the source electrode or the drain electrode, and
- wherein the touch routing line comprises a same conductive material as the reflective layer, a same conductive material as the source electrode or the drain electrode, a same conductive material as an electrode between the source electrode or drain electrode and the active layer, or a same conductive material as an electrode under the active layer.

2. The light emitting diode display device of claim 1, wherein the touch sensor comprises a first touch sensor electrode spaced apart from the at least one micro light emitting diode and comprising the same conductive material as the pixel electrode.

3. The light emitting diode display device of claim 1, wherein the substrate comprises an active area in which an image is displayed, the active area comprising:
- a display circuit area;
- a core pixel area located in the display circuit area and allowing the at least one micro light emitting diode to be disposed;
- a first power supply area located outside of the display circuit area and allowing a first power line to be disposed;

a second power supply area located outside of the display circuit area and allowing a second power line to be disposed; and a gate driving circuit area located outside of the display circuit area and allowing a gate driving circuit to be disposed.

4. The light emitting diode display device of claim 1, wherein the at least one micro light emitting diode comprises:

a first electrode and a second electrode;

the pixel electrode electrically connected to the first electrode, the pixel electrode including a conductive material; and a common electrode electrically connected to the second electrode.

5. The light emitting diode display device of claim 4, wherein the at least one micro light emitting diode further comprises an insulating layer, and wherein the insulating layer exposes at least a portion of the first electrode and at least a portion of the second electrode.

6. The light emitting diode display device of claim 2, wherein the touch sensor further comprises a second touch sensor electrode disposed adjacent to the first touch sensor electrode in a column direction and comprising a same conductive material as the reflective layer, wherein the first touch sensor electrode and the second touch sensor electrode are electrically interconnected to each other through one connection line among the first connection line and the second connection line, and wherein the one connection line comprises at least one of the same conductive material as the reflective layer, a same conductive material as the source electrode or drain electrode, a same conductive material as an electrode between the source electrode or drain electrode and the active layer, and a same conductive material as an electrode under the active layer.

7. The light emitting diode display device of claim 2, wherein the touch sensor further comprises a third touch sensor electrode disposed adjacent to the first touch sensor electrode in a row direction and comprising the same conductive material as the pixel electrode, wherein the first touch sensor electrode and the third touch sensor electrode are electrically interconnected to each other through one connection line among the first connection line and the second connection line, wherein the horizontal connection line comprises the same conductive material as the pixel electrode.

8. The light emitting diode display device of claim 2, wherein the touch sensor further comprises a second touch sensor electrode, a third touch sensor electrode, and a fourth touch sensor electrode disposed adjacent to the micro light emitting diode and comprising the same conductive material as the pixel electrode, wherein the first touch sensor electrode, the second touch sensor electrode, the third touch sensor electrode, and the fourth touch sensor electrode do not overlap with the micro light emitting diode, and the first touch sensor electrode, the second touch sensor electrode, the third touch sensor electrode, and the fourth touch sensor electrode are electrically connected to each other to form the touch sensor.

9. The light emitting diode display device of claim 8, wherein the first touch sensor electrode, the second touch sensor electrode, the third touch sensor electrode, and the fourth touch sensor electrode are disposed spaced apart from the micro light emitting diode and disposed in different directions with respect to a core pixel area in which the micro light emitting diode is disposed.

10. The light emitting diode display device of claim 1, wherein one of the first connection line and the second connection line intersects at least one data line, and the other of the first connection line and the second connection line intersects at least one scan line.

11. The light emitting diode display device of claim 2, wherein the first touch sensor electrode has either a block shape without an opening or a ring shape.

12. The light emitting diode display device of claim 2, wherein the first touch sensor electrode has a ring shape surrounding the micro light emitting diode, and the first touch sensor electrode intersects at least one data line and intersects at least one scan line.

13. The light emitting diode display device of claim 1, further comprising:

a shield disposed under the touch sensor; and an organic layer disposed between the touch sensor and the shield, wherein the shield comprises a same conductive material as the reflective layer, and when a signal whose voltage level is varied is applied to the touch sensor, an electric potential difference between the touch sensor and the shield is maintained constantly.

14. The light emitting diode display device of claim 1, further comprising:

a second passivation layer disposed on the first passivation layer; and a third passivation layer disposed on the reflective layer.

15. The light emitting diode display device of claim 14, further comprising:

a bank layer disposed on the touch sensor, wherein the third planarization layer is disposed on the bank layer.

16. The light emitting diode display device of claim 1, wherein the first passivation layer comprises an organic layer.

17. The light emitting diode display device of claim 1, wherein the support layer comprises an adhesive material.

18. A light emitting diode display device comprising:

a substrate;

at least one micro light emitting diode disposed over the substrate, and comprising at least two electrodes including a pixel electrode;

a driving transistor disposed over the substrate, and comprising an active layer, a source electrode, a drain electrode, and a gate electrode;

a reflective layer through which the pixel electrode and the source electrode or drain electrode of the driving transistor are electrically connected to each other;

a touch sensor spaced apart from the at least one micro light emitting diode;

a touch pad located on the substrate; and a touch routing line electrically connecting the touch sensor to the touch pad, wherein the touch pad comprises a same conductive material as the source electrode or the drain electrode, wherein the touch routing line comprises a same conductive material as the reflective layer, a same conductive material as the source electrode or the drain electrode, a same conductive material as an electrode between the source electrode or the drain electrode and the active layer, or a same conductive material as an electrode under the active layer, and wherein the substrate comprises an active area in which an image is displayed, the active area comprising:
a display circuit area;
a core pixel area located in the display circuit area and allowing the at least one micro light emitting diode to be disposed;
a first power supply area located outside of the display circuit area and allowing a first power line to be disposed;
a second power supply area located outside of the display circuit area and allowing a second power line to be disposed; and
a gate driving circuit area located outside of the display circuit area and allowing a gate driving circuit to be disposed.

19. A touch display panel comprising:
a substrate;
a driving transistor disposed over substrate and comprising an active layer, a source electrode, a drain electrode, and a gate electrode;
at least one micro light emitting diode disposed over the substrate and comprising at least two electrodes including a pixel electrode;
a reflective layer through which the pixel electrode and the source electrode or drain electrode of the driving transistor are electrically connected to each other,
a horizontal touch sensor disposed in a horizontal direction;
a vertical touch sensor disposed in a vertical direction and intersecting the first horizontal touch sensor;
a horizontal touch routing line electrically connected to the first horizontal touch sensor; and
a vertical touch routing line electrically connected to the first vertical touch sensor,
wherein each of the horizontal touch sensor and the vertical touch sensor comprises at least two touch sensor electrodes electrically connected to each other, and
wherein the driving transistor is disposed between the at least two touch sensor electrodes.

* * * * *